(12) United States Patent
Matsuzaki et al.

(10) Patent No.: US 8,649,208 B2
(45) Date of Patent: Feb. 11, 2014

(54) METHOD FOR DRIVING SEMICONDUCTOR DEVICE

(75) Inventors: Takanori Matsuzaki, Kanagawa (JP); Hiroki Inoue, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 75 days.

(21) Appl. No.: 13/473,752

(22) Filed: May 17, 2012

(65) Prior Publication Data

US 2012/0294070 A1    Nov. 22, 2012

(30) Foreign Application Priority Data

May 20, 2011    (JP) ................. 2011-114182

(51) Int. Cl.
*G11C 11/24* (2006.01)
*G11C 5/06* (2006.01)
*G11C 7/00* (2006.01)

(52) U.S. Cl.
USPC .............................. 365/149; 365/72; 365/203

(58) Field of Classification Search
USPC ......................................... 365/149, 203, 207
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,314,017 B1 | 11/2001 | Emori et al. | |
| 6,445,026 B1 | 9/2002 | Kubota et al. | |
| 6,536,013 B2 | 3/2003 | Kobayashi et al. | |
| 6,563,174 B2 | 5/2003 | Kawasaki et al. | |
| 6,727,522 B1 | 4/2004 | Kawasaki et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Ly D Pham
(74) *Attorney, Agent, or Firm* — Fish & Richardson P.C.

(57) ABSTRACT

A semiconductor device includes a nonvolatile memory cell including a writing transistor including an oxide semiconductor, a reading transistor including a semiconductor material different from that of the writing transistor, and a capacitor. Data is written to the memory cell by turning on the writing transistor so that a potential is supplied to a node where a source electrode of the writing transistor, one electrode of the capacitor, and a gate electrode of the reading transistor are electrically connected, and then turning off the writing transistor so that a predetermined potential is held in the node. Data is read out from the memory cell by supplying a precharge potential to a bit line, stopping the supply of the potential to the bit line, and determining whether the potential of the bit line is kept at the precharge potential or decreased.

14 Claims, 31 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,859,889 B2 | 12/2010 | Kameshiro et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0209739 A1 | 11/2003 | Hisamoto et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0128803 A1 | 6/2005 | Luk et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0024741 A1 | 2/2011 | Abe et al. |
| 2011/0101351 A1 | 5/2011 | Yamazaki |
| 2011/0121878 A1 | 5/2011 | Kato et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176354 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0194327 A1 | 8/2011 | Kawae |
| 2011/0194331 A1 | 8/2011 | Kawae et al. |
| 2011/0194332 A1 | 8/2011 | Saito |
| 2011/0198593 A1 | 8/2011 | Kato et al. |
| 2011/0199807 A1 | 8/2011 | Saito et al. |
| 2011/0199816 A1 | 8/2011 | Inoue et al. |
| 2011/0204365 A1 | 8/2011 | Saito |
| 2011/0205774 A1 | 8/2011 | Takemura |
| 2011/0205785 A1 | 8/2011 | Nagatsuka et al. |
| 2011/0210339 A1 | 9/2011 | Yamazaki et al. |
| 2011/0215317 A1 | 9/2011 | Yamazaki et al. |
| 2011/0216571 A1 | 9/2011 | Yamazaki et al. |
| 2011/0220891 A1 | 9/2011 | Fujii et al. |
| 2011/0227062 A1 | 9/2011 | Kato et al. |
| 2011/0227072 A1 | 9/2011 | Inoue et al. |
| 2011/0228584 A1 | 9/2011 | Takemura |
| 2011/0249484 A1 | 10/2011 | Takemura |
| 2011/0255325 A1 | 10/2011 | Nagatsuka et al. |
| 2011/0260158 A1 | 10/2011 | Takemura |
| 2011/0278571 A1 | 11/2011 | Yamazaki et al. |
| 2011/0280061 A1 | 11/2011 | Saito et al. |
| 2011/0284838 A1 | 11/2011 | Saito |
| 2011/0286290 A1 | 11/2011 | Kamata |
| 2011/0297928 A1 | 12/2011 | Isobe et al. |
| 2011/0297939 A1 | 12/2011 | Kato |
| 2011/0298057 A1 | 12/2011 | Kato |
| 2011/0316057 A1 | 12/2011 | Kurata et al. |
| 2011/0317474 A1 | 12/2011 | Kato |
| 2012/0001243 A1 | 1/2012 | Kato |
| 2012/0012837 A1 | 1/2012 | Yamazaki et al. |

(56) References Cited

U.S. PATENT DOCUMENTS

| | | | |
|---|---|---|---|
| 2012/0012845 | A1 | 1/2012 | Kato et al. |
| 2012/0014157 | A1 | 1/2012 | Kato et al. |
| 2012/0025284 | A1 | 2/2012 | Kato et al. |
| 2012/0026774 | A1 | 2/2012 | Shionoiri |
| 2012/0032161 | A1 | 2/2012 | Matsubayashi |
| 2012/0032162 | A1 | 2/2012 | Matsubayashi |
| 2012/0032171 | A1 | 2/2012 | Saito et al. |
| 2012/0033483 | A1 | 2/2012 | Koyama |
| 2012/0033485 | A1 | 2/2012 | Matsuzaki et al. |
| 2012/0033486 | A1 | 2/2012 | Inoue et al. |
| 2012/0033487 | A1 | 2/2012 | Inoue et al. |

FOREIGN PATENT DOCUMENTS

| | | |
|---|---|---|
| JP | 56-162875 A | 12/1981 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-028443 A | 1/2001 |
| JP | 2001-053167 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2007-103918 A | 4/2007 |
| JP | 2009-033145 A | 2/2009 |
| JP | 2009-182194 A | 8/2009 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fukumoto, E et al., "High Mobility Oxide Semiconductor TFT for Circuit Integration of AM-OLED," IDW '10 : Proceedings of the 16th International Display Workshops, Dec. 1, 2010, pp. 631-634.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—0 TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and Sc2O3—A2O3—Bo

(56) References Cited

OTHER PUBLICATIONS

Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384

Kimizuka, N et al., "Syntheses and Single-Crystal Data of Homologous Compounds, In2O3(ZnO)m (m = 3, 4, and 5), InGaO3(ZnO)3; and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," SCIENCE, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," NATURE, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA Amoled Display Using In-Ga-Zn-Oxide TFTs With a Novel Passivation Layer," SID Digest '09: SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

(56) References Cited

OTHER PUBLICATIONS

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Park, J et al., "Amorphous Indium-Gallium-Zinc Oxide TFTs and Their Application for Large Size Amoled," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In-Ga-Zn-Oxide TFTs," IDW '09: Proceedings of the 16th International Display Workshops, 2009, pp. 689-692.

Shukuri, S et al., "A Complementary Gain Cell Technology for sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Son, K et al., "42.4L: Late-News Paper: 4 Inch QVGA AMOLED Driven by the Threshold Voltage Controlled Amorphous Gizo ($Ga_2O_3$-$In_2O_3$-ZnO) TFT," SID Digest '08: SID International Symposium Digest of Technical Papers, May 20, 2008, vol. 39, pp. 633-636.

Takahashi, M et al., "Theoretical Analysis of Igzo Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT-LCDs," IDW '02: Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

FIG. 19A    FIG. 19B
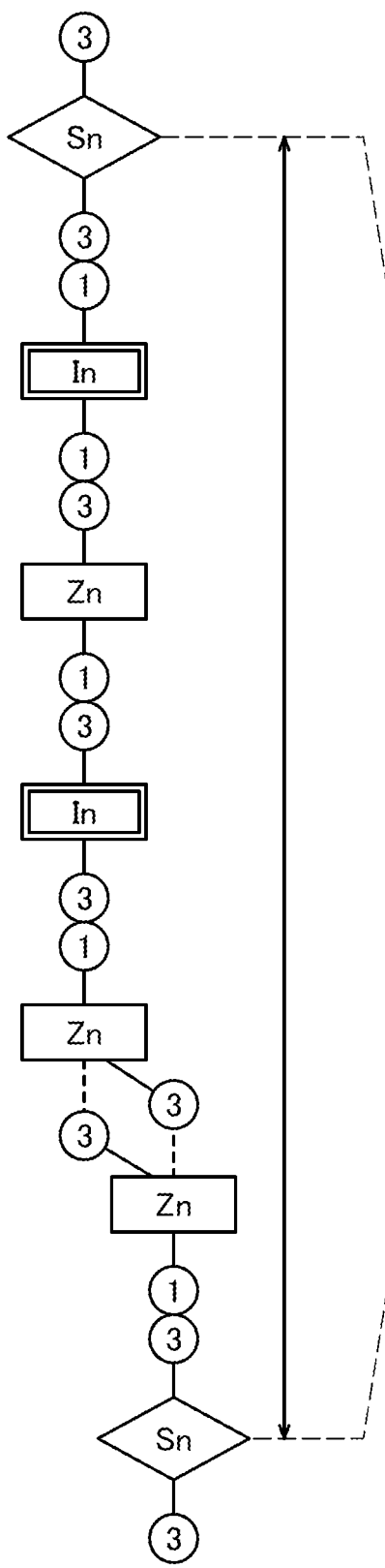
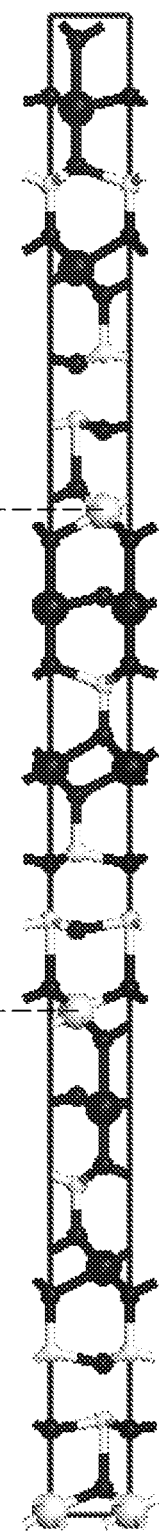
FIG. 19C
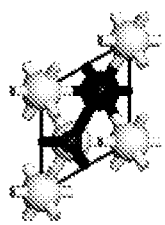
● In
○ Sn
○ Zn
● O ● In
○ Ga
○ Zn
● O

METHOD FOR DRIVING SEMICONDUCTOR DEVICE

BACKGROUND OF THE INVENTION

1. Field of the Invention

The disclosed invention relates to a semiconductor device including a semiconductor element and a method for driving the semiconductor device.

2. Description of the Related Art

Storage devices using semiconductor elements are broadly classified into two categories: a volatile device that loses stored data when power is not supplied, and a nonvolatile device that holds stored data even when power is not supplied.

A typical example of a volatile storage device is a dynamic random access memory (DRAM). A DRAM stores data in such a manner that a transistor included in a storage element is selected and electric charge is accumulated in a capacitor.

When data is read from a DRAM, electric charge in a capacitor is lost on the above-described principle; thus, another writing operation is necessary every time data is read. Moreover, since leakage current (off-state current) flows between a source and a drain of a transistor included in a storage element when the transistor is in an off state for example, electric charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power is not supplied, an additional storage device using a magnetic material or an optical material is needed in order to hold the data for a long time.

Another example of a volatile storage device is a static random access memory (SRAM). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power is not supplied.

A typical example of a nonvolatile storage device is a flash memory. A flash memory includes a floating gate between a gate electrode and a channel formation region in a transistor and stores data by holding electric charge in the floating gate. Therefore, a flash memory has advantages in that a data holding period is extremely long (almost permanent) and stored data can be held even when power is not supplied (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for injection of electric charge to the floating gate or removal of the electric charge, and a circuit for generating high voltage is also necessary. Further, it takes a relatively long time to inject or remove electric charge, and it is not easy to increase the speed of writing or erasing data.

REFERENCE

Patent Document

[Patent Document 1] Japanese Published Patent Application No. S57-105889

SUMMARY OF THE INVENTION

In view of the above, it is an object of an embodiment of the disclosed invention to provide a method for driving a semiconductor device in which stored data can be held even when power is not supplied and the number of writing operations is not limited.

In order to achieve the object, an embodiment of the present invention provides a semiconductor device including a nonvolatile memory cell including a writing transistor which includes an oxide semiconductor, a reading transistor which includes a semiconductor material different from that of the writing transistor, and a capacitor. Data is written and rewritten to the memory cell by turning on the writing transistor so that a potential is supplied to a node where one of a source electrode and a drain electrode of the writing transistor, one electrode of the capacitor, and a gate electrode of the reading transistor are electrically connected to each other, and then turning off the writing transistor, so that a predetermined amount of electric charge is held in the node. Data is read from the memory cell by supplying a ground potential to a source line electrically connected to a drain electrode of the reading transistor and supplying a precharge potential which is between the ground potential and a power supply potential to a bit line electrically connected to a source electrode of the reading transistor, and then stopping supply of the potential to the bit line, so that the potential of the bit line changes depending on the potential held in the node.

Specifically, the following structure and driving method can be employed, for example.

In accordance with an embodiment of the present invention, a source electrode of a first transistor is electrically connected to a bit line, a drain electrode of the first transistor is electrically connected to a source line, and a gate electrode of the first transistor, a drain electrode of a second transistor, and one electrode of a capacitor are electrically connected to each other to form a node where a potential is held. An embodiment of the present invention is a method for driving a semiconductor device in which, in such a structure, a writing period and a reading period following the writing period are provided, and in the reading period, a ground potential is supplied to the source line, the bit line is connected to a precharge potential supplying line so that the potential of the bit line is set to a precharge potential, and the bit line is disconnected from the precharge potential supplying line, so that the potential of the bit line changes depending on the potential held in the node.

In the above structure, the potential held in the node can be read by measuring the change in potential of the bit line.

In accordance with an embodiment of the present invention, a memory cell array including a plurality of bit lines, at least one source line, and a plurality of memory cells is provided. In one of the memory cells, a source electrode of a first transistor is electrically connected to one of the plurality of bit lines, a drain electrode of the first transistor is electrically connected to the source line, and a gate electrode of the first transistor, a drain electrode of a second transistor, and one electrode of a capacitor are electrically connected to each other to form a node where a potential is held. An embodiment of the present invention is a method for driving a semiconductor device in which, in such a structure, a writing period and a reading period following the writing period are provided, and in the reading period, in the memory cell which is to be selected, a ground potential is supplied to the source line, the bit line is connected to a precharge potential supplying line so that the potential of the bit line is set to a precharge potential, and the bit line of the selected memory cell is disconnected from the precharge potential supplying line, so that the potential of the bit line changes depending on the potential held in the node.

In the above structure, the potential held in the node in the selected memory cell can be read by measuring the change in potential of the bit line.

In the above structure, in the reading period, the source line of a non-selected memory cell can be connected to the precharge potential supplying line.

In the above structure, the first transistor can be a p-channel transistor or an n-channel transistor.

In the above structure, a channel formation region of the second transistor can include an oxide semiconductor.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of such a component. For example, an "electrode" is sometimes used as part of a "wiring", and vice versa. In addition, the term such as "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms such as "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Since the off-state current of a transistor including an oxide semiconductor used in an embodiment of the present invention is extremely small, stored data can be held for an extremely long time by using the transistor. In other words, power consumption can be reduced because refresh operation becomes unnecessary or the frequency of refresh operation can be extremely low. Moreover, stored data can be held for a long period even when power is not supplied (note that a potential is preferably fixed).

Further, a semiconductor device according to an embodiment of the present invention does not need high voltage for writing of data and there is no problem of deterioration of elements. For example, unlike the above-described flash memory, it is not necessary to inject and extract electrons into and from a floating gate, and thus a problem such as deterioration of a gate insulating layer does not arise at all. That is, the semiconductor device according to an embodiment of the disclosed invention does not have a limitation on the number of times of rewriting of data, which is a problem of a conventional nonvolatile memory, and the reliability thereof is drastically improved. Furthermore, since data is written by turning on or off the transistor, high-speed writing can be easily realized. In addition, the semiconductor device has an advantage of not needing an operation for erasing data.

A transistor including a material other than an oxide semiconductor and capable of high-speed operation is used as a reading transistor, whereby high-speed reading in the semiconductor device can be achieved. Further, a transistor including a material other than an oxide semiconductor can favorably achieve a variety of circuits (such as a logic circuit or a driver circuit) which are required to operate at high speed.

In a method for driving a semiconductor device according to an embodiment of the present invention, data is read from a memory cell in the following manner: a ground potential is supplied to a source line and a precharge potential is supplied to a bit line and then supply of the potential to the bit line is stopped, so that precharge which causes an increase in potential does not need to be performed on the source line in a reading period. In addition, the potential of the bit line does not need to be increased to exceed the precharge potential, so that there is a smaller change in potential. Accordingly, as compared to a reading method in which the potentials of the source line and the bit line are greatly changed, reading operation can be performed within a short time.

BRIEF DESCRIPTION OF THE DRAWINGS

FIGS. 19A to 19C illustrate a crystal structure of an oxide semiconductor.

DETAILED DESCRIPTION OF THE INVENTION

Figures 1, 1A:
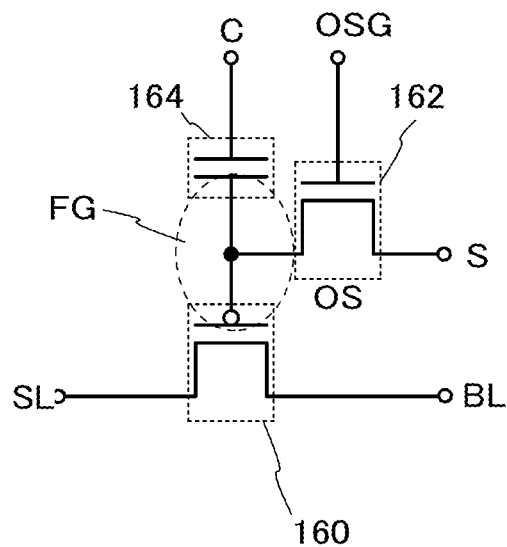
FIGS. 1A-1, 1A-2, and 1B are each a circuit diagram of a semiconductor device.

Hereinafter, examples of embodiments of the present invention will be described with reference to the drawings. Note that the present invention is not limited to the following description and it will be readily appreciated by those skilled in the art that modes and details thereof can be modified in various ways without departing from the spirit and the scope of the present invention. Therefore, the present invention should not be construed as being limited to the description in the embodiments below.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

(Embodiment 1)

In this embodiment, circuit configurations and operations of a semiconductor device according to an embodiment of the disclosed invention will be described with reference to FIGS. 1A-1, 1A-2, and 1B, FIGS. 2A and 2B, FIG. 3, FIG. 4, FIG. 5, FIG. 6, FIG. 7, FIG. 8, FIG. 9, FIG. 10, and FIG. 11. Note that in each of the circuit diagrams, "OS" may be written beside a transistor in order to indicate that the transistor includes an oxide semiconductor. The point of an embodiment of the present invention is to provide a semiconductor device including a transistor whose off-state current is very small, and thus, a transistor including a material other than an oxide semiconductor whose off-state current is small may also be used instead of a transistor including an oxide semiconductor.

<Basic Circuit 1>

First, the most basic circuit configuration and its operation will be described with reference to FIGS. 1A-1, 1A-2, and 1B. In a semiconductor device illustrated in FIG. 1A-1, a source line SL is electrically connected to a source electrode (or a drain electrode) of a transistor 160. A bit line BL is electrically connected to the drain electrode (or the source electrode) of the transistor 160. In addition, a signal line S is electrically connected to a source electrode (or a drain electrode) of a transistor 162, and a write word line OSG is electrically connected to a gate electrode of the transistor 162. A gate electrode of the transistor 160 and the drain electrode (or the source electrode) of the transistor 162 are electrically connected to one electrode of a capacitor 164. A capacitor line C is electrically connected to the other electrode of the capacitor 164.

Here, a transistor including an oxide semiconductor is used as the transistor 162, for example. The off-state current of a transistor including an oxide semiconductor used in an embodiment of the present invention is extremely small. For that reason, a potential of the gate electrode of the transistor 160 can be held for an extremely long time by turning off the transistor 162. Providing the capacitor 164 facilitates holding of a potential supplied to the gate electrode of the transistor 160 and also reading of held data.

There is no particular limitation on a semiconductor material and the conductivity of a channel of the transistor 160. As for the conductivity of a channel of a transistor, when a p-channel transistor is used, reading operation can be performed without a low potential, which makes a peripheral circuit for generating a low potential unnecessary. On the other hand, when an n-channel transistor is used, high-speed reading operation is possible. As for a semiconductor material, in terms of increasing the speed of reading data, it is preferable to use, for example, a transistor with a high switching rate such as a transistor including single crystal silicon.

Figure 1B:
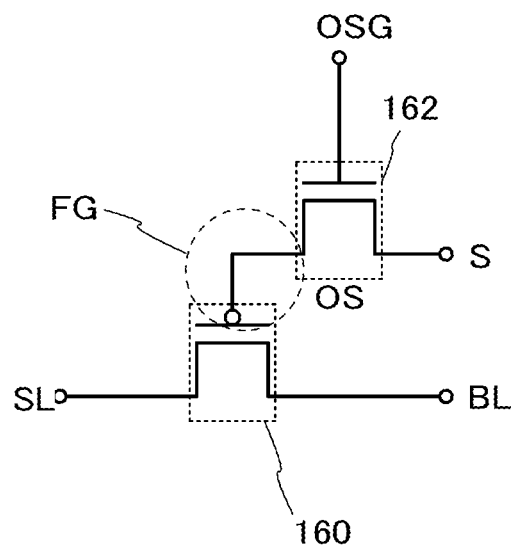

Alternatively, the capacitor 164 may be omitted as in FIG. 1B.

The semiconductor device in FIG. 1A-1 utilizes a characteristic in which the potential of the gate electrode of the transistor 160 can be held, and can thus write, hold, and read data as follows.

First, writing and holding of data will be described. The capacitor line C is set to a predetermined potential (constant potential) and the write word line OSG is set to a potential which allows the transistor 162 to be turned on, so that the transistor 162 is turned on. Accordingly, the potential of the signal line S is supplied to the gate electrode of the transistor 160 and the capacitor 164. In other words, a predetermined potential is supplied to the gate electrode of the transistor 160 (i.e., writing of data). Here, one of two different potentials, Vdata 1 (a high potential, also referred to as data "1") or Vdata 0 (a low potential, also referred to as data "0") is supplied. Note that three or more different potentials may be supplied to improve a storage capacity. After that, the potential of the write word line OSG is set to a potential which allows the transistor 162 to be turned off, so that the transistor 162 is turned off. Thus, the potential supplied to the gate electrode of the transistor 160 is held (holding).

Since the off-state current of the transistor 162 is very small, the potential of the gate electrode of the transistor 160 is held for a long time.

Then, reading of data will be described. By supplying an appropriate potential (reading potential) to the capacitor line C while a predetermined potential (constant potential) is supplied to the source line SL, the potential of the bit line BL changes depending on the potential held in the gate electrode of the transistor 160. This is because in general, when the transistor 160 is a p-channel transistor, an apparent threshold voltage $V_{th\_H}$ in the case where Vdata 1 (data "1") is supplied to the gate electrode of the transistor 160 is lower than an apparent threshold voltage $V_{th\_L}$ in the case where Vdata 0 (data "0") is supplied to the gate electrode of the transistor 160. Here, the apparent threshold voltage refers to the potential of the capacitor line C, which is needed to turn on the transistor 160. Thus, by setting the potential of the capacitor line C to a potential $V_0$ which is between $V_{th\_H}$ and $V_{th\_L}$, the potential supplied to the gate electrode of the transistor 160 can be determined. For example, in the case where Vdata 1 (data "1") is supplied in writing, when the potential of the capacitor line C is $V_o$ (>$V_{th\_H}$), the transistor 160 is turned off. In the case where Vdata 0 (data "0") is supplied in writing, when the potential of the capacitor line C is $V_0$ (<$V_{th\_L}$), the transistor 160 is turned on. Thus, the data held can be read by measuring the potential of the bit line BL.

Note that in the case where memory cells are arrayed to be used, only data of a desired memory cell is needed to be read. The following may be employed so that data of a desired memory cell is read and data of the other memory cells is not read. In the case where the transistors 160 are connected in parallel, capacitor lines C of memory cells that are not a target for reading operation are supplied with a potential which allows the transistors 160 to be turned off regardless of the state of the gate electrodes, that is, a potential higher than $V_{th\_H}$. On the other hand, in the case where the transistors 160 are connected in series, the capacitor lines C of the memory cells that are not a target for reading operation are supplied with a potential which allows the transistors 160 to be turned on regardless of the state of the gate electrodes, that is, a potential lower than $V_{th\_L}$.

Next, data rewriting operation will be described. Rewriting of data is performed in a manner similar to that of the writing and holding of data. In other words, the potential of the write word line OSG is set to a potential which allows the transistor 162 to be turned on, so that the transistor 162 is turned on. Accordingly, the potential of the signal line S (a potential for new data) is supplied to the gate electrode of the transistor 160 and the capacitor 164. After that, the potential of the write word line OSG is set to a potential which allows the transistor 162 to be turned off, so that the transistor 162 is turned off. Thus, the potential for new data is held in the gate electrode of the transistor 160.

In the semiconductor device according to an embodiment of the disclosed invention, data can be directly rewritten by another writing of data as described above. Therefore, extracting of electric charge from a floating gate with the use of a high voltage needed in a flash memory or the like is not necessary, and thus, a reduction in operation speed, which is attributed to erasing operation, can be suppressed. In other words, high-speed operation of the semiconductor device can be realized.

Note that the drain electrode (or the source electrode) of the transistor 162 is electrically connected to the gate electrode of the transistor 160, and thereby has an effect similar to that of a floating gate of a floating gate transistor which is used as a nonvolatile memory element. Hereinafter, the portion where the drain electrode (or the source electrode) of the transistor 162 and the gate electrode of the transistor 160 are electrically connected to each other is called a node FG in some cases. When the transistor 162 is off, the node FG can be regarded as being embedded in an insulator and a potential is held in the node FG. The off-state current of the transistor 162 including an oxide semiconductor used in an embodiment of the present invention is less than or equal to 1/100000 of the off-state current of a transistor including a silicon semiconductor or the like; thus, loss of the potential accumulated in the node FG due to leakage in the transistor 162 is negligible. That is, with the transistor 162 including an oxide semiconductor, a nonvolatile memory element which can hold data without being supplied with power can be realized.

For example, the off-state current (per unit channel width (1 μm), here) at room temperature (25° C.) of a transistor including an In—Ga—Zn—O-based oxide semiconductor can be lowered to lower than or equal to 100 zA (1 zA (zeptoampere) is $1 \times 10^{-21}$ A), preferably lower than or equal to 10 zA, more preferably lower than or equal to 1 zA, still more preferably lower than or equal to 100 yA. In the case where the capacitance value of the capacitor 164 is approximately 10 fF, data can be held for at least longer than or equal to $10^6$ seconds. It is needless to say that the holding time depends on transistor characteristics and the capacitance value.

In the semiconductor device of the disclosed invention, a problem of deterioration of a gate insulating film (a tunnel insulating film), which occurs in a conventional floating gate transistor, does not exist. That is, the deterioration of a gate insulating film due to injection of an electron to a floating gate, which has been traditionally regarded as a problem, can be solved. This means that there is no limitation on the number of times of writing in principle. Furthermore, a high voltage needed for writing or erasing in a conventional floating gate transistor is not necessary.

Figures 1, 1A, 2:
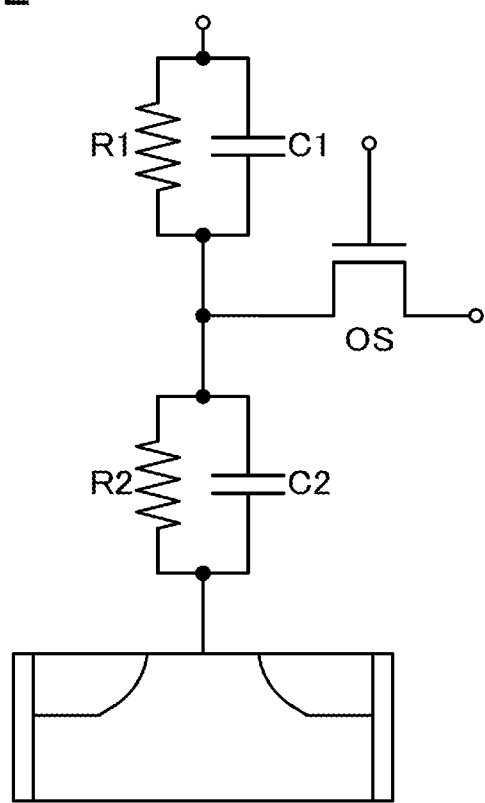

The components such as transistors in the semiconductor device in FIG. 1A-1 can be regarded as including a resistor and a capacitor as shown in FIG. 1A-2. That is, in FIG. 1A-2, the transistor 160 and the capacitor 164 are each regarded as including a resistor and a capacitor. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance value C2 corresponds to the capacitance value of so-called gate capacitance (capacitance formed between the gate electrode and the source electrode or the drain electrode and capacitance formed between the gate electrode and the channel formation region).

A potential holding period (also referred to as a data holding period) is determined mainly by off-state current of the transistor 162 under the condition where gate leakage current of the transistor 162 is sufficiently small, R1 is higher than or equal to ROS (R1≥ROS), and R2 is higher than or equal to ROS (R2≥ROS), where ROS is the resistance value (also referred to as effective resistance) between the source electrode and the drain electrode at the time when the transistor 162 is off.

On the other hand, when the conditions are not met, it is difficult to sufficiently ensure the holding period even if the off-state current of the transistor 162 is small enough. This is because a leakage current other than the off-state current of the transistor 162 (e.g., a leakage current generated between the source electrode and the gate electrode) is large. Thus, it can be said that the semiconductor device disclosed in this embodiment desirably satisfies the relation where R1 is higher than or equal to ROS (R1≥ROS), and R2 is higher than or equal to ROS (R2≥ROS).

It is desirable that C1 and C2 satisfy C1≥C2 (C1 is greater than or equal to C2). This is because if C1 is large, when the potential of the node FG is controlled by the capacitor line C, the potential of the capacitor line C can be efficiently supplied to the node FG and the difference between potentials supplied to the capacitor line C (e.g., a reading potential and a non-reading potential) can be kept small.

As described above, when the above relation is satisfied, a more favorable semiconductor device can be realized. Note that R1 and R2 are controlled by the gate insulating layer of the transistor 160 and the insulating layer of the capacitor 164. The same relation is applied to C1 and C2. Therefore, the material, the thickness, and the like of the gate insulating layer and the insulating layer of the capacitor 164 are desirably set as appropriate to satisfy the above relations.

In the semiconductor device described in this embodiment, the node FG has an effect similar to that of a floating gate of a floating gate transistor in a flash memory or the like, but the node FG of this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of the adjacent cell. This is one of inhibiting factors for higher integration of the semiconductor device. The factor is due to a basic principle of a flash memory that tunneling current is generated by application of a high voltage.

In contrast, the semiconductor device according to this embodiment is operated by switching of a transistor including an oxide semiconductor and does not use the above-described principle of electric charge injection by tunneling current. That is, unlike a flash memory, a high voltage for electric charge injection is not necessary. Accordingly, an influence of a high voltage for a control gate on the adjacent cell does not need to be taken into account, and thus, high integration can be facilitated.

In addition, it is also advantageous that a high electric field is unnecessary and a large peripheral circuit (such as a booster circuit) is unnecessary as compared to a flash memory. For example, the highest voltage applied to the memory cell according to this embodiment (difference between the highest potential and the lowest potential supplied to terminals of the memory cell at the same time) can be lower than or equal to 5 V, preferably lower than or equal to 3 V in each memory cell in the case where two-level (one-bit) data is written.

Further, in the case where the relative dielectric constant $\varepsilon r1$ of the insulating layer included in the capacitor 164 is different from the relative dielectric constant $\varepsilon r2$ of the insulating layer included in the transistor 160, it is easy to satisfy $C1 \geq C2$ (C1 is greater than or equal to C2) while $2 \cdot S2 \geq S1$ ($2 \cdot S2$ is greater than or equal to S1), preferably $S2 \geq S1$ (S2 is greater than or equal to S1) is satisfied where S1 is the area of the insulating layer included in the capacitor 164 and S2 is the area of the insulating layer forming gate capacitance in the transistor 160. In other words, $C1 \geq C2$ (C1 is greater than or equal to C2) can easily be satisfied while the area of the insulating layer included in the capacitor 164 is made small. Specifically, for example, a film formed of a high-k material such as hafnium oxide or a stack of a film formed of a high-k material such as hafnium oxide and a film formed of an oxide semiconductor is used for the insulating layer included in the capacitor 164 so that $\varepsilon r1$ can be greater than or equal to 10, preferably greater than or equal to 15; silicon oxide is used for the insulating layer forming the gate capacitance so that $\varepsilon r2$ can satisfy $3 \leq \varepsilon r2 \leq 4$ ($\varepsilon r2$ is greater than or equal to 3 and less than or equal to 4).

Combination of such structures enables higher integration of the semiconductor device according to the disclosed invention.

In addition to a flash memory, a magnetic tunnel junction element (MTJ element) is known as a nonvolatile random access memory. The MTJ element is an element for storing data in a low resistance state when the magnetization directions of ferromagnetic films which are formed with an insulating film provided therebetween are parallel and storing data in a high-resistance state when the directions thereof are anti parallel. Thus, its operation principle is quite different from that of a memory including an oxide semiconductor according to this embodiment. Table 1 shows comparison between the MTJ element and the semiconductor device according to this embodiment.

TABLE 1

|  | MTJ element | Semiconductor device of this embodiment |
|---|---|---|
| 1) Heat resistance | Curie temperature | Process temperature at 500° C. (reliability at 150° C.) |
| 2) Driving method | Current driving | Voltage driving |
| 3) Writing principle | Changing magnetization direction of ferromagnetic film | Turning on/off FET |
| 4) Si LSI | Suitable for bipolar LSI (For highly integrated circuit, MOS LSI is preferable to bipolar LSI, which is unsuitable for high integration. Note that W becomes larger.) | Suitable for MOS LSI |
| 5) Overhead | Large (because of high Joule heat) | Smaller than overhead of MTJ element by 2 to 3 or more orders of magnitude (because of utilizing charging and discharging of parasitic capacitance) |
| 6) Nonvolatility | Utilizing spin | Utilizing small off-state current |
| 7) Read cycles | No limitation | No limitation |
| 8) 3D structure | Difficult (at most two layers) | Easy (with a limitless number of layers) |
| 9) Integration degree ($F^2$) | $4 F^2$ to $15 F^2$ | Depending on the number of layers stacked in 3D structure (need heat resistance high enough to withstand process of forming upper OS FET) |
| 10) Material | Magnetic rare-earth element | OS material |
| 11) Cost per bit | High | Low (might be slightly high depending on constituent of OS (e.g., In)) |
| 12) Resistance to magnetic field | Low | High |

The MTJ element has a disadvantage in that, because a magnetic material is used, a magnetic property is lost when the temperature is higher than or equal to the Curie temperature. In addition, the MTJ element is compatible with a silicon bipolar device because current driving is employed; however, the bipolar device is unsuitable for high integration. Further, there is a problem in that power consumption is increased by an increase in memory capacity, though the writing current of the MTJ element is extremely small.

In principle, the MTJ element has low resistance to a magnetic field, and the magnetization direction is easily changed when the MTJ element is exposed to a high magnetic field. In addition, it is necessary to control magnetic fluctuation which is caused by nanoscaling of a magnetic material used for the MTJ element.

In addition, a rare earth element is used for the MTJ element; thus, it requires special attention to incorporate a process of forming the MTJ element in a process of forming a silicon semiconductor that is sensitive to metal contamination. The material cost per bit of the MTJ element is expensive.

On the other hand, the transistor including an oxide semiconductor in this embodiment has an element structure and an operation principle similar to those of a silicon MOSFET except that a semiconductor material for forming a channel is a metal oxide. Further, the transistor including an oxide semiconductor is not affected by a magnetic field, and does not cause soft errors. This shows that the transistor is highly compatible with a silicon integrated circuit.

Note that in addition to the increase in the degree of integration, a multilevel technique can be employed in order to increase the storage capacity of the semiconductor device. For example, three or more levels of data are written to one memory cell, whereby the storage capacity can be increased as compared to the case where two-level (one-bit) of data is written. The multilevel technique can be achieved by, for example, applying a potential Vdata for supplying another level of potential to the gate electrode of the transistor 160, in addition to the low potential Vdata 0 (data "0") and the high potential Vdata 1 (data "1"). In this case, enough storage capacity can be ensured even in a circuit configuration with a relatively large scale (e.g., 15 $F^2$ to 50 $F^2$; F is the minimum feature size).

<Basic Circuit 2>

Figure 2A:
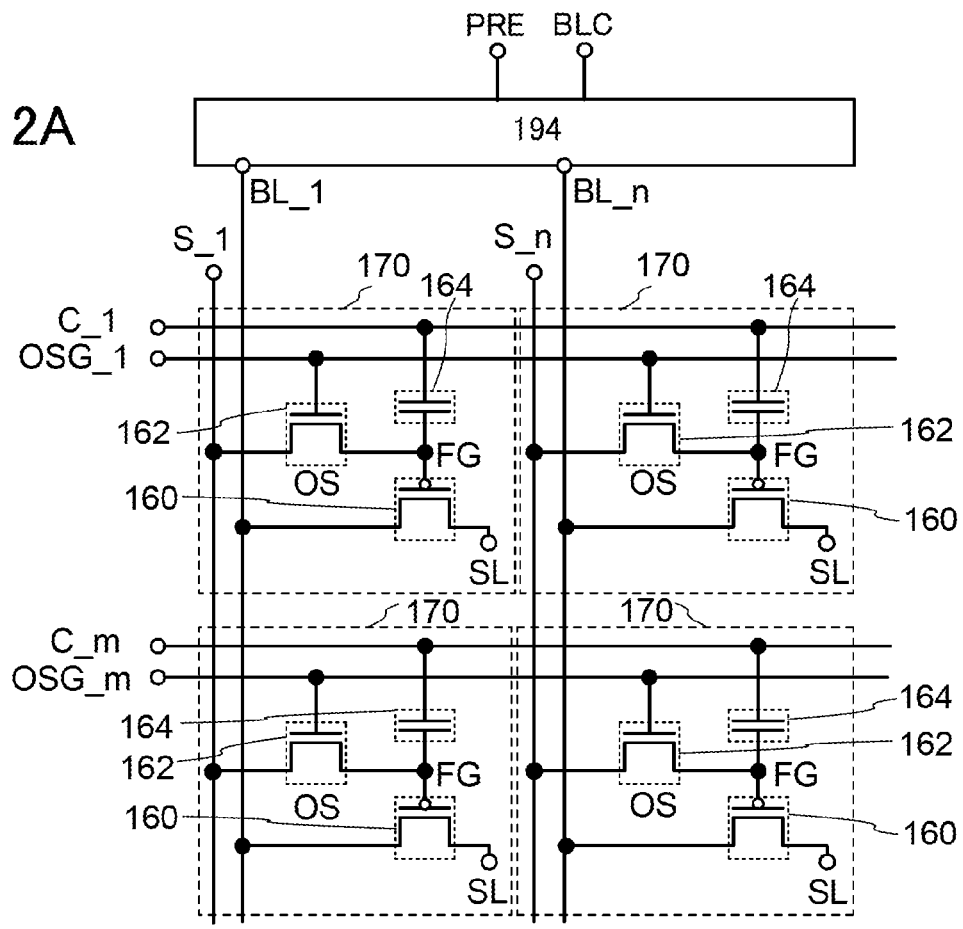
FIGS. 2A and 2B are each a circuit diagram of a semiconductor device.
Figure 2B:
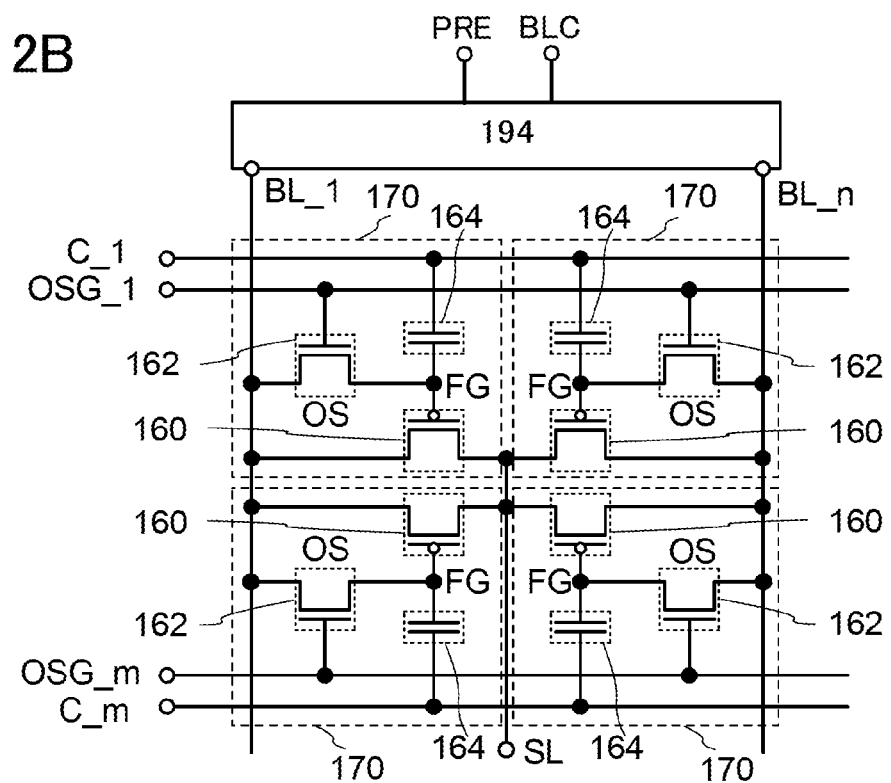

FIGS. 2A and 2B are circuit diagrams of memory cell arrays in each of which the memory cells illustrated in FIG. 1A-1 are arranged in a matrix of two rows and two columns. The configurations of memory cells 170 in FIGS. 2A and 2B are similar to that in FIG. 1A-1. In FIG. 2A, to each of the memory cells, a source line SL, a bit line BL, a signal line S, a write word line OSG, and a capacitor line C are electrically connected. In FIG. 2B, the bit line BL also serves as the signal line S, and the source line SL is shared by the memory cells in two columns.

When the source line SL, the bit line BL, the signal line S, the write word line OSG, and the capacitor line C are electrically connected to each of the memory cells as illustrated in FIG. 2A, potentials which are different depending on the memory cells can be supplied to the lines.

When the bit line BL also serves as the signal line S and the source line SL is shared by two columns as illustrated in FIG. 2B, the number of the lines connected to the memory cell 170 can be reduced.

Note that the source line SL may be shared by rows instead of being shared by columns Note that without limitation to two columns (or two rows), memory cells in plural columns (or plural rows) such as three or more columns (or three or more rows) may share the source line SL. The number of columns (or rows) which share the source line SL may be determined as appropriate in consideration of parasitic resistance and parasitic capacitance generated when the source line SL is shared. Further, the number of columns (or rows) which share the source line SL is preferably large, in which case the number of lines connected to the memory cells 170 can be reduced.

Although the memory cells are connected in parallel in the memory cell arrays FIGS. 2A and 2B, the memory cells may be connected in series.

In FIGS. 2A and 2B, the bit line BL is electrically connected to a bit line driver circuit 194. The bit line driver circuit 194 is electrically connected to a bit line switching signal line BLC and a precharge potential supplying line PRE as well as the bit line BL.

In the semiconductor devices illustrated in FIGS. 2A and 2B, writing, holding, and reading of data are performed in a manner similar to that of the case of FIGS. 1A-1, 1A-2, and 1B; therefore, the above description can be referred to. Here, in the semiconductor device illustrated in FIGS. 2B, a specific operation, for example, in the case where either a power supply potential $V_{DD}$ or a ground potential GND is supplied to the node FG and in the case where data held at the time when a power supply potential $V_{DD}$ is supplied to the node FG is data "1" and data held at the time when a ground potential GND is supplied to the node FG is data "0" is described.

First, writing operation is as follows. The potential of the capacitor line C connected to the memory cell 170 is set to the ground potential GND and the potential of the write word line OSG connected to the memory cell 170 is set to a high potential $V_H$, so that the memory cell 170 is selected. Accordingly, the potential of the bit line BL is supplied to the node FG of the selected memory cell 170.

Next, holding operation is as follows. The potential of the write word line OSG connected to the memory cell 170 is set to a potential which allows the transistor 162 to be turned off, so that the transistor 162 is turned off. Thus, the potential supplied to the node FG is held. Since the off-state current of the transistor 162 is extremely small, the potential of the gate electrode of the transistor 160 is held for a long time.

Reading operation is as follows. First, the source line SL connected to the memory cell 170 is set to a ground potential GND. The bit line BL is connected to the precharge potential supplying line PRE to have a precharge potential VPRE1. After that, the bit line BL is disconnected from the precharge potential supplying line PRE, so that the potential of the bit line BL changes depending on the potential held in the node FG. That is, in the case where the transistor 160 is a p-channel transistor and data "1" is held in the node FG, the transistor 160 is turned off and the potential of the bit line BL is kept at the precharge potential VPRE1. When the data "0" is held in the node FG, the transistor 160 is turned on, so that the potential of the bit line BL decreases to be close to the ground potential GND of the source line SL. In this manner, by measuring the change in potential of the bit line BL, the potential held in the node FG can be read.

The bit line BL is connected to and disconnected from the precharge potential supplying line PRE by switching a signal of the bit line driver circuit 194 with a signal of the bit line switching signal line BLC.

In the case where the memory cells 170 are arrayed as in FIGS. 2A and 2B, it is necessary to read out data only from the intended memory cell 170 in a reading period. In order to read out data only from the predetermined memory cell 170 and not to read out data from the other memory cells 170 as described above, the memory cells 170 from which data is not read out need to be in a non-selected state.

For example, when the transistor 160 is a p-channel transistor and either a power supply potential $V_{DD}$ or a ground potential GND is supplied to the node FG and in the case where data held at the time when a power supply potential $V_{DD}$ is supplied to the node FG is data "1" and data held at the time when a ground potential GND is supplied to the node FG is data "0", the source line SL is set to a ground potential GND, the capacitor line C is set to a power supply potential $V_{DD}$, and the write word line OSG is set to a ground potential GND, so that the memory cell 170 can be brought into a non-selected state.

When the capacitor line C is set to the power supply potential $V_{DD}$, the potential of the node FG is increased by the power supply potential $V_{DD}$ due to capacitive coupling with the capacitor 164. In the case where the power supply potential $V_{DD}$ corresponding to data "1" has been written to the node FG, the potential of the node FG is increased by the power supply potential $V_{DD}$ to $2V_{DD}$ ($V_{DD}+V_{DD}=2V_{DD}$) and the potential of the gate electrode of the transistor 160 is higher than $V_{th\_H}$; accordingly, the transistor 160 is turned off. In addition, in the case where the ground potential GND corresponding to data "0" has been written to the node FG, the potential of the node FG is increased by the power supply potential $V_{DD}$ to $V_{DD}$ (GND+$V_{DD}=V_{DD}$) and the potential of the gate electrode of the transistor 160 is higher than $V_{th\_H}$; accordingly, the transistor 160 that is a p-channel transistor is turned off also in this case. In other words, by setting the capacitor line C to the power supply potential $V_{DD}$, the transistor 160 can be turned off, that is, the memory cell 170 can be brought into a non-selected state regardless of the data held in the node FG.

The transistor 160 can also be an n-channel transistor. In that case, even when the capacitor line C is set to the ground potential GND, not all the memory cells can always be turned off when the potential of the gate electrode of the n-channel transistor is higher than the threshold voltage thereof. Thus, in order to bring the memory cells into a non-selected state, the capacitor lines C in non-selected rows are supplied with a low potential $V_L$. The low potential $V_L$ is lower than the ground potential GND by the power supply potential $V_{DD}$.

When the transistor 160 is an n-channel transistor, the operation speed of the transistor 160 can be increased, whereby reading at high speed is possible.

As described above, in the semiconductor device described in this embodiment, the source line SL connected to the memory cell 170 is set to a ground potential in a reading period. The bit line BL is connected to the precharge potential supplying line PRE to have a percharge potential. After that, the bit line BL is disconnected from the precharge potential supplying line PRE, so that the potential of the bit line BL changes depending on the potential held in the node FG; thus, the potential held in the node FG is read.

In the above method for driving the semiconductor device, precharge which causes an increase in potential does not need to be performed on the source line SL in a reading period. In addition, the potential of the bit line BL does not need to be increased to exceed the precharge potential, so that there is less variations in potential. Accordingly, as compared to a reading method in which the potentials of the source line SL and the bit line BL are greatly changed, reading operation can be performed within a short time. In addition, even within a short time, the data "1" and the data "0" can be correctly read out.

APPLICATION EXAMPLE 1

Next, a more specific circuit configuration to which the circuit illustrated in FIGS. 1A-1, 1A-2, and 1B is applied will be described with reference to FIG. 3. Note that the case where an n-channel transistor is used as a writing transistor (the transistor 162) and a p-channel transistor is used as a reading transistor (the transistor 160) will be described below as an example. Note that in the circuit diagram illustrated in FIG. 3, wirings with slashes are wirings each including a plurality of signal lines.

Figure 3:
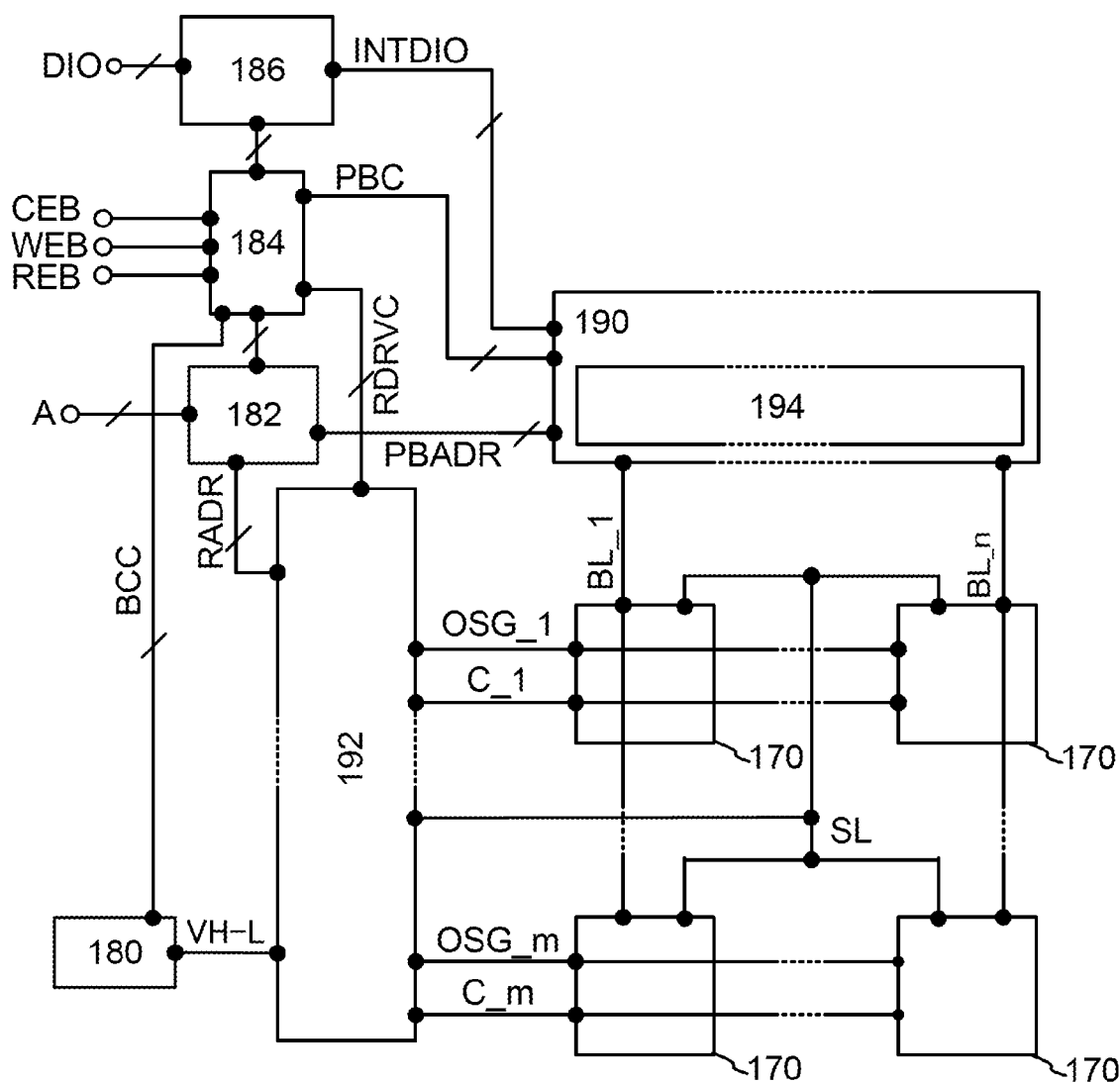
FIG. 3 is a circuit diagram of a semiconductor device.

FIG. 3 is an example of a circuit diagram of a semiconductor device including (m×n) memory cells 170. The configuration of the memory cells 170 in FIG. 3 is similar to that in FIG. 1A-1.

The semiconductor device illustrated in FIG. 3 includes m (m is an integer of greater than or equal to 2) write word lines OSG, m capacitor lines C, n (n is an integer of greater than or equal to 2) bit lines BL, a source line SL, a memory cell array having the memory cells 170 arranged in a matrix of m (rows)×n (columns), a step-up circuit 180, a first driver circuit 182 including an address decoder, a second driver circuit 192 including a row driver, a third driver circuit 190 including a page buffer, a fourth driver circuit 184 including a controller, a fifth driver circuit 186 including an input-output control circuit, and a bit line driver circuit 194. The number of driver circuits is not limited to the number in FIG. 3. Driver circuits having various functions may be combined or a driver circuit may be divided depending on functions.

In the semiconductor device illustrated in FIG. 3, the first driver circuit 182 includes an address decoder. The address decoder is a circuit which decodes an address selection signal line A and outputs the decoded address selection signal to a row selection signal line RADR and a page buffer address selection signal line PBADR. The address selection signal line A corresponds to a terminal to which a row address selection signal of the memory cells 170 and a page buffer address selection signal are input. One or more address selection signal lines A are provided depending on the numbers of columns and rows of the memory cells 170 or the configuration of the page buffer. The row selection signal line RADR is a signal line which specifies the row address of memory cells. The page buffer address selection signal line PBADR is a signal line which specifies the page buffer address.

The second driver circuit 192 includes a row driver. The row driver outputs a row selection signal of the memory cells 170, a signal to the write word line OSG, and a signal to the capacitor line C on the basis of a signal output to the row selection signal line RADR from the address decoder included in the first driver circuit 182.

The step-up circuit 180 is electrically connected to the second driver circuit 192 through a wiring $V_{H-L}$ and is configured to step up a constant potential (e.g., a power supply potential $V_{DD}$) which is input to the step-up circuit 180 and to output a potential ($V_H$) higher than the constant potential to the second driver circuit 192. In order to prevent a potential written to the node FG of the memory cell 170 from being decreased by the threshold voltage ($V_{th\_OS}$) of the transistor 162 that is a writing transistor, the potential of the write word line OSG needs to be set higher than the sum of the potential of the bit line BL and $V_{th\_OS}$. Thus, for example, when the power supply potential $V_{DD}$ is written to the node FG, $V_H$ is set higher than or equal to ($V_{DD}$ $V_{th\_OS}$). Note that if a decrease in the potential written to the node FG by $V_{th\_OS}$ does not cause any problem, the step-up circuit 180 is not necessarily provided.

The third driver circuit 190 includes a page buffer. The page buffer functions as both a data latch and a sense amplifier. The page buffer functions as a data latch as follows: the page buffer temporarily holds data output from an internal data input-output signal line INTDIO or the bit line BL and outputs the held data to the internal data input-output signal line INTDIO or the bit line BL. The page buffer functions as a sense amplifier as follows: the page buffer senses the bit line BL to which data is output from the memory cell when data is read.

The fourth driver circuit 184 is a circuit which includes a controller and generates signals for controlling the first driver circuit 182, the second driver circuit 192, the third driver circuit 190, the fifth driver circuit 186, the bit line driver circuit 194, and the step-up circuit 180, with a signal form a chip-enable bar signal line CEB, a write-enable bar signal line WEB, or a read-enable bar signal line REB.

The chip-enable bar signal line CEB is a signal line for outputting a selection signal for the entire circuit, and accepts an input signal and outputs an output signal only when it is active. The write-enable bar signal line WEB is a signal line for outputting a signal which allows latch data of the page buffer in the third driver circuit 190 to be written to the memory cell array. The read-enable bar signal line REB is a signal line for outputting a signal which allows data of the memory cell array to be read out. The fourth driver circuit 184 is electrically connected to the step-up circuit 180 through a step-up circuit control signal line BCC. The step-up circuit control signal line BCC is a wiring for transmitting a control signal of the step-up circuit which is output from a controller in the fourth driver circuit 184. No step-up circuit control signal line BCC or one or more step-up circuit control signal lines BCC are provided depending on the circuit configuration. In addition, the fourth driver circuit 184 is electrically connected to the third driver circuit 190 through a page buffer control signal line PBC. The page buffer control signal line PBC is a wiring for transmitting a control signal of the page buffer which is output from the controller in the fourth driver circuit 184. No page buffer control signal line PBC or one or more page buffer control signal lines PBC are provided depending on the circuit configuration. In addition, the fourth driver circuit 184 is electrically connected to the second driver circuit 192 through a row driver control signal line RDRVC. In addition, the fourth driver circuit 184 is electrically connected to the bit line driver circuit 194 through a bit line switching signal line BLC.

A delay circuit is provided in the fourth driver circuit 184. The delay circuit is preferably electrically connected to the page buffer control signal line PBC, the row driver control signal line RDRVC, and the source line switching signal line SLC. For example, by electrically connecting the delay circuit to the page buffer control signal line PBC and supplying a delay signal to the page buffer control signal line PBC, the timing of change in potential of the bit line BL can be delayed. In addition, by electrically connecting the delay circuit to the row driver control signal line RDRVC and supplying a delay signal to the row driver control signal line RDRVC, the timing of change in potential of the capacitor line C can be delayed. In addition, by electrically connecting the delay circuit to the source line switching signal line SLC and supplying a delay signal to the source line switching signal line SLC, the timing of change in potential of the source line SL can be delayed. Through the above, incorrect writing to the memory cell 170 can be suppressed.

The bit line driver circuit 194 is a circuit which switches the potential of the bit line BL on the basis of a bit line switching signal BLC from the controller in the fourth driver circuit 184. The bit line driver circuit 194 has a function of switching the potential of the bit line BL, and a multiplexer, an inverter, or the like may be used. The bit line switching signal line BLC is a wiring for transmitting a signal which is for switching the potential of the bit line BL and is output from the controller in the fourth driver circuit 184. One or more signal lines are provided depending on the circuit configuration.

The fifth driver circuit 186 includes an input-output control circuit. The input-output control circuit is a circuit for outputting an input signal from a data input-output signal line DIO to the internal data input-output signal line INTDIO or outputting an input signal from the internal data input-output signal line INTDIO to the data input-output signal line DIO. A terminal of the data input-output signal line DIO is a terminal to which external data is input or from which memory data is output to the outside. One or more signal lines are provided depending on the circuit configuration. The internal data input-output signal line INTDIO is a signal line for inputting an output signal from the input-output control circuit to the page buffer or inputting an output signal from the page buffer to the input-output control circuit. One or more signal lines are provided depending on the circuit configuration. Further, the data input-output signal line DIO may be divided into a date-input signal line and a data-output signal line.

<Driving Method of Semiconductor Device>

FIG. 4, FIG. 5, FIG. 6, FIG. 7, FIG. 8, FIG. 9, FIG. 10, and FIG. 11 are examples of a timing chart for the writing, holding, and reading operations of the semiconductor device in FIG. 2B. OSG, C, and the like in the timing chart denote the lines to which the potentials in the timing chart are applied. Lines having a similar function are distinguished by "1", "m", "n", and the like added to the end of their names. Note that the disclosed invention is not limited to the arrangement described below.

The timing charts in FIG. 4, FIG. 5, FIG. 6, FIG. 7, FIG. 8, FIG. 9, FIG. 10, and FIG. 11 show a relation between potentials of wirings in the case where data is written to the memory cells in m rows and n columns (m and n are each an integer of greater than or equal to 2) and all the data that is written is read out after a holding period. Data "1" is written to the memory cell in the first row and the first column, data "0" is written to the memory cell in the first row and the n-th column, data "0" is written to the memory cell in the m-th row and the first column, and data "1" is written to the memory cell in the m-th row and the n-th column in the memory cells in m rows and n columns.

Figure 4:
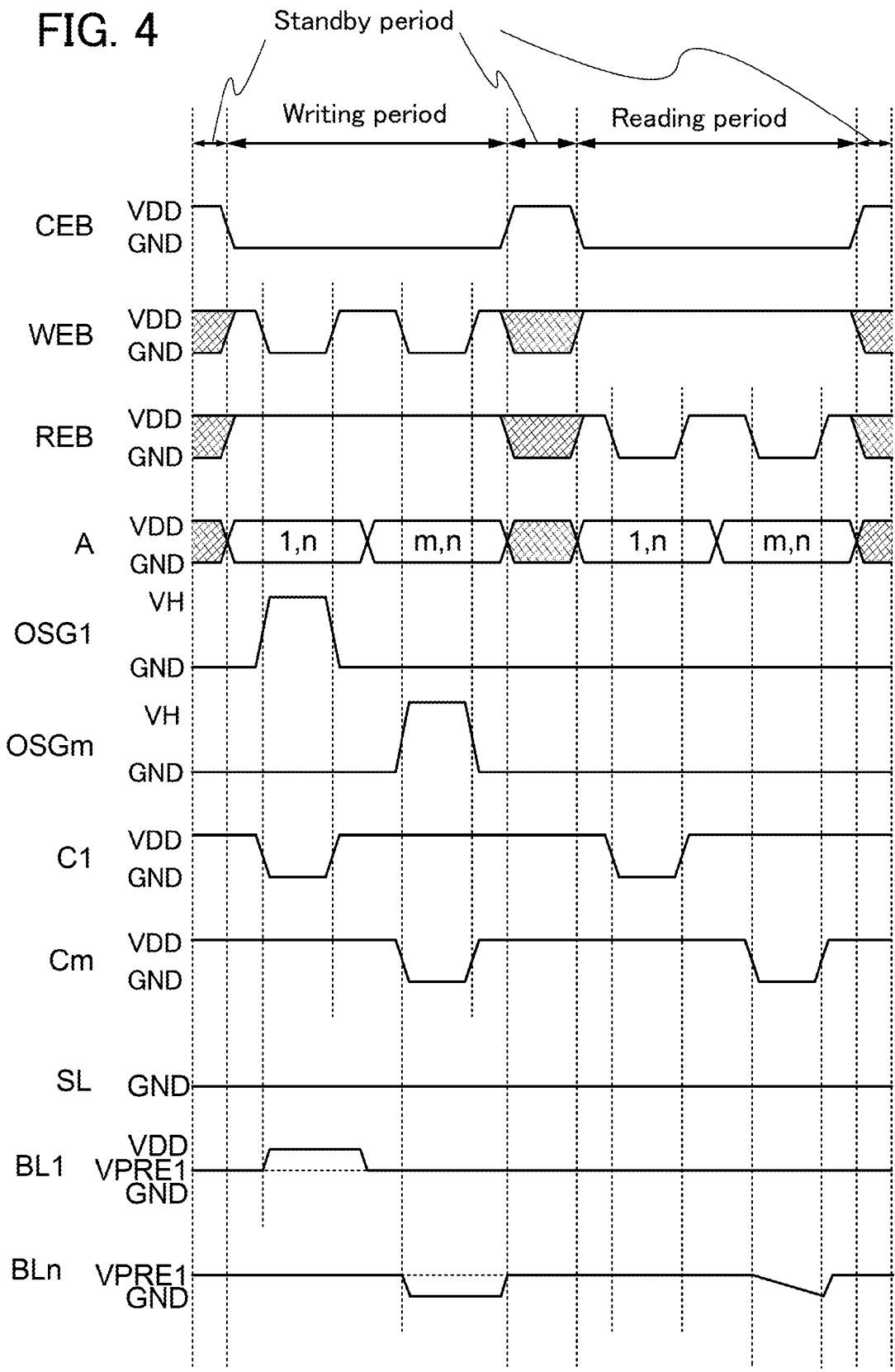
FIG. 4 is a timing chart.

First, the timing chart in FIG. 4 is described. FIG. 4 shows examples of standby, writing, holding, and reading operations in the case where the transistor 160 is a p-channel transistor.

In a standby period, the write word line OSG and the source line SL are each set to a ground potential GND and the capacitor line C is set to a power supply potential $V_{DD}$. The bit line BL is set to a precharge potential VPRE1 which is between the ground potential GND and the power supply potential $V_{DD}$.

In the writing period, first, the write word line OSG in a selected row is set to a potential (high potential: $V_H$) higher than the power supply potential $V_{DD}$, the capacitor line C is set to a ground potential GND, the write word line OSG in a non-selected row is set to a ground potential GND, and the capacitor line C is set to a power supply potential $V_{DD}$, so that a row on which writing is performed is selected.

In order to prevent a potential written to the node FG of the memory cell 170 from being decreased by the threshold voltage of the transistor 162 ($V_{th\_OS}$), the potential of the write word line OSG should be set higher than the sum of the potential of the bit line BL and $V_{th\_OS}$. Thus, for example, when a power supply potential $V_{DD}$ is written to the node FG (that is, when data "1" is written), $V_H$ is set higher than or equal to ($V_{DD}+V_{th\_OS}$). When no problem arises even though the potential written to the node FG is decreased by $V_{th\_OS}$, the potential of the write word line OSG in a selected row may be set to a power supply potential $V_{DD}$.

Then, at a timing later than the selection timing of a row on which writing is performed, data is input from the bit line BL to the memory cell. For example, when data "1" is written, power supply potential $V_{DD}$ is supplied to the bit line BL; when data "0" is written, a ground potential GND is input to the bit line BL.

According to the timing chart in FIG. 4, in the standby period, the bit line BL is supplied with the precharge potential VPRE1 which is between the power supply potential $V_{DD}$ and the ground potential GND, whereby data can be written at high speed in a writing period following the standby period. For example, in the case where the ground potential GND is supplied to the bit line BL in the standby period, in inputting the power supply potential $V_{DD}$ corresponding to data "1" in the writing period, it takes a long time for the potential to change from the ground potential GND to the power supply potential $V_{DD}$, so that the speed of writing data is decreased. However, according to the timing chart in FIG. 4, by supplying the precharge potential VPRE1 to the bit line BL in the standby period, the potential can change within a short time in the case where either the power supply potential $V_{DD}$ or the ground potential GND is input as data.

Then, the write word line OSG is supplied with the ground potential GND and the capacitor lines C in all the rows are supplied with the power supply potential VDD to bring all the memory cells in a non-selected state, and the bit line BL is supplied with VPRE1 after the write word line OSG is supplied with the ground potential GND. This is because when the timing at which the bit line BL is set to VPRE1 is earlier, incorrect writing of data to the memory cell might be caused.

In the holding period, each line has the same potential as that in the standby period.

The source line SL to which the selected memory cell is connected is set to a ground potential at least in a reading period. The bit line BL is connected to the precharge potential supplying line PRE to have a percharge potential VREF1 regardless of the selected state or the non-selected state of the bit line BL at least in the reading period. In addition, in the reading period, the capacitor line C in the selected row is set to the ground potential GND, and the capacitor line C in the non-selected row is set to the power supply potential VDD, whereby the row on which reading is performed is selected. The write word line OSG is set to ground potential GND regardless of a selected state or a non-selected state. After that, the bit line BL in the selected column is disconnected from the precharge potential supplying line PRE, so that the potential of the selected bit line BL changes depending on the potential held in the node FG. That is, in the case where the transistor 160 is a p-channel transistor, the transistor 160 is turned off when the data "1" is held in the node FG, so that the potential of the bit line BL is kept at the precharge potential VPRE1. When the data "0" is held in the node FG, the transistor 160 is turned on, so that the potential of the bit line BL decreases to be close to the ground potential GND of the source line SL. In this manner, when the potential of the bit line BL changes, the potential held in the node FG can be read.

In the method for driving the semiconductor device which is described above, precharge which causes an increase in potential does not need to be performed on the source line SL. In addition, the potential of the bit line BL does not need to be increased to exceed the precharge potential. Thus, as compared to the driving method in which reading data causes an increase in potential, data can be read out within a short time. In addition, even within a short time, the data "1" and the data "0" can be correctly read out.

Lastly, all the capacitor lines C are set to a power supply potential VDD, and the bit line BL is precharged to VREF1 again.

When the transistor 160 is a p-channel transistor, as in the driving method according to the timing chart in FIG. 4, by setting the capacitor line C in the non-selected row to positive, the memory cell can be turned off. As a result, it is not necessary to provide a circuit for generating a low potential in the memory cell, so that power consumption can be reduced and the semiconductor device can be downsized.

FIG. 4 shows an example of the method for driving the semiconductor device illustrated in FIG. 2B, and the source line SL is shared by the memory cells; however, an embodiment of the present invention is not limited thereto. The source line SL may be provided for each memory cell or each column. In that case, the potential of the corresponding source line SL can be supplied to each memory cell or each column. Accordingly, for example, the source line SL of the non-selected memory cell can be supplied with VPRE1 to have the same potential as the bit line BL.

Figure 5:
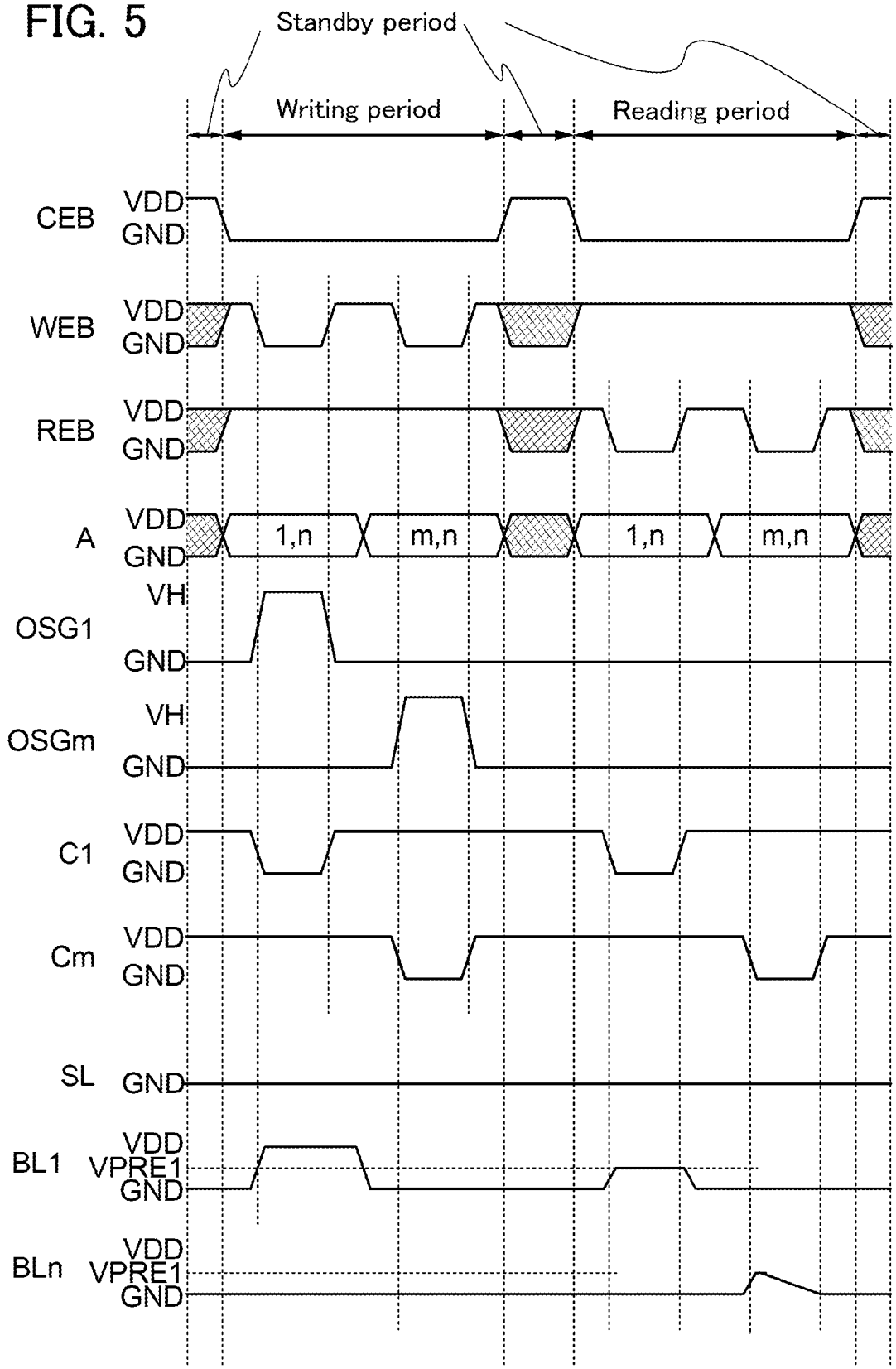
FIG. 5 is a timing chart.

The timing chart in FIG. 5 is described. The timing chart in FIG. 5 is different from the timing chart in FIG. 4 in the following points. Although in FIG. 4, the bit lines BL (BL1 to BLn) are precharged to VPRE1 in the standby period, the writing period in a non-selected state, and the reading period in a non-selected state, the bit lines BL are set to the ground potential GND in FIG. 5 in the standby period, the writing period in a non-selected state, and the reading period in a non-selected state. By setting the bit lines BL to ground potential GND in periods other than the reading period in a selected state, power consumption can be reduced.

Figure 6:
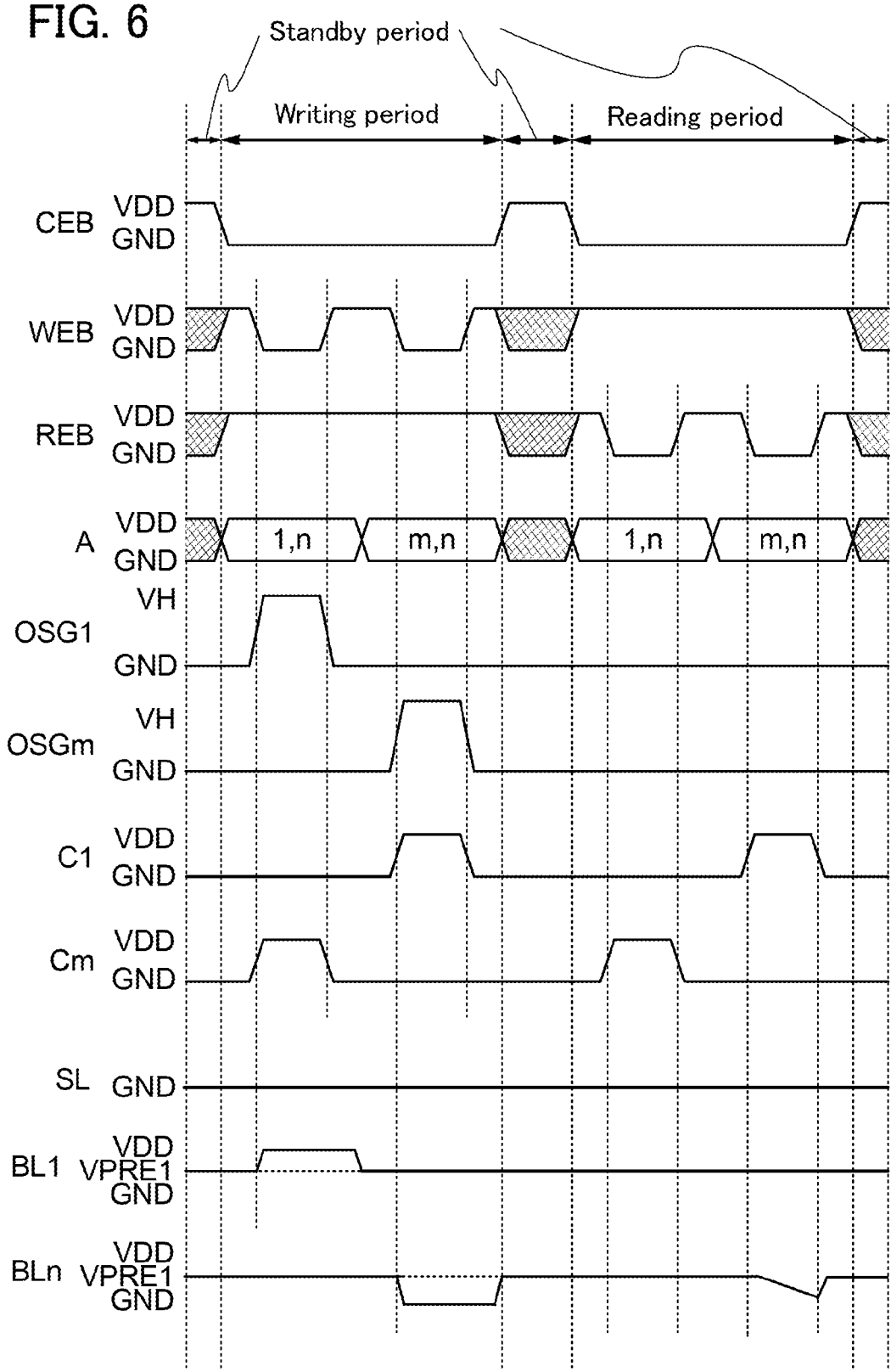
FIG. 6 is a timing chart.

The timing chart in FIG. 6 is described. The timing chart in FIG. 6 is different from the timing chart in FIG. 4 in the following points. Although in FIG. 4, the capacitor lines C (C1 to Cm) are set to the power supply potential $V_{DD}$ in the standby period, the capacitor lines C are set to the ground potential GND in the standby period in FIG. 6. By setting the capacitor lines C to the ground potential GND in the standby period, power consumption can be reduced.

Figure 7:
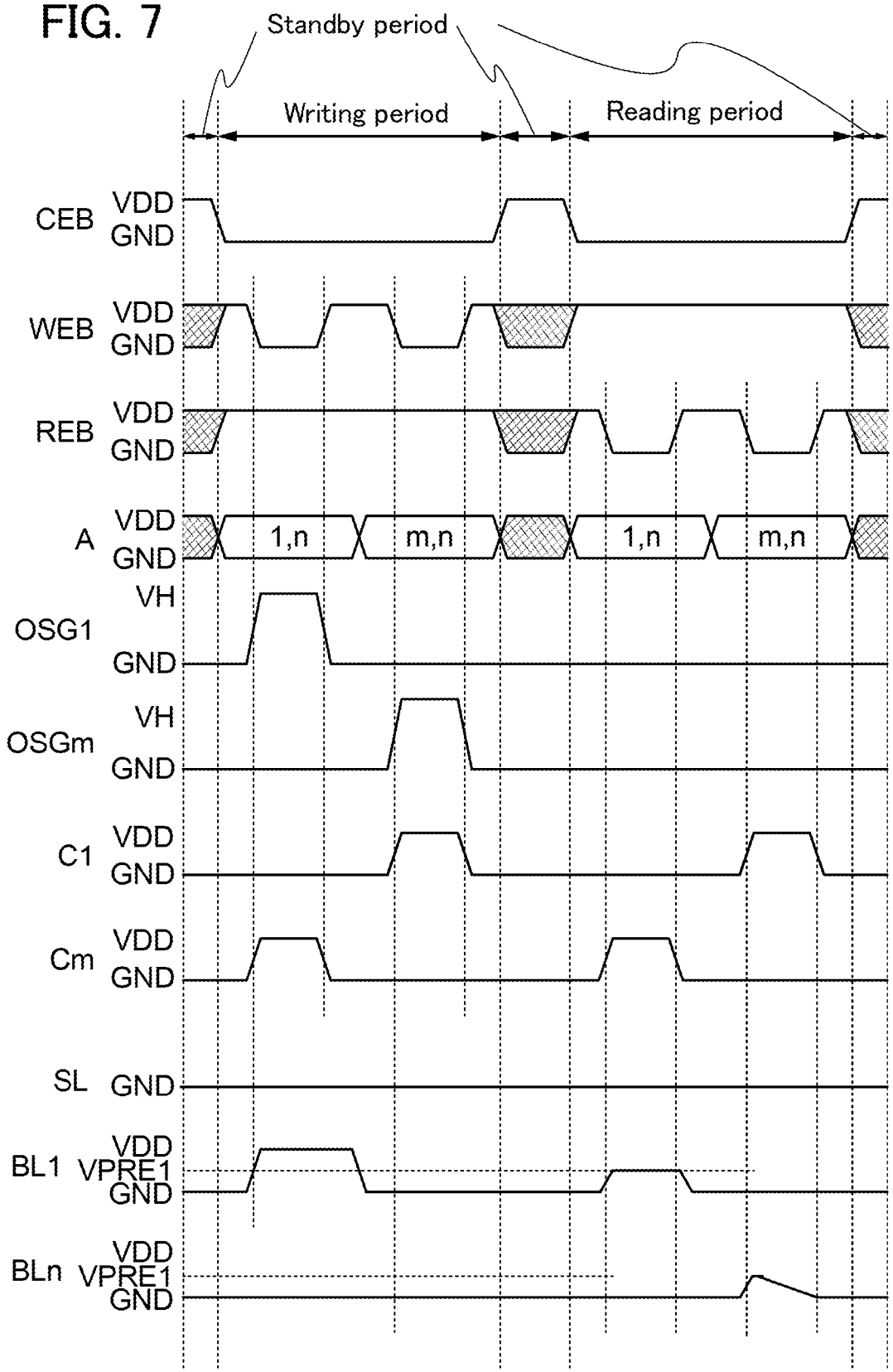
FIG. 7 is a timing chart.

The timing chart in FIG. 7 is described. The timing chart in FIG. 7 is different from the timing chart in FIG. 4 in the following points. Although in FIG. 4, the capacitor lines C are set to the power supply potential $V_{DD}$ in the standby period, the capacitor lines C are set to the ground potential GND in the standby period in FIG. 7. Further, although in FIG. 4, the bit lines BL are precharged to VPRE1 in the standby period, the writing period in a non-selected state, and the reading period in a non-selected state, the bit lines BL are set to the ground potential GND in FIG. 7 in the standby period, the writing period in a non-selected state, and the reading period in a non-selected state. By setting the capacitor lines C to the ground potential GND in the standby period and the bit lines BL to the ground potential GND in periods other than the reading period in a selected state, power consumption can be reduced.

Figure 8:
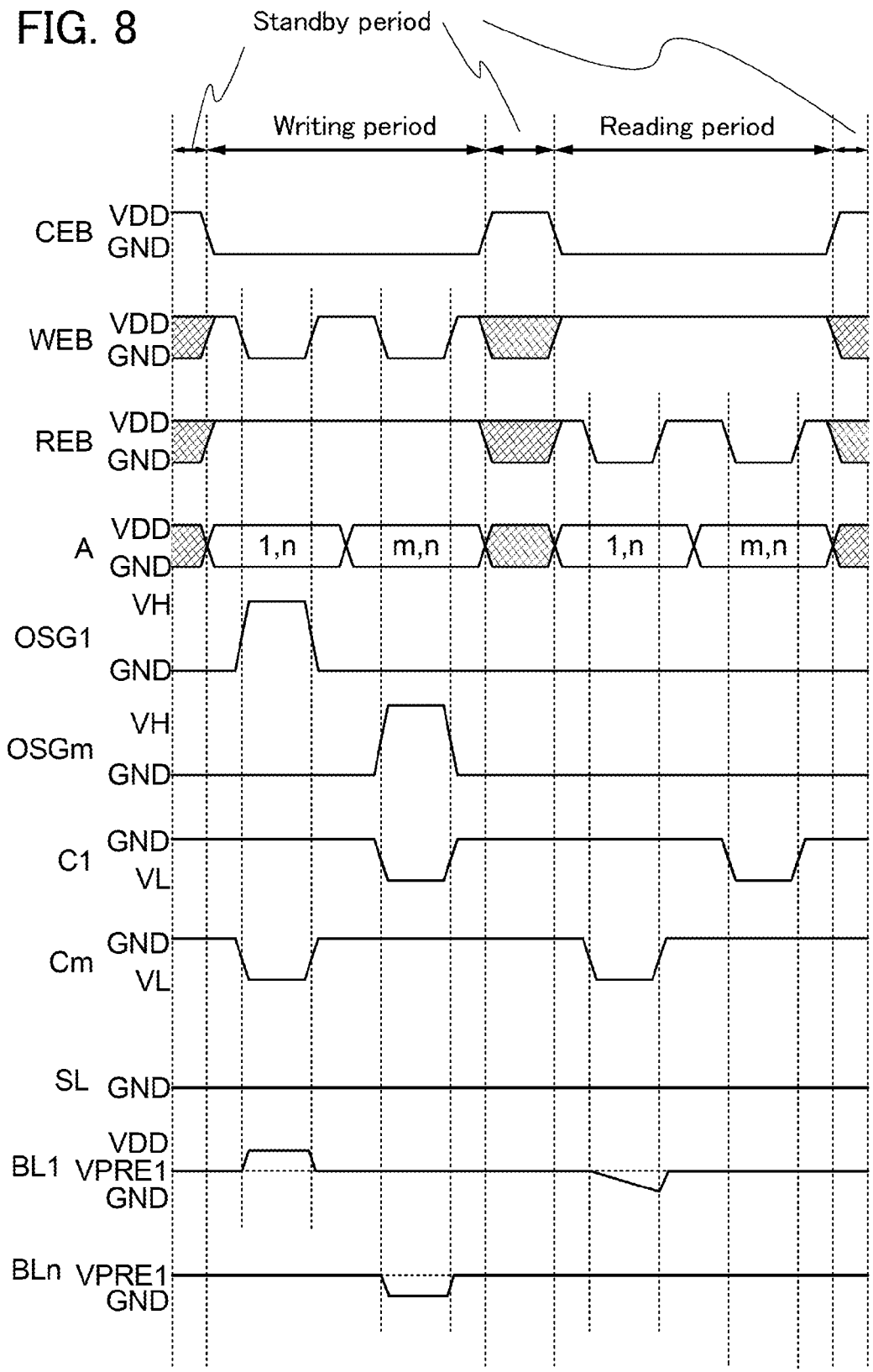
FIG. 8 is a timing chart.

The timing chart in FIG. 8 is described. FIG. 8 shows examples of standby, writing, holding, and reading operations in the case where the transistor 160 is an n-channel transistor.

The timing chart in FIG. 8 is different from the timing chart in FIG. 4 in the following points. Although in FIG. 4, the capacitor lines C are set to the power supply potential $V_{DD}$ in the writing period in a non-selected state and the reading period in a non-selected state, the capacitor lines C are set to $V_L$ in FIG. 8 in the writing period in a non-selected state and the reading period in a non-selected state. $V_L$ is lower than the ground potential GND by the power supply potential $V_{DD}$. In addition, in FIG. 4, in the reading period of the selected memory cell to which data "1" is written, the potential of the bit line BL is kept at VPRE1, and in the reading period of the selected memory cell to which data "0" is written, the potential of the bit line BL is decreased from VPRE1. On the other hand, in FIG. 8, in the reading period of the selected memory cell to which data "1" is written, the potential of the bit line BL is decreased from VPRE1, and in the reading period of the selected memory cell to which data "0" is written, the potential of the bit line BL is kept at VPRE1.

In the driving method according to the timing chart in FIG. 8, since the transistor 160 is an n-channel transistor, the operation speed of the transistor 160 can be increased, whereby reading at high speed is possible.

Figure 9:
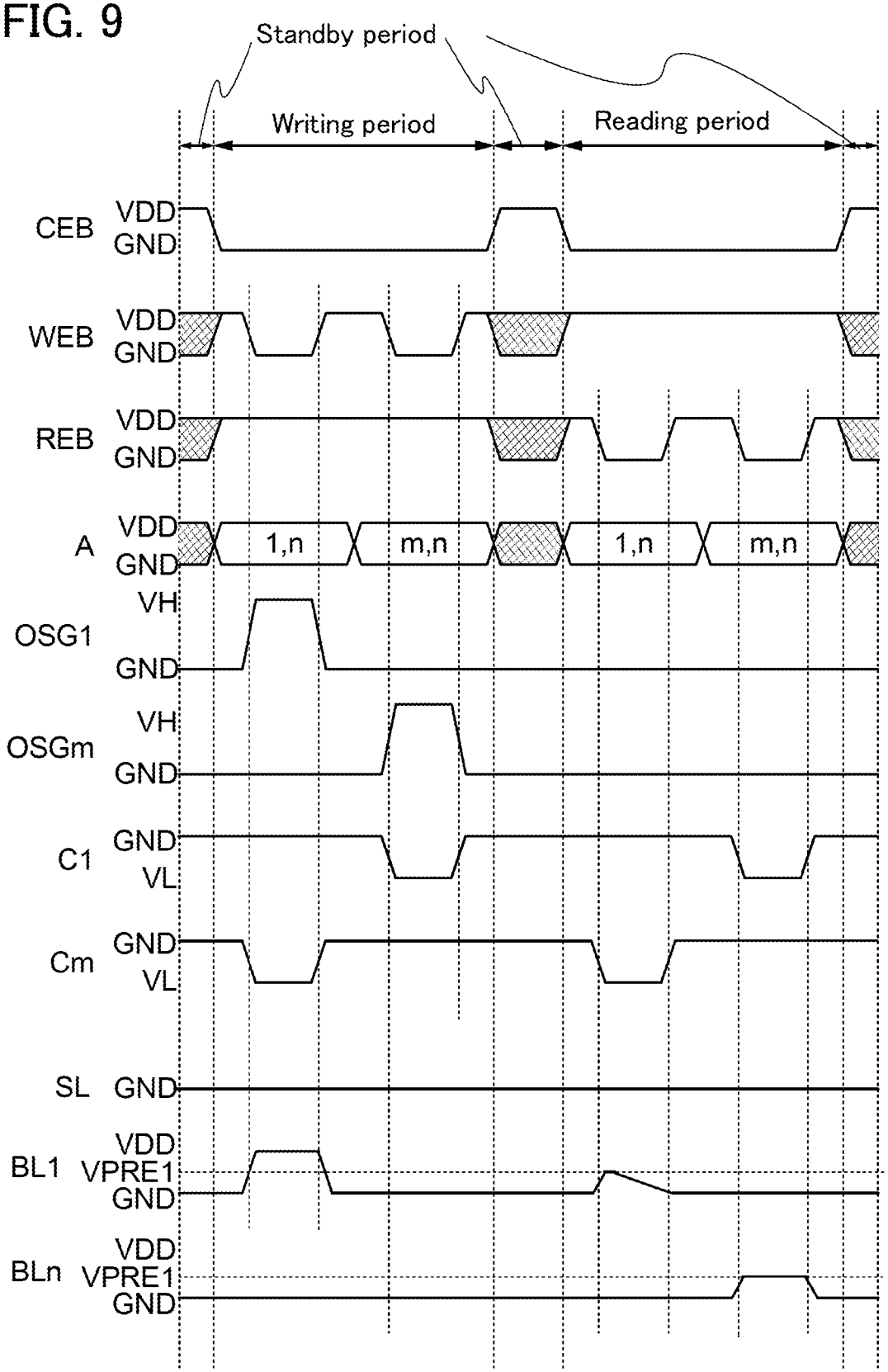
FIG. 9 is a timing chart.

The timing chart in FIG. 9 is described. The timing chart in FIG. 9 is different from the timing chart in FIG. 8 in the following points. Although in FIG. 8, the bit lines BL are precharged to VPRE1 in the standby period, the writing period in a non-selected state, and the reading period in a non-selected state, the bit lines BL are set to the ground potential GND in FIG. 9 in the standby period, the writing period in a non-selected state, and the reading period in a non-selected state. By setting the bit lines BL to ground potential GND in periods other than the reading period in a selected state as in FIG. 9, power consumption can be reduced.

Figure 10:
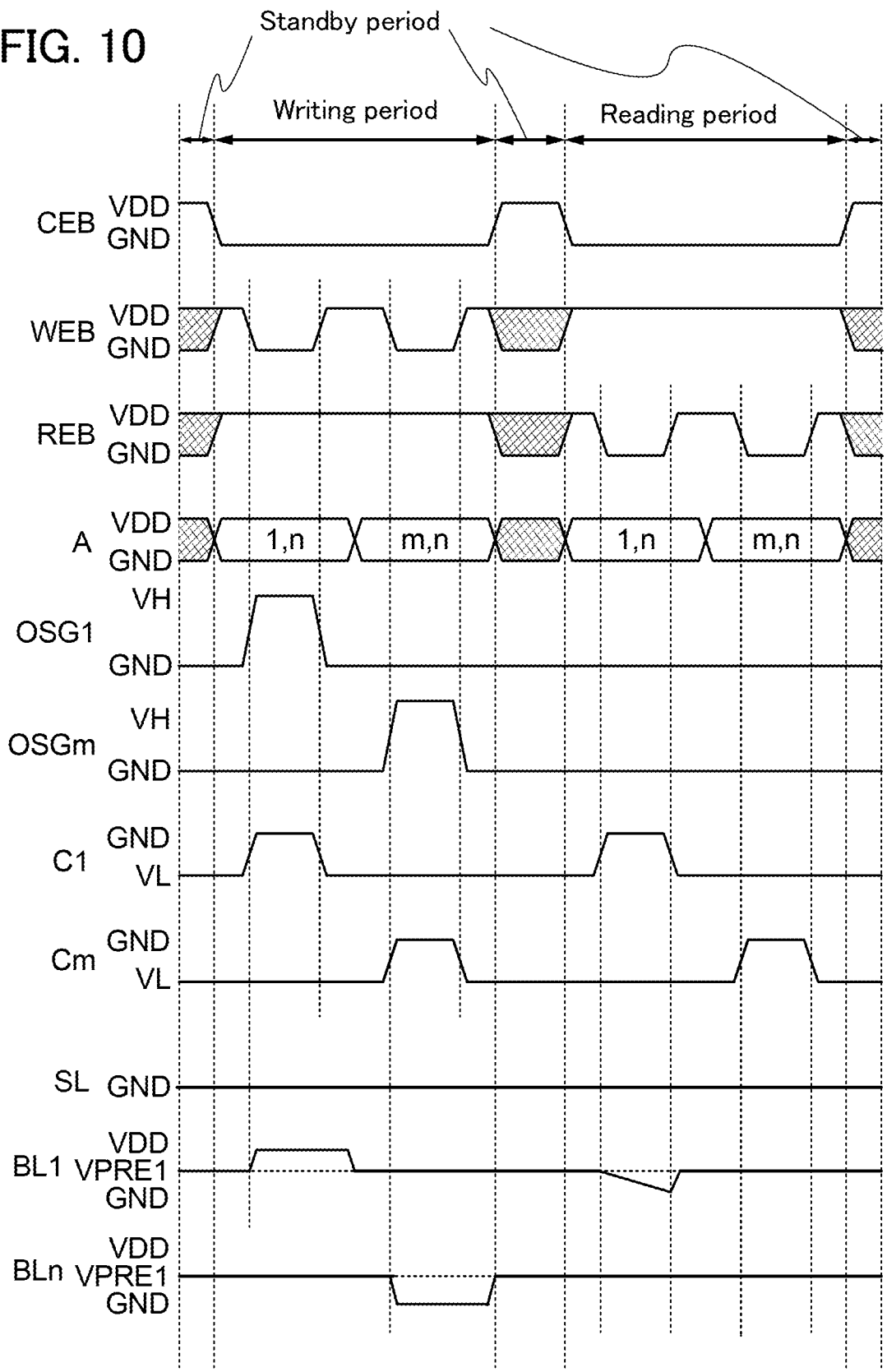
FIG. 10 is a timing chart.

The timing chart in FIG. 10 is described. The timing chart in FIG. 10 is different from the timing chart in FIG. 8 in the following points. Although in FIG. 8, the capacitor lines C are set to the ground potential GND in the standby period, the capacitor lines C are set to low potential $V_L$ in FIG. 10 in the standby period.

Figure 11:
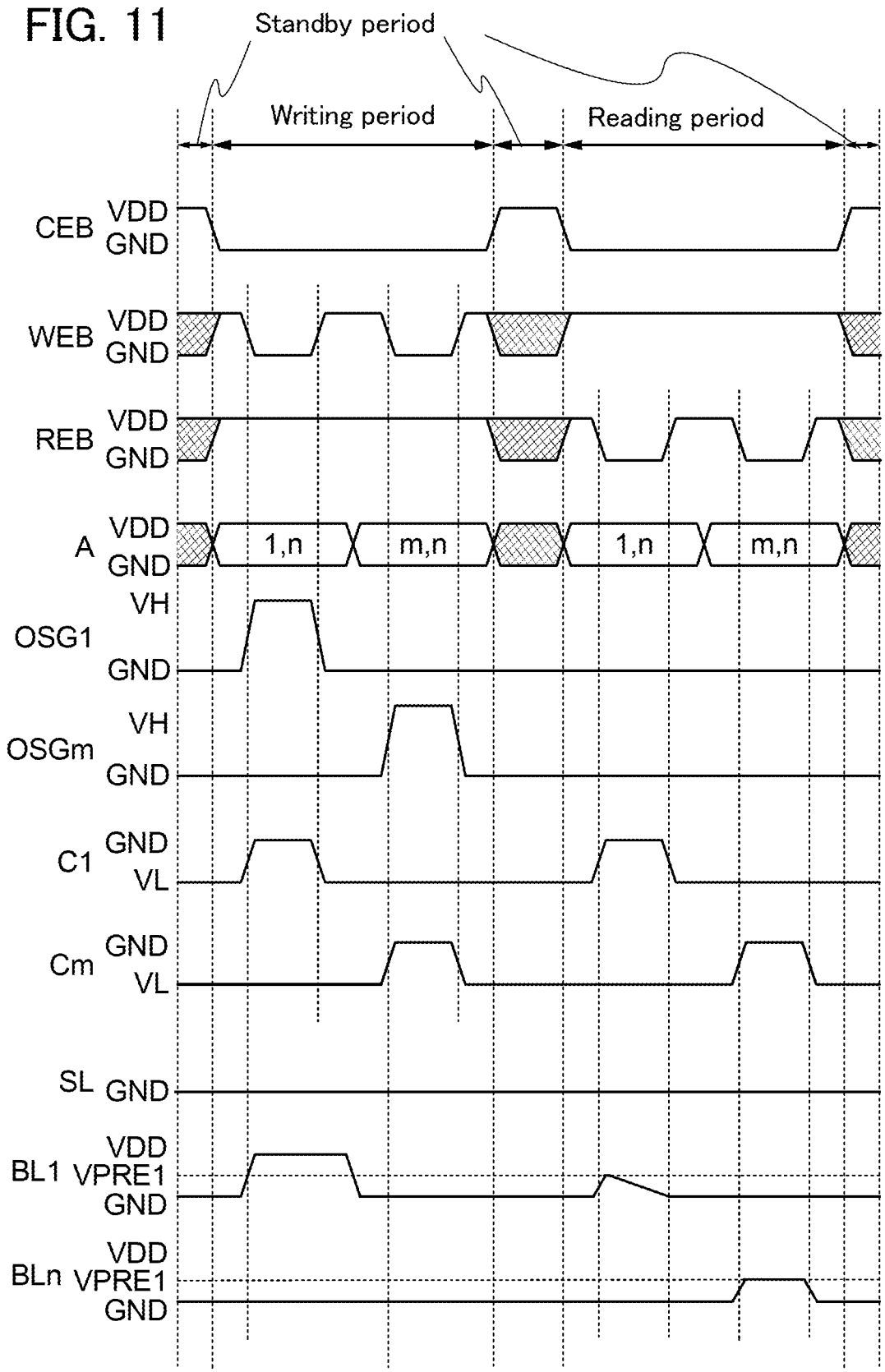
FIG. 11 is a timing chart.

The timing chart in FIG. 11 is described. The timing chart in FIG. 11 is different from the timing chart in FIG. 8 in the following points. Although in FIG. 8, the capacitor lines C are set to the ground potential GND in the standby period, the capacitor lines C are set to a low potential $V_L$ in FIG. 11 in the standby period. Further, although in FIG. 8, the bit lines BL are precharged to VPRE1 in the standby period, the writing period in a non-selected state, and the reading period in a non-selected state, the bit lines BL are set to the ground potential GND in FIG. 11 in the standby period, the writing period in a non-selected state, and the reading period in a non-selected state. By setting the capacitor lines C to the low potential $V_L$ in the standby period and the bit lines BL to the ground potential GND in periods other than the reading period in a selected state, power consumption can be reduced.

By using the methods for driving the semiconductor device according to the timing charts in FIG. 4, FIG. 5, FIG. 6, FIG. 7, FIG. 8, FIG. 9, FIG. 10, and FIG. 11, reading operation can be performed within a shorter time than in the driving method in which reading causes an increase in potentials of the source line SL and the bit line BL. In addition, even within a short time, the data "1" and the data "0" can be correctly read out.

Note that the operation method, the operation voltage, and the like relating to the semiconductor device of an embodiment of the disclosed invention are not limited to the above description and can be changed appropriately in accordance with an embodiment in which the operation of the semiconductor device is implemented.

The structures, methods, and the like described in this embodiment can be used in appropriate combination with any of the structures, methods, and the like described in the other embodiments.

(Embodiment 2)

In this embodiment, a structure and a manufacturing method of a semiconductor device according to an embodiment of the disclosed invention will be described with reference to FIGS. 12A and 12B, FIGS. 13A to 13G, FIGS. 14A to 14E, FIGS. 15A to 15D, FIGS. 16A to 16D, FIGS. 17A to 17C, FIGS. 18A to 18E, FIGS. 19A to 19C, FIGS. 20A to 20C, FIGS. 21A and 21B, FIG. 22, FIGS. 23A to 23C, FIGS. 24A to 24C, FIGS. 25A to 25C, FIGS. 26A and 26B, FIGS. 27A and 27B, FIG. 28, FIG. 29, and FIGS. 30A and 30B.

<Cross-Sectional Structure and Planar Structure of Semiconductor Device>

Figure 12A:
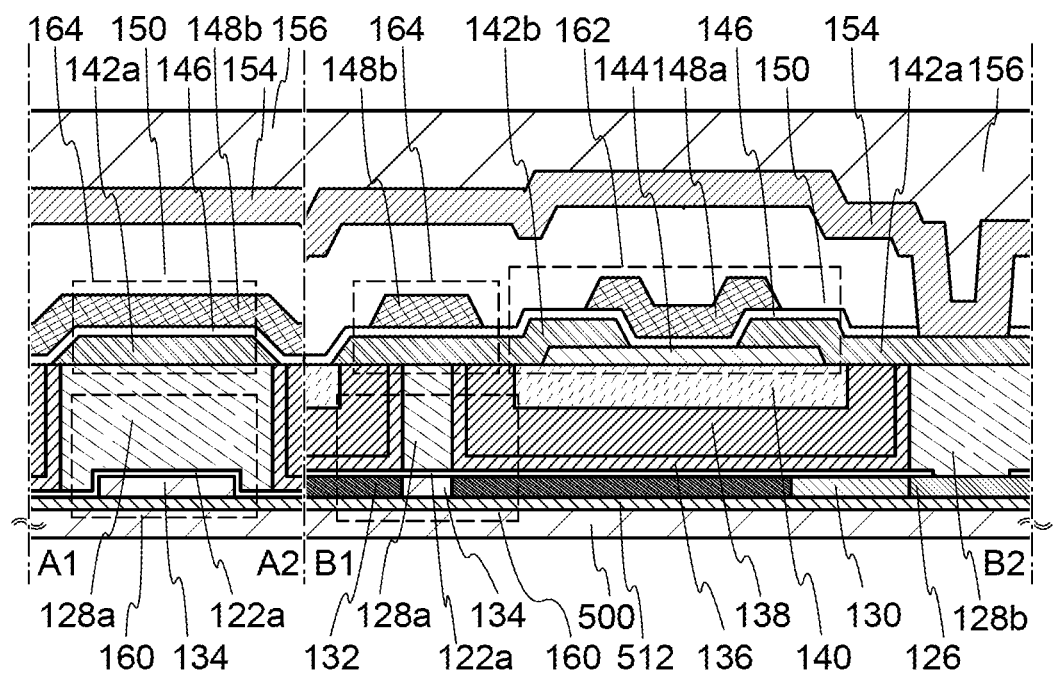
FIGS. 12A and 12B are a cross-sectional view and a plan view of a semiconductor device.
Figure 12B:
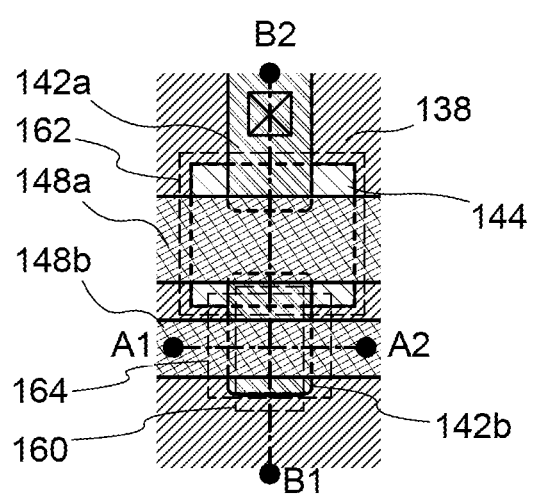

In FIGS. 12A and 12B, an example of the structure of the semiconductor device is illustrated. FIG. 12A is a cross-sectional view of the semiconductor device, and FIG. 12B is a top view of the semiconductor device. Here, FIG. 12A corresponds to a cross section taken along lines A1-A2 and B1-B2 of FIG. 12B. The semiconductor device illustrated in FIGS. 12A and 12B includes a transistor 160 including a first semiconductor material in a lower portion, and a transistor 162 including a second semiconductor material in an upper portion. Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, gallium arsenide, or the like and is preferably single crystal. Alternatively, an organic semiconductor material or the like may be used. A transistor including such a semiconductor material other than an oxide semiconductor can operate at high speed easily. On the other hand, a transistor including an oxide semiconductor can hold a potential for a long time owing to its characteristics. The semiconductor device in FIGS. 12A and 12B can be used as a memory cell.

Since the technical nature of the disclosed invention is to use a semiconductor material with which off-state current can be sufficiently decreased, such as an oxide semiconductor, in the transistor 162 so that data can be held, it is not necessary to limit a specific structure of the semiconductor device, such as a material of the semiconductor device or a structure of the semiconductor device, to those described here.

The transistor 160 in FIGS. 12A and 12B includes a channel formation region 134 provided in a semiconductor layer over a semiconductor substrate 500, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in the drawing may be referred to as a transistor for the sake of convenience. Further, in such a case, in description of an electric connection of a transistor, a source region and a source electrode may be collectively referred to as a source electrode, and a drain region and a drain electrode may be collectively referred to as a drain electrode. That is, in this specification, the term "source electrode" may include a source region.

Further, a conductive layer 128b is electrically connected to an impurity region 126 provided in the semiconductor layer over the semiconductor substrate 500. Here, the conductive layer 128b functions as a source electrode or a drain electrode of the transistor 160. In addition, an impurity region 130 is provided between the impurity region 132 and the impurity region 126. Further, an insulating layer 136, an insulating layer 138, and an insulating layer 140 are provided so as to cover the transistor 160. Note that in order to realize higher integration, the transistor 160 preferably has a structure without a sidewall insulating layer as illustrated in FIGS. 12A and 12B. On the other hand, when importance is put on the characteristics of the transistor 160, a sidewall insulating layer may be provided on a side surface of the gate electrode 128a, and the impurity region 132 may include a region with a different impurity concentration.

The transistor 162 in FIGS. 12A and 12B includes an oxide semiconductor layer 144 which is provided over the insulating layer 140 and the like; a source electrode (or a drain electrode) 142a and a drain electrode (or a source electrode) 142b which are electrically connected to the oxide semiconductor layer 144; a gate insulating layer 146 which covers the oxide semiconductor layer 144, the source electrode 142a, and the drain electrode 142b; and a gate electrode 148a which is provided over the gate insulating layer 146 so as to overlap with the oxide semiconductor layer 144.

An oxide semiconductor to be used for the oxide semiconductor layer 144 preferably contains at least indium (In) or zinc (Zn). In particular, In and Zn are preferably contained. A stabilizer for reducing a variation in electric characteristics among transistors including the oxide semiconductor is preferably contained in addition to In and Zn. As a stabilizer, at least one of gallium (Ga), tin (Sn), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide, a three-component metal oxide such as an In—Ga—Zn—O-based oxide (also referred to as IGZO), an In—Al—Zn—O-based oxide, an In—Sn—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide, a four-component metal oxide such as an In—Sn—Ga—Zn—O-based oxide, an In—Hf—Ga—Zn—O-based oxide, an In—Al—Ga—Zn—O-based oxide, an In—Sn—Al—Zn—O-based oxide, an In—Sn—Hf—Zn—O-based oxide, or an In—Hf—Al—Zn—O-based oxide can be used.

Note that here, for example, an "In—Ga—Zn—O-based oxide" means an oxide containing In, Ga, and Zn as its main component, in which there is no particular limitation on the ratio of In, Ga, and Zn. Alternatively, a material represented by $InMO_3(ZnO)_m$ (m>0) may be used as an oxide semiconductor. Note that M represents one or more metal elements selected from Ga, Fe, Mn, and Co. As the oxide semiconductor, a material expressed by $In_3SnO_5(ZnO)_n$ (n>0) may also be used.

For example, an In—Ga—Zn—O-based oxide with an atomic ratio of In:Ga:Zn=1:1:1, 2:2:1, or 3:1:2, or an oxide whose atomic ratio is in the neighborhood of the above atomic ratios can be used. Alternatively, an In—Sn—Zn—O-based oxide with an atomic ratio of In:Sn:Zn=1:1:1, 2:1:3, or 2:1:5, or an oxide whose atomic ratio is in the neighborhood of the above atomic ratios can be used.

However, the composition of the oxide semiconductor is not limited to those described above, and an oxide semiconductor having an appropriate composition may be used depending on necessary semiconductor characteristics (e.g., field-effect mobility or threshold voltage). In order to obtain the needed semiconductor characteristics, it is preferable that the carrier concentration, the impurity concentration, the defect density, the atomic ratio between a metal element and oxygen, the interatomic distance, the density, and the like be set to appropriate values.

For example, high field-effect mobility can be obtained relatively easily in the transistor in which the In—Sn—Zn—O-based oxide is used. However, the field-effect mobility can be increased by reducing the defect density in the bulk also in the case where the In—Ga—Zn—O-based oxide is used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor film is in a single crystal state, a polycrystalline (also referred to as polycrystal) state, an amorphous state, or the like.

Preferably, a c-axis aligned crystalline oxide semiconductor (CAAC-OS) film can be used as the oxide semiconductor film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of a c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor having a crystal portion like the CAAC-OS film, defects in the bulk can be further reduced and when the surface flatness of the oxide semiconductor is improved, mobility of higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, more preferably less than or equal to 0.1 nm.

Note that $R_a$ is obtained by expanding a centerline average roughness, which is defined by JIS B 0601, into three dimensions so as to be applicable to a surface. Moreover, $R_a$ can be expressed as an average value of the absolute values of deviations from a reference surface to a specific surface and is defined by the following Formula (1).

$$Ra = \frac{1}{S_0} \int_{y_1}^{y_2} \int_{x_1}^{x_2} |f(x, y) - Z_0| dx dy \quad (1)$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

An example of such a CAAC-OS film is an oxide which is formed into a film shape and has a triangular or hexagonal atomic arrangement when observed from the direction perpendicular to a surface of the film or a surface of a substrate where the CAAC-OS film is formed, and in which metal atoms are arranged in a layered manner or metal atoms and oxygen atoms (or nitrogen atoms) are arranged in a layered manner when a cross section of the film is observed.

An example of a crystal structure of the CAAC-OS film is described in detail with reference to FIGS. 18A to 18E, FIGS. 19A to 19C, FIGS. 20A to 20C, and FIGS. 21A and 21B. In FIGS. 18A to 18E, FIGS. 19A to 19C, FIGS. 20A to 20C, and FIGS. 21A and 21B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 18A to 18E, O surrounded by a circle represents a tetracoordinate O atom, and O surrounded by a double circle represents a tricoordinate O atom.

Figure 18A:
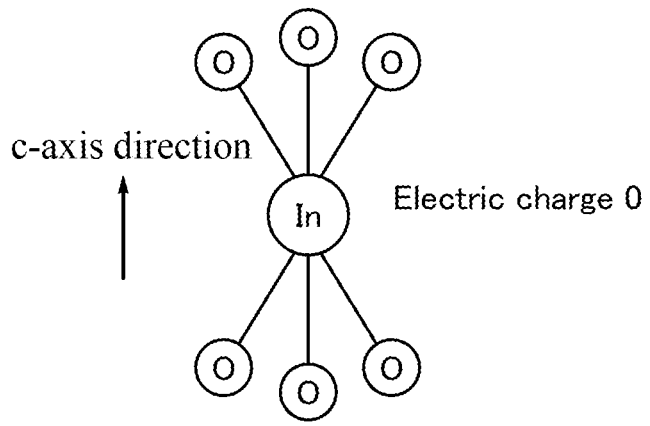
FIGS. 18A to 18E each illustrate a crystal structure of an oxide semiconductor.

FIG. 18A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 18A is actually an octahedral structure, but is illustrated as a planar structure for simplicity. Note that three tetracoordinate O atoms exist in each of an upper half and a lower half in FIG. 18A. In the small group illustrated in FIG. 18A, electric charge is 0.

Figure 18D:
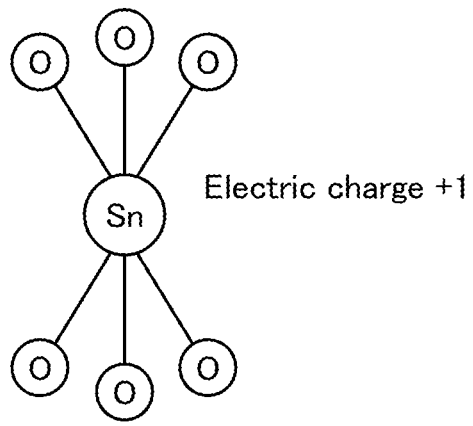
Figure 18B:
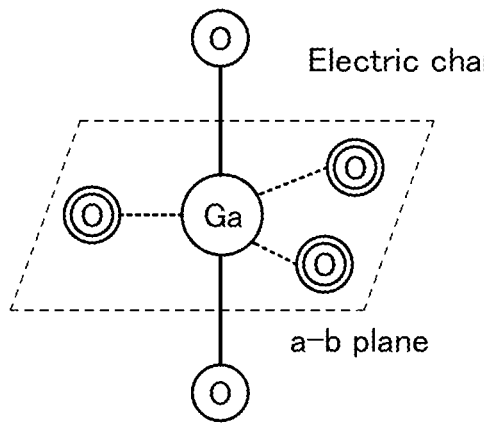

FIG. 18B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 18B. An In atom can also have the structure illustrated in FIG. 18B because an In atom can have five ligands. In the small group illustrated in FIG. 18B, electric charge is 0.

Figure 18E:
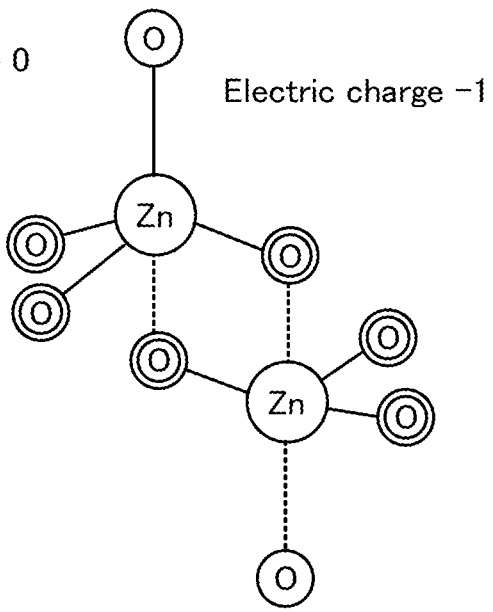
Figure 18C:
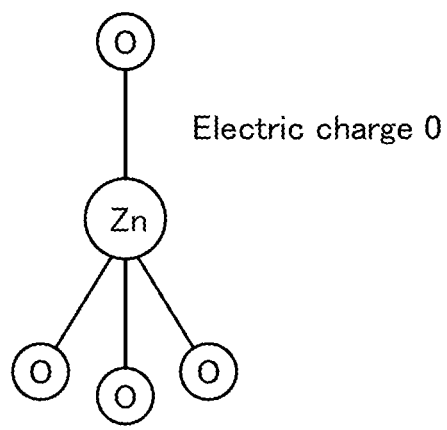

FIG. 18C illustrates a structure including one tetracoordinate Zn atom and four tetracoordinate O atoms proximate to the Zn atom. In FIG. 18C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 18C. In the small group illustrated in FIG. 18C, electric charge is 0.

FIG. 18D illustrates a structure including one hexacoordinate Sn atom and six tetracoordinate O atoms proximate to the Sn atom. In FIG. 18D, three tetracoordinate O atoms exist in each of an upper half and a lower half. In the small group illustrated in FIG. 18D, electric charge is +1.

FIG. 18E illustrates a small group including two Zn atoms. In FIG. 18E, one tetracoordinate O atom exists in each of an upper half and a lower half. In the small group illustrated in FIG. 18E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 18A each have three proximate In atoms in the downward direction, and the three O atoms in the lower half each have three proximate In atoms in the upward direction. The one O atom in the upper half with respect to the pentacoordinate Ga atom illustrated in FIG. 18B has one proximate Ga atom in the downward direction, and the one O atom in the lower half has one proximate Ga atom in the upward direction. The one O atom in the upper half with respect to the tetracoordinate Zn atom illustrated in FIG. 18C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason will be described hereinafter. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 19A illustrates a model of a medium group included in a layered structure of an In—Sn—Zn—O-based material. FIG. 19B illustrates a unit including three medium groups. Note that FIG. 19C illustrates an atomic arrangement in the case where the layered structure in FIG. 19B is observed from the c-axis direction.

In FIG. 19A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 19A, one tetracoordinate O atom existing in each of an upper half and a lower half with respect to an In atom is denoted by circled 1. FIG. 19A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 19A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 18E can be given. For example, with one small group including two Zn atoms, electric charge of one small group including a Sn atom can be cancelled, so that the total electric charge of the layered structure can be 0.

When the large group illustrated in FIG. 19B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, or a Sn—Al—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; a one-component metal oxide such as an In—O based oxide, a Sn—O-based oxide, or a Zn—O-based oxide; and the like.

Figure 20A:
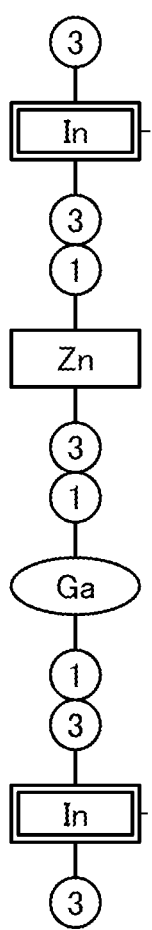
FIGS. 20A to 20C illustrate a crystal structure of an oxide semiconductor.

As an example, FIG. 20A illustrates a model of a medium group included in a layered structure of an In—Ga—Zn—O-based material.

In the medium group included in the layered structure of the In—Ga—Zn—O-based material in FIG. 20A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 20B:
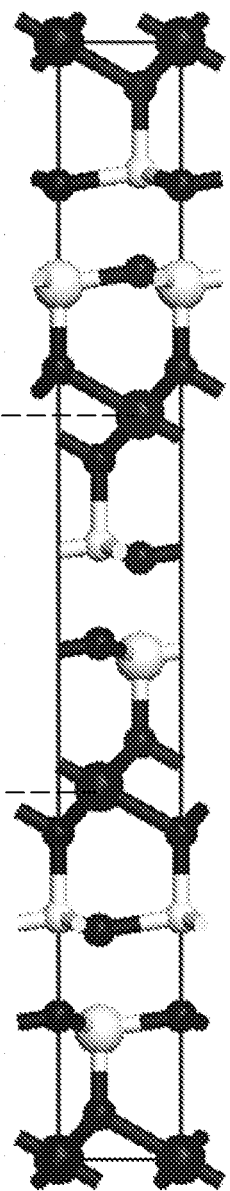
Figure 20C:
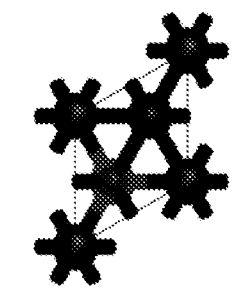

FIG. 20B illustrates a large group including three medium groups. Note that FIG. 20C illustrates an atomic arrangement in the case where the layered structure in FIG. 20B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 20A but also a medium group in which the arrangement of the In atom, the Ga atom, and the Zn atom is different from that in FIG. 20A.

Specifically, when the large group illustrated in FIG. 20B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 21A:
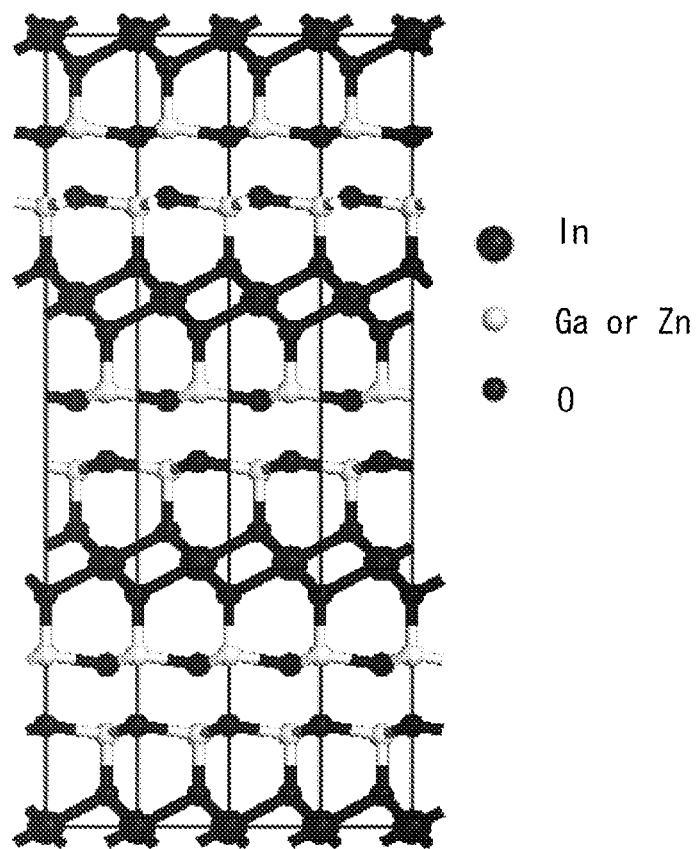
FIGS. 21A and 21B each illustrate a crystal structure of an oxide semiconductor.

In the case where n=1 ($InGaZnO_4$), a crystal structure illustrated in FIG. 21A can be obtained, for example. Note that in the crystal structure in FIG. 21A, since a Ga atom and an In atom each have five ligands as described in FIG. 18B, a structure in which Ga is replaced with In can be obtained.

Figure 21B:
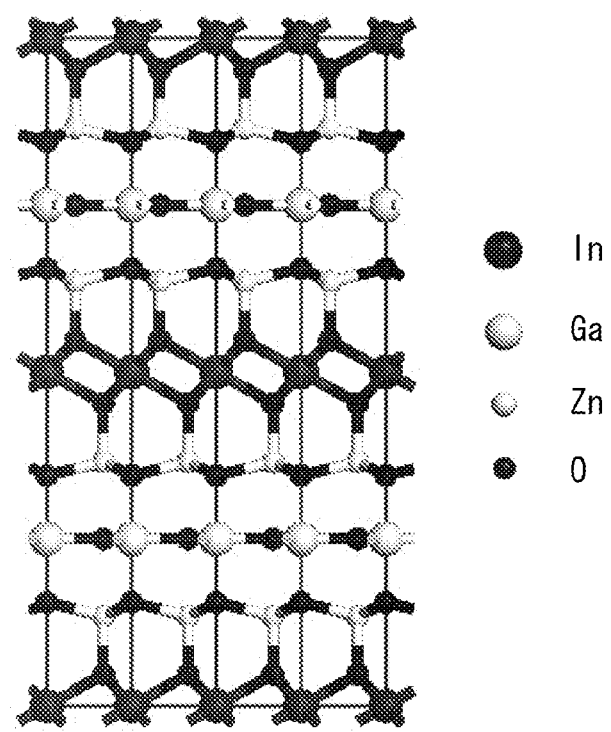

In the case where n=2 (InGaZn$_2$O$_5$), a crystal structure illustrated in FIG. 21B can be obtained, for example. Note that in the crystal structure in FIG. 21B, since a Ga atom and an In atom each have five ligands as described in FIG. 18B, a structure in which Ga is replaced with In can be obtained.

Further, the oxide semiconductor layer preferably has a hydrogen concentration of lower than or equal to $5 \times 10^{19}$ atoms/cm$^3$, more preferably lower than or equal to $5 \times 10^{18}$ atoms/cm$^3$.

For example, in the case of a transistor including an In—Ga—Zn—O-based oxide semiconductor, for example, the off-state current (per unit channel width (1 μm), here) at room temperature (25° C.) is lower than or equal to 100 zA (1 zA (zeptoampere) is $1 \times 10^{-21}$ A), preferably lower than or equal to 10 zA, more preferably lower than or equal to 1 zA, still more preferably lower than or equal to 100 yA.

Although the oxide semiconductor layer 144 which is processed to have an island shape is used in the transistor 162 of FIGS. 12A and 12B in order to suppress leakage current generated between elements due to miniaturization, the oxide semiconductor layer 144 is not necessarily processed to have an island shape. In the case where the oxide semiconductor layer is not processed to have an island shape, contamination of the oxide semiconductor layer 144 due to etching in the processing can be prevented.

A capacitor 164 in FIGS. 12A and 12B includes the drain electrode 142b, the gate insulating layer 146, and a conductive layer 148b. That is to say, the drain electrode 142b functions as one electrode of the capacitor 164, and the conductive layer 148b functions as the other electrode of the capacitor 164. With such a structure, capacitance can be sufficiently secured. Further, in the capacitor 164, insulating properties between the drain electrode 142b and the conductive layer 148b can be adequately secured when the oxide semiconductor layer 144 and the gate insulating layer 146 are stacked. Further alternatively, the capacitor 164 may be omitted in the case where a capacitor is not needed.

In this embodiment, the transistor 162 and the capacitor 164 are provided so as to overlap with the transistor 160 at least partly. By employing such a planar layout, high integration can be realized. For example, given that the minimum feature size is F, the area occupied by a memory cell can be 15 F$^2$ to 25 F$^2$.

An insulating layer 150 is provided over the transistor 162 and the capacitor 164. A wiring 154 is provided in an opening formed in the gate insulating layer 146 and the insulating layer 150. The wiring 154 connects one memory cell and another memory cell and corresponds to the bit line BL of the circuit diagram in FIGS. 2A and 2B. The wiring 154 is connected to the impurity region 126 through the source electrode 142a and the conductive layer 128b. The above structure allows a reduction in the number of wirings in comparison with a structure in which the source region or the drain region in the transistor 160 and the source electrode 142a in the transistor 162 are connected to different wirings. Thus, the integration degree of a semiconductor device can be increased.

By providing the conductive layer 128b, a position where the impurity region 126 and the source electrode 142a are connected and a position where the source electrode 142a and the wiring 154 are connected can overlap with each other. With such a planar layout, the element area can be prevented from increasing due to contact regions of the electrodes. In other words, the degree of integration of the semiconductor device can be increased.

<Manufacturing Method of SOI Substrate>

Next, an example of a method for manufacturing an SOI substrate used for manufacturing the above semiconductor device will be described with reference to FIGS. 13A to 13G.

Figure 13A:
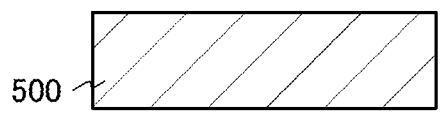
FIGS. 13A to 13G are cross-sectional views illustrating a manufacturing process of a semiconductor device.
Figure 13B:
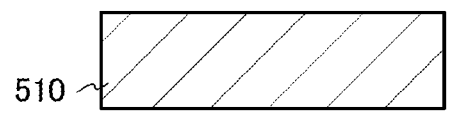

First, a semiconductor substrate 500 is prepared as a base substrate (see FIG. 13A). As the semiconductor substrate 500, a semiconductor substrate such as a single crystal silicon substrate or a single crystal germanium substrate can be used. Alternatively, as the semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Note that, in place of the semiconductor substrate 500, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. Further, a ceramic substrate which contains silicon nitride and aluminum nitride as its main components and whose coefficient of thermal expansion is close to that of silicon may be used.

A surface of the semiconductor substrate 500 is preferably cleaned in advance. Specifically, the semiconductor substrate 500 is preferably cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 510 is used as the bond substrate (see FIG. 13B). Note that although a substrate whose crystallinity is single crystal is used as the bond substrate here, the crystallinity of the bond substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

Figure 13C:
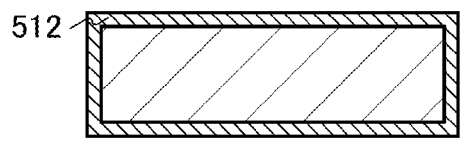

An oxide film 512 is formed on a surface of the single crystal semiconductor substrate 510 (see FIG. 13C). In view of removal of contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 512. Dilute hydrofluoric acid and ozone water may be discharged alternately for cleaning.

The oxide film 512 can be formed with, for example, a single layer or a stacked layer of a silicon oxide film, a silicon oxynitride film, and the like. As a method for forming the oxide film 512, a thermal oxidation method, a CVD method, a sputtering method, or the like can be used. When the oxide film 512 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 512 (here, a silicon oxide film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidizing atmosphere to which chlorine (Cl) is added, whereby the oxide film 512 can be formed through chlorine oxidation. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced.

Note that the halogen atoms contained in the oxide film 512 are not limited to chlorine atoms. A fluorine atom may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 13D:
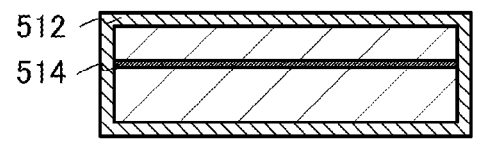
Figure 13E:
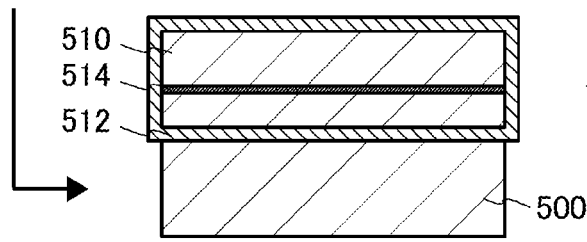

Next, ions are accelerated by an electric field, the single crystal semiconductor substrate 510 is irradiated with the ions, and the ions are added to the single crystal semiconductor substrate 510, so that an embrittled region 514 where the crystal structure is damaged is formed in the single crystal semiconductor substrate 510 at a predetermined depth (see FIG. 13D).

The depth at which the embrittled region 514 is formed can be adjusted by the kinetic energy, mass, electric charge, or incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be adjusted with the depth at which the ions are added. For example, the average penetration depth may be controlled such that the thickness of a single crystal semiconductor layer is approximately 10 nm to 500 nm, preferably, 50 nm to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation apparatus. In the ion-implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3$ be set higher than or equal to 50% (more preferably, higher than or equal to 80%) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation with hydrogen and helium in different steps, and surface roughness of a single crystal semiconductor layer to be formed later can be suppressed.

Note that heavy metal may also be added when the embrittled region 514 is formed with the ion doping apparatus; however, the ion irradiation is performed through the oxide film 512 containing halogen atoms, whereby contamination of the single crystal semiconductor substrate 510 due to the heavy metal can be prevented.

Then, the semiconductor substrate 500 and the single crystal semiconductor substrate 510 are disposed to face each other and are made to be closely attached to each other with the oxide film 512 therebetween. Thus, the semiconductor substrate 500 and the single crystal semiconductor substrate 510 can be bonded to each other (see FIG. 13E). Note that an oxide film or a nitride film may be formed on the surface of the semiconductor substrate 500 to which the single crystal semiconductor substrate 510 is attached.

When bonding is performed, it is preferable that a pressure of greater than or equal to 0.001 N/cm² and less than or equal to 100 N/cm², e.g., a pressure of greater than or equal to 1 N/cm² and less than or equal to 20 N/cm², be applied to one part of the semiconductor substrate 500 or one part of the single crystal semiconductor substrate 510. When the bonding surfaces are made close to each other and disposed in close contact with each other by applying a pressure, a bonding between the semiconductor substrate 500 and the oxide film 512 is generated at the part where the close contact is made, and from that part, the bonding spontaneously spreads to almost the entire area. This bonding is performed under the action of the Van der Waals force or hydrogen bonding and can be performed at room temperature.

Note that before the single crystal semiconductor substrate 510 and the semiconductor substrate 500 are bonded to each other, surfaces to be bonded to each other are preferably subjected to surface treatment. Surface treatment can improve the bonding strength at the interface between the single crystal semiconductor substrate 510 and the semiconductor substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature of higher than or equal to room temperature and lower than 400° C.). Bonding of the semiconductor substrate 500 and the oxide film 512 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the disclosed invention should not be construed as being limited to this example.

Figure 13F:
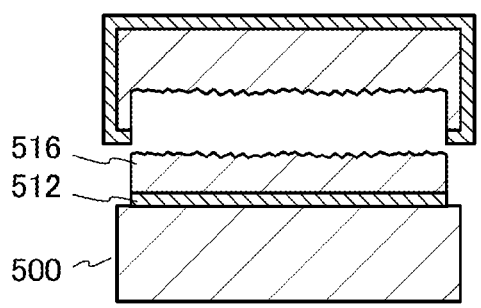

Next, heat treatment is performed and the single crystal semiconductor substrate 510 is separated at the embrittled region, whereby a single crystal semiconductor layer 516 is formed over the semiconductor substrate 500 with the oxide film 512 provided therebetween (see FIG. 13F).

Note that the temperature for heat treatment in the separation is desirably as low as possible. This is because as the temperature in the separation is low, generation of roughness on the surface of the single crystal semiconductor layer 516 can be suppressed. Specifically, the temperature for the heat treatment in the separation may be higher than or equal to 300° C. and lower than or equal to 600° C. and the heat treatment is more effective when the temperature is higher than or equal to 400° C. and lower than or equal to 500° C.

Note that after the single crystal semiconductor substrate 510 is separated, the single crystal semiconductor layer 516 may be subjected to heat treatment at higher than or equal to 500° C. so that concentration of hydrogen remaining in the single crystal semiconductor layer 516 is reduced.

Figure 13G:
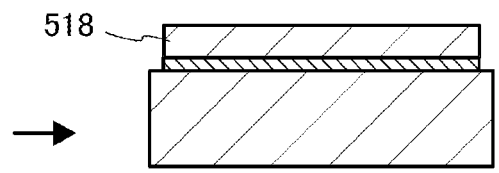

Then, the surface of the single crystal semiconductor layer 516 is irradiated with laser light, whereby a single crystal semiconductor layer 518 in which the flatness of the surface is improved and defects are reduced is formed (see FIG. 13G). Note that instead of the laser light irradiation treatment, heat treatment may be performed.

Although the irradiation treatment with the laser light is performed immediately after the heat treatment for separation of the single crystal semiconductor layer 516 in this embodiment, an embodiment of the present invention is not construed as being limited to this. Etching treatment may be performed after the heat treatment for separation of the single crystal semiconductor layer 516, to remove a region where there are many defects on the surface of the single crystal semiconductor layer 516, and then the laser light irradiation treatment may be performed. Alternatively, after the surface planarity of the single crystal semiconductor layer 516 is improved, the laser light irradiation treatment may be performed. Note that the etching treatment may be either wet etching or dry etching. Further, in this embodiment, a step of reducing the thickness of the single crystal semiconductor layer 516 may be performed after the laser light irradiation. In order to reduce the thickness of the single crystal semiconductor layer 516, any one of or both dry etching and wet etching may be employed.

Through the above steps, an SOI substrate including the single crystal semiconductor layer 518 with favorable characteristics can be obtained (see FIG. 13G).

<Example of Method for Manufacturing Semiconductor Device>

Next, a method for manufacturing a semiconductor device using the SOI substrate will be described with reference to FIGS. 14A to 14E, FIGS. 15A to 15D, FIGS. 16A to 16D, and FIGS. 17A to 17C.

<Method for Manufacturing Transistor in Lower Portion>

First, a manufacturing method of the transistor 160 in the lower portion will be described with reference to FIGS. 14A to 14E and FIGS. 15A to 15D. Note that FIGS. 14A to 14E and FIGS. 15A to 15D illustrate part of the SOI substrate formed by the method illustrated in FIGS. 13A to 13G, and are cross-sectional views illustrating the steps for manufacturing the transistor in the lower portion illustrated in FIG. 12A.

Figure 14A:
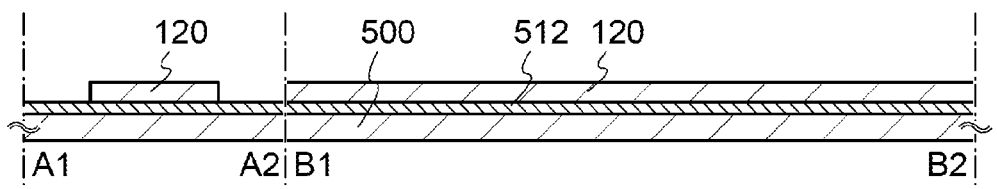
FIGS. 14A to 14E are cross-sectional views illustrating a manufacturing process of a semiconductor device.

First, the single crystal semiconductor layer 518 is patterned to have an island shape, so that a semiconductor layer 120 is formed (see FIG. 14A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 14B:
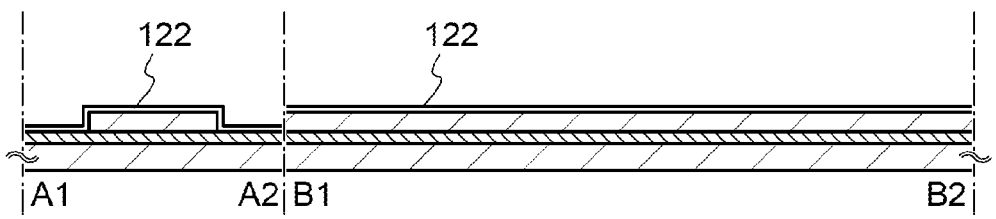

Next, an insulating layer 122 is formed so as to cover the semiconductor layer 120 (see FIG. 14B). The insulating layer 122 is to be a gate insulating layer later. The insulating layer 122 can be formed, for example, by performing heat treatment (thermal oxidation treatment, thermal nitridation treatment, or the like) on a surface of the semiconductor layer 120. Instead of heat treatment, high-density plasma treatment may be employed. The high-density plasma treatment can be performed using, for example, a mixed gas of any of a rare gas such as helium (He), argon (Ar), krypton (Kr), or xenon (Xe), oxygen, nitrogen oxide, ammonia, nitrogen, hydrogen, and the like. Needless to say, the insulating layer may be formed using a CVD method, a sputtering method, or the like. The insulating layer 122 preferably has a single-layer structure or a stacked structure including any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like. The thickness of the insulating layer 122 may be, for example, greater than or equal to 1 nm and less than or equal to 100 nm, preferably greater than or equal to 10 nm and less than or equal to 50 nm. Here, a single-layer insulating layer containing silicon oxide is formed using a plasma CVD method.

Figure 14C:
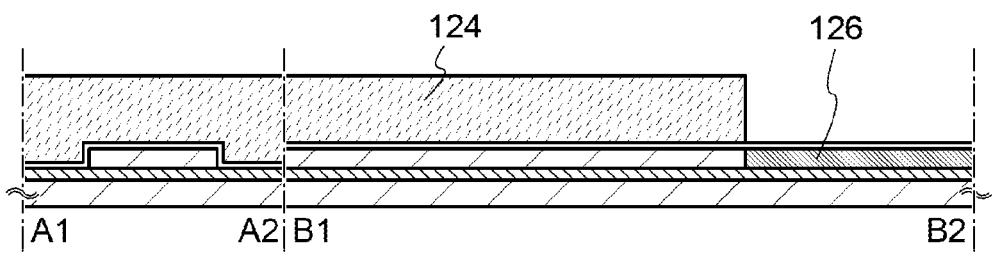

Next, a mask 124 is formed over the insulating layer 122 and an impurity element imparting one conductivity type is added to the semiconductor layer 120, so that the impurity region 126 is formed (see FIG. 14C). Note that the mask 124 is removed after the impurity element is added.

Figure 14D:
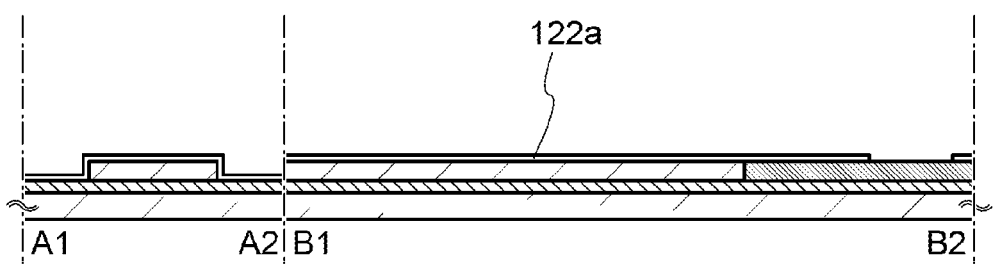

Next, a mask is formed over the insulating layer 122 and a region of the insulating layer 122 that overlaps with the impurity region 126 is partly removed, so that the gate insulating layer 122a is formed (see FIG. 14D). Part of the insulating layer 122 can be removed by etching such as wet etching or dry etching.

Figure 14E:
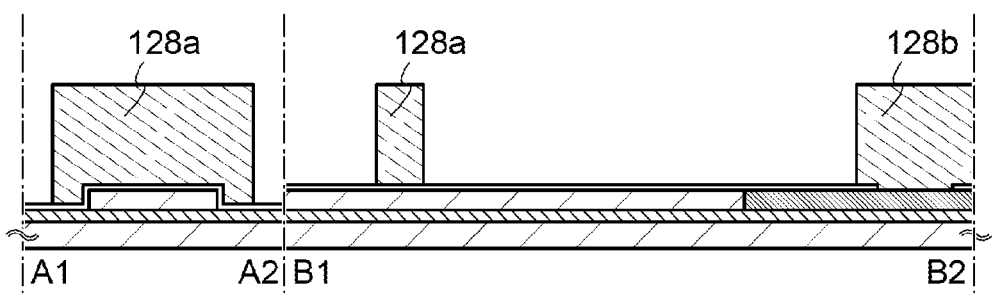

Next, a conductive layer for forming a gate electrode (including a wiring formed using the same layer as the gate electrode) is formed over the gate insulating layer 122a and is processed, so that the gate electrode 128a and the conductive layer 128b are formed (see FIG. 14E).

The conductive layer used for the gate electrode 128a and the conductive layer 128b can be formed using a metal material such as aluminum, copper, titanium, tantalum, or tungsten. The layer including a conductive material may be formed using a semiconductor material such as polycrystalline silicon. There is no particular limitation on the method for forming the layer containing a conductive material, and any of a variety of film formation methods such as an evaporation method, a CVD method, a sputtering method, and a spin coating method can be employed. The conductive layer may be processed by etching using a resist mask.

Figure 15A:
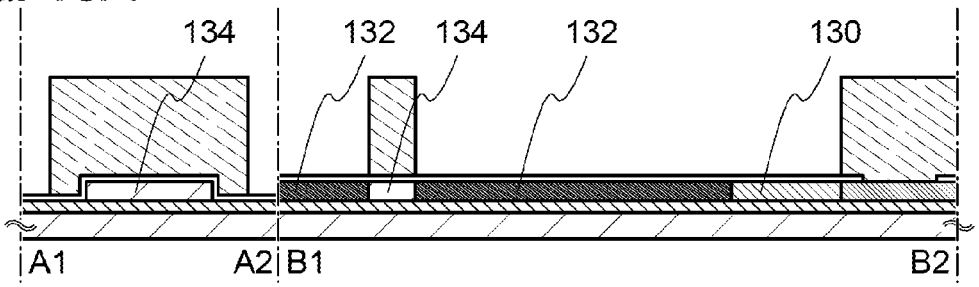
FIGS. 15A to 15D are cross-sectional views illustrating a manufacturing process of a semiconductor device.

Next, an impurity element imparting one conductivity type is added to the semiconductor layer with the use of the gate electrode 128a and the conductive layer 128b as masks, so that the channel formation region 134, the impurity region 132, and the impurity region 130 are formed (see FIG. 15A). Here, an impurity element such as boron (B) or aluminum (A)

is added in order to form a p-channel transistor. Here, the concentration of an impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130.

Figure 15B:
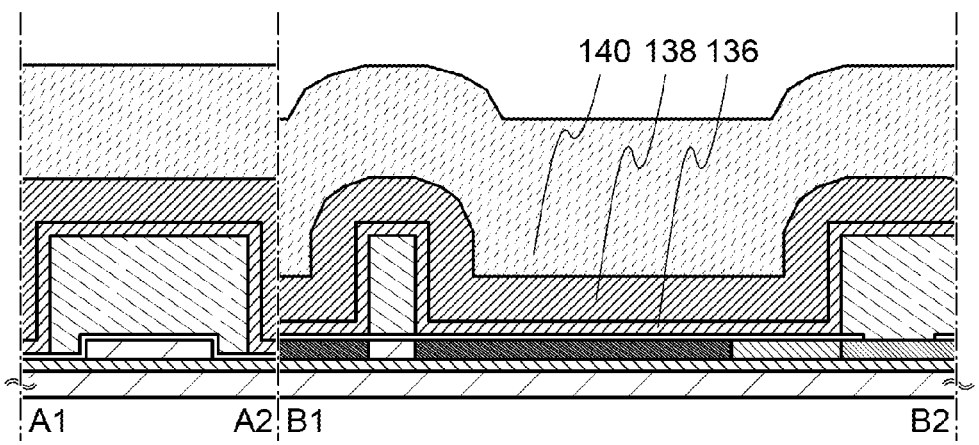

Next, the insulating layer 136, the insulating layer 138, and the insulating layer 140 are formed so as to cover the gate insulating layer 122a, the gate electrode 128a, and the conductive layer 128b (see FIG. 15B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials. Since the porous insulating layer has a low dielectric constant as compared to a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. A stacked structure of the insulating layer 136, the insulating layer 138, and the insulating layer 140 is employed here; however, an embodiment of the disclosed invention is not limited to this. A single-layer structure, a stacked-layer structure of two layers, or a stacked-layer structure of four or more layers may also be used.

Figure 15C:
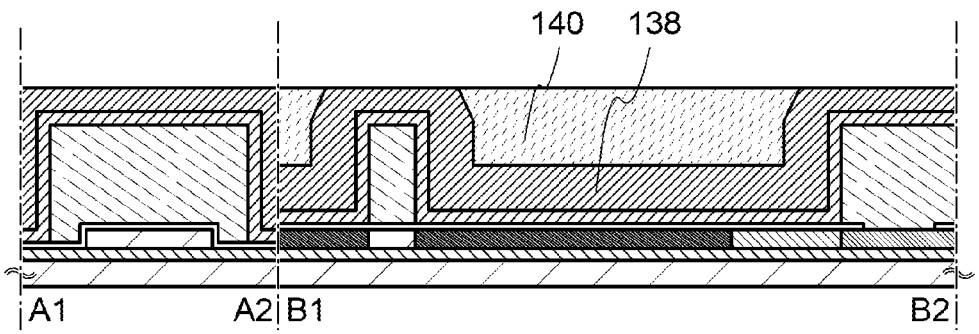

Next, the insulating layer 138 and the insulating layer 140 are subjected to chemical mechanical polishing (CMP) treatment or etching treatment, so that the insulating layer 138 and the insulating layer 140 are planarized (see FIG. 15C). Here, CMP treatment is performed until the insulating layer 138 is partly exposed. In the case where silicon nitride oxide is used for the insulating layer 138 and silicon oxide is used for the insulating layer 140, the insulating layer 138 functions as an etching stopper.

Figure 15D:
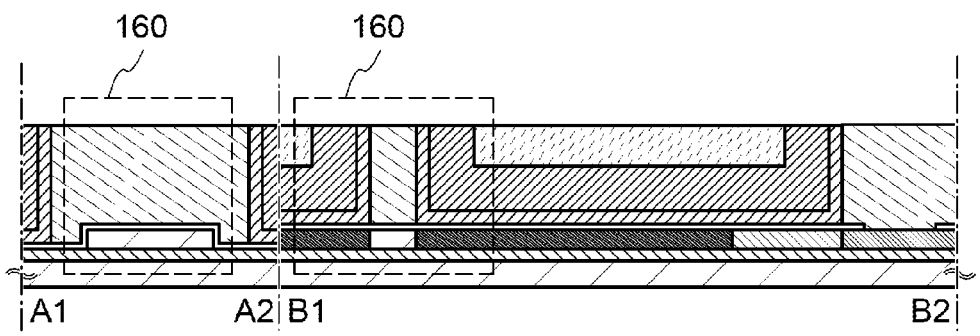

Next, the insulating layer 138 and the insulating layer 140 are subjected to CMP treatment or etching treatment, so that upper surfaces of the gate electrode 128a and the conductive layer 128b are exposed (see FIG. 15D). Here, etching is performed until the gate electrode 128a and the conductive layer 128b are partly exposed. For the etching treatment, dry etching is preferably performed, but wet etching may be performed. In the step of partly exposing the gate electrode 128a and the conductive layer 128b, in order to improve the characteristics of the transistor 162 which is formed later, the surfaces of the insulating layer 136, the insulating layer 138, and the insulating layer 140 are preferably flattened as much as possible.

Through the above steps, the transistor 160 in the lower portion can be formed (see FIG. 15D).

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly integrated semiconductor device can be provided.

<Method for Manufacturing Transistor in Upper Portion>

Next, a method for manufacturing the transistor 162 in the upper portion will be described with reference to FIGS. 16A to 16D and FIGS. 17A to 17C.

Here, it is preferable that films be formed so that impurities such as hydrogen and water that adversely affect the characteristics of the transistor be not contained in all the films. For example, impurities adhering to a surface of the semiconductor substrate 500 or the like are taken in the films. It is thus preferable that impurities adhering to the surface of the semiconductor substrate 500 or the like be removed by performing heat treatment in a reduced-pressure atmosphere or an oxidizing atmosphere before formation of each film. In addition, since impurities due to a deposition chamber become a problem, the impurities are also preferably removed in advance. Specifically, it is preferable that the deposition chamber be baked in advance to degas the deposition chamber. Further, it is preferable that dummy film formation be performed on 100 dummy substrates each for about 5 minutes before forming each film. Here, the dummy film formation refers to film formation on a dummy substrate by sputtering or the like, in which a film is deposited on the dummy substrate and the inner wall of a deposition chamber so that impurities in the deposition chamber and an adsorbate on the inner wall of the deposition chamber are confined in the film. For the dummy substrate, a material from which a less amount of gas is released is preferably used, and for example, a material which is similar to that of the semiconductor substrate 500 may be used. By performing dummy film formation, impurity concentration in the film to be formed can be reduced.

Since the purity of a gas used for film formation also influences the impurity concentration in the film, the purity of the gas is preferably as high as possible. When a sputtering method is employed, for example, an argon gas having a purity of 9N (dew point: −121° C., water concentration: 0.1 ppb, hydrogen concentration: 0.5 ppb) and an oxygen gas having a purity of 8N (dew point: −112° C., water concentration: 1 ppb, hydrogen concentration: 1 ppb) can be used.

Figure 16A:
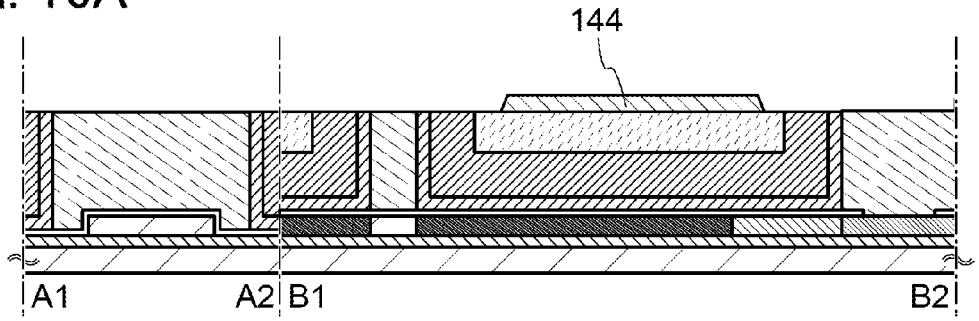
FIGS. 16A to 16D are cross-sectional views illustrating a manufacturing process of a semiconductor device.

First, an oxide semiconductor layer is formed over the gate electrode 128a, the conductive layer 128b, the insulating layer 136, the insulating layer 138, the insulating layer 140, and the like and is processed, so that the oxide semiconductor layer 144 is formed (see FIG. 16A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, a CVD method such as a plasma CVD method, or the like.

The oxide semiconductor layer can be formed by a sputtering method, an evaporation method, a PCVD method, a PLD method, an ALD method, an MBE method, or the like. The oxide semiconductor layer 144 is preferably formed by a sputtering method in an oxygen gas atmosphere at a substrate heating temperature of higher than or equal to 100° C. and lower than or equal to 600° C., preferably higher than or equal to 150° C. and lower than or equal to 550° C., more preferably higher than or equal to 200° C. to and lower than or equal to 500° C. The thickness of the oxide semiconductor layer 144 is greater than or equal to 1 nm and less than or equal to 40 nm, preferably greater than or equal to 3 nm and less than or equal to 20 nm. As the substrate heating temperature at the time of film formation is higher, the impurity concentration in the obtained oxide semiconductor layer 144 is lower. Further, the atomic arrangement in the oxide semiconductor layer 144 is ordered, and the density thereof is increased, so that a polycrystalline film or a CAAC-OS film is likely to be formed.

Furthermore, also when an oxygen gas atmosphere is employed for the film formation, an unnecessary atom such as a rare gas atom is not contained in the oxide semiconductor layer 144, so that a polycrystalline film or a CAAC-OS film is likely to be formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. Note that as the oxide semiconductor layer 144 is thinner, a short-channel effect of a transistor is reduced. However, when the oxide semiconductor layer 144 is too thin, the oxide semiconductor layer 144 is significantly influenced by interface scattering; thus, the field-effect mobility might be decreased.

In the case of forming the oxide semiconductor layer 144 using an In—Ga—Zn—O-based oxide by a sputtering method, it is preferable to use an In—Ga—Zn—O-based target having an atomic ratio of In:Ga:Zn=1:1:1, 4:2:3, 3:1:2, 1:1:2, 2:1:3, or 3:1:4. When the oxide semiconductor layer 144 is formed using an In—Ga—Zn—O-based target having the aforementioned atomic ratio, a polycrystalline film or a CAAC-OS film is likely to be formed.

In the case of forming the oxide semiconductor layer 144 using an In—Sn—Zn—O-based oxide by a sputtering method, it is preferable to use an In—Sn—Zn—O-based target having an atomic ratio of In:Sn:Zn=1:1:1, 2:1:3, 1:2:2, or 20:45:35. When the oxide semiconductor layer 144 is formed using an In—Sn—Zn—O-based target having the aforementioned atomic ratio, a polycrystalline film or a CAAC-OS is likely to be formed.

Next, heat treatment is performed. The heat treatment is performed in a reduced pressure atmosphere, an inert atmosphere, or an oxidizing atmosphere. By the heat treatment, the impurity concentration in the oxide semiconductor layer 144 can be reduced.

The heat treatment is preferably performed in such a manner that after heat treatment is performed in a reduced pressure atmosphere or an inert atmosphere, the atmosphere is switched to an oxidizing atmosphere with the temperature maintained and heat treatment is further performed. By the heat treatment in a reduced pressure atmosphere or an inert gas atmosphere, the impurity concentration in the oxide semiconductor layer 144 can be reduced; however, at the same time, oxygen vacancies are generated. The oxygen vacancies generated at this time can be reduced by the heat treatment in an oxidizing atmosphere.

By performing heat treatment in addition to the substrate heating at the time of film formation on the oxide semiconductor layer 144, the impurity levels in the film can be significantly reduced. Accordingly, the field-effect mobility of the transistor can be increased so as to be close to ideal field-effect mobility to be described later.

Next, the substrate is preferably subjected to heat treatment. The heat treatment is performed, so that the proportion of a crystal region with respect to an amorphous region in the oxide semiconductor layer can be increased. The heat treatment may be performed at a temperature of higher than or equal to 200° C. and lower than the strain point of the substrate, and is preferably performed at a temperature of higher than or equal to 250° C. and lower than or equal to 450° C. The heat treatment is performed in an oxidizing atmosphere, an inert atmosphere, or a reduced-pressure atmosphere (lower than or equal to 10 Pa). The treatment time is 3 minutes to 24 hours. As the treatment time is increased, the proportion of a crystal region with respect to that of an amorphous region in the oxide semiconductor layer can be increased. Heat treatment for longer than 24 hours is not preferable because the productivity is low.

The oxidizing atmosphere is an atmosphere containing an oxidizing gas. The oxidizing gas is oxygen, ozone, nitrous oxide, or the like, and it is preferable that the oxidizing gas does not contain water, hydrogen, and the like. For example, the purity of oxygen, ozone, or nitrous oxide to be introduced to a heat treatment apparatus is greater than or equal to 8N (99.999999%), preferably greater than or equal to 9N (99.9999999%). As the oxidizing atmosphere, an oxidizing gas and an inert gas may be mixed to be used. In that case, the mixture contains an oxidizing gas at a concentration of higher than or equal to 10 ppm.

Further, an inert atmosphere refers to an atmosphere containing an inert gas such as nitrogen or a rare gas (e.g., helium, neon, argon, krypton, or xenon) as the main component. Specifically, the concentration of a reactive gas such as an oxidizing gas is lower than 10 ppm.

A rapid thermal annealing (RTA) apparatus can be used for the heat treatment. With the use of RTA, only for a short time, the heat treatment can be performed at a temperature of higher than or equal to the strain point of the substrate. Consequently, time taken to form an oxide semiconductor layer in which the proportion of a crystal region is higher than that of an amorphous region can be shortened.

As the target of an In—Ga—Zn—O-based oxide, a target having a composition of In:Ga:Zn=2:2:1 [atomic ratio] can be used, for example. Note that it is not necessary to limit the material and the composition of the target to the above. For example, a target having a composition of In:Ga:Zn=1:1:1 [atomic ratio] can be used.

Note that electric characteristics of a transistor which uses an amorphous In—Sn—Zn—O-based oxide in an active layer have been reported, where a field-effect mobility of 30 $cm^2/Vs$ has been achieved (Eri Fukumoto, Toshiaki Arai, Narihiro Morosawa, Kazuhiko Tokunaga, Yasuhiro Terai, Takashige Fujimori, and Tatsuya Sasaoka, "High Mobility Oxide Semiconductor TFT for Circuit Integration of AM-OLED", IDW'10, pp. 631-634).

As the oxide semiconductor layer, a thin film including a material expressed as the chemical formula, $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like.

Figure 16B:
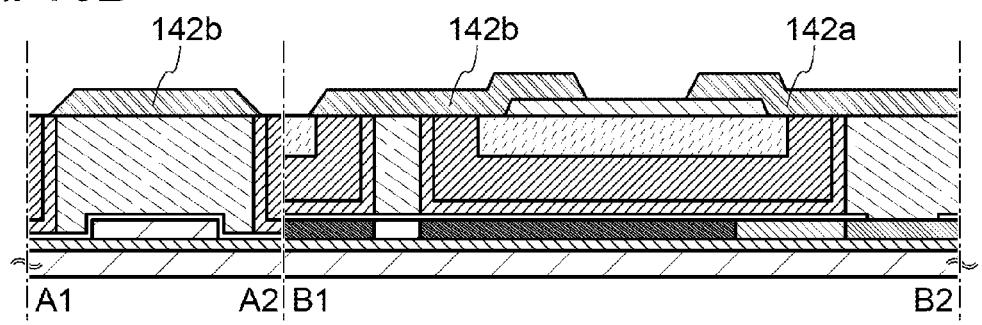

Next, a conductive layer for forming a source electrode and a drain electrode (including a wiring formed in the same layer as the source electrode and the drain electrode) is formed over the oxide semiconductor layer 144 and the like and is processed, so that the source electrode 142a and the drain electrodes 142b are formed (see FIG. 16B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage that it can be easily processed into the source electrode 142a and the drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used.

The conductive layer is preferably etched so that end portions of the source electrode 142a and the drain electrode 142b that are to be formed are tapered. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by a distance between lower edge portions of the source electrode 142a and the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Figure 16C:
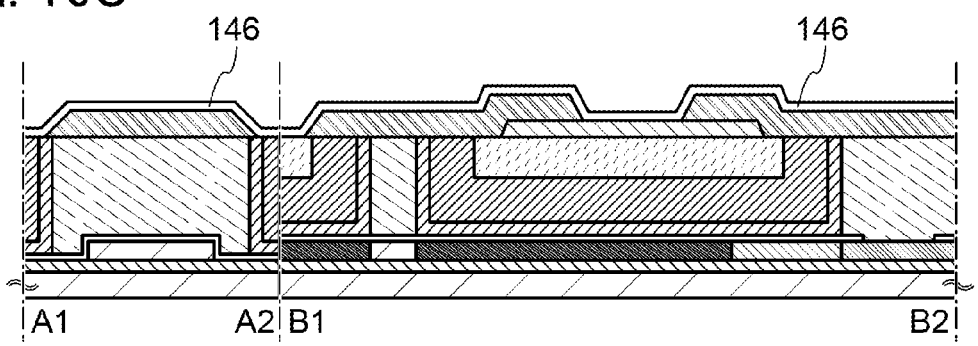

Next, the gate insulating layer 146 is formed so as to cover the source electrode 142a and the drain electrode 142b and to be in contact with part of the oxide semiconductor layer 144 (see FIG. 16C).

The gate insulating layer 146 can be formed by a CVD method, a sputtering method, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked-layer structure in which these materials are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as in the above description, a problem of gate leakage due to a tunnel effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using a high-k material for the gate insulating layer 146, electric characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

Figure 16D:
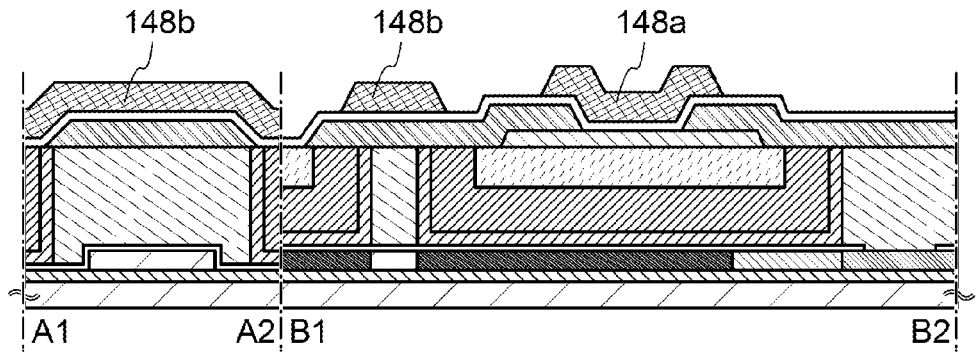

Next, a conductive layer for forming a gate electrode (as well as a wiring formed in the same layer as the gate electrode) is formed and is processed, so that the gate electrode 148a and the conductive layer 148b are formed (see FIG. 16D).

The gate electrode 148a and the conductive layer 148b can be formed using a metal material such as molybdenum, titanium, tantalum, tungsten, aluminum, copper, neodymium, or scandium, or an alloy material containing any of these materials as a main component. Note that the gate electrode 148a and the conductive layer 148b may have a single-layer structure or a stacked-layer structure.

Figure 17A:
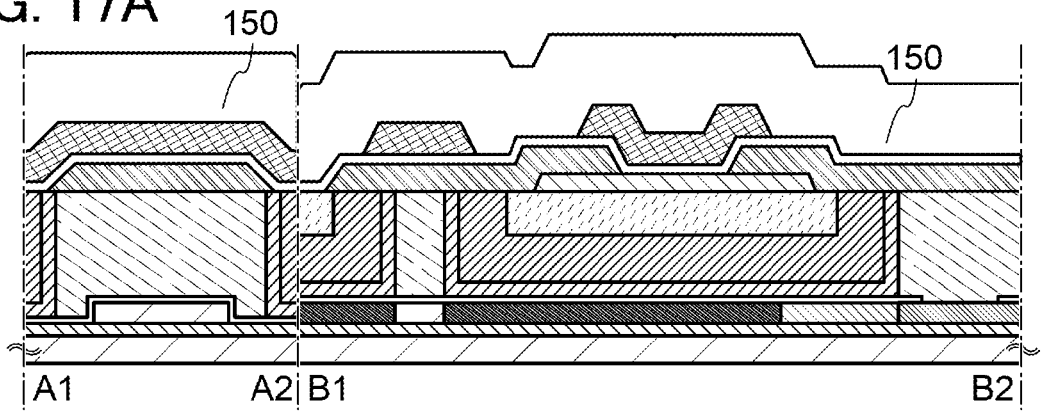
FIGS. 17A to 17C are cross-sectional views illustrating a manufacturing process of a semiconductor device.
Figure 17B:
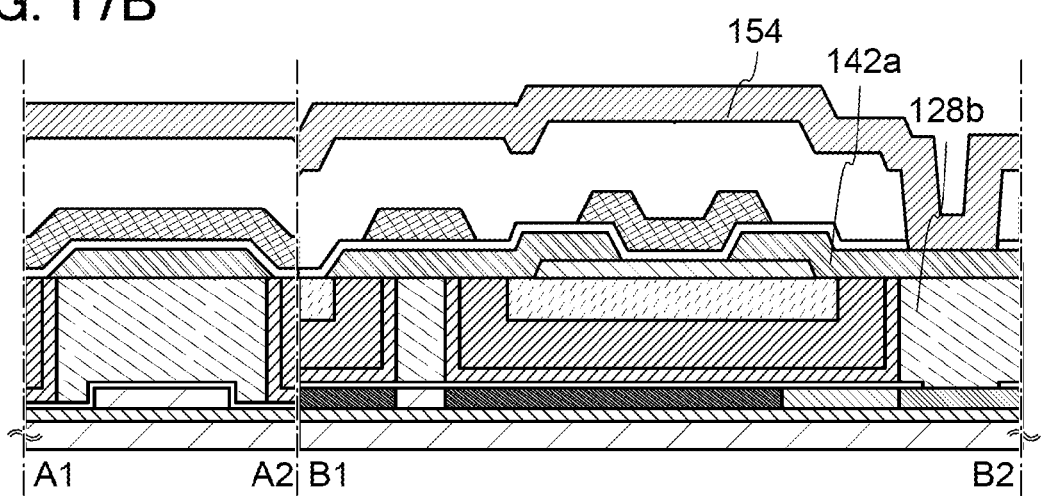

Then, the insulating layer 150 is formed over the gate insulating layer 146, the gate electrode 148a, and the conductive layer 148b (see FIG. 17A). The insulating layer 150 can be formed by a PVD method, a CVD method, or the like. The insulating layer 150 can be formed using a material containing an inorganic insulating material such as silicon oxide, silicon oxynitride, silicon nitride, hafnium oxide, gallium oxide, or aluminum oxide. Note that for the insulating layer 150, a material with a low dielectric constant is preferably used or a structure with a low dielectric constant (e.g., a porous structure) is preferably employed. This is because by reducing the dielectric constant of the insulating layer 150, capacitance between wirings and electrodes can be reduced, which will increase operation speed. Note that although the insulating layer 150 has a single-layer structure in this embodiment, an embodiment of the disclosed invention is not limited to this. The insulating layer 150 may have a stacked structure including two or more layers.

Next, an opening reaching the source electrode 142a is formed in the gate insulating layer 146 and the insulating layer 150. Then, the wiring 154 connected to the source electrode 142a is formed over the insulating layer 150 (see FIG. 17B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

Specifically, it is possible to employ a method, for example, in which a thin titanium film (about 5 nm) is formed by a PVD method in a region including the opening of the insulating layer 150, and then, an aluminum film is formed so as to be embedded in the opening. Here, the titanium film formed by a PVD method functions to reduce an oxide film (e.g., a natural oxide film) at a surface over which the titanium film is formed, and to decrease the contact resistance with a lower electrode or the like (here, the source electrode 142a). In addition, hillock of the aluminum film can be prevented. A copper film may be formed by a plating method after the formation of the barrier film of titanium, titanium nitride, or the like.

The opening formed in the insulating layer 150 is preferably formed in a region overlapping with the conductive layer 128b. With the opening in such a region, the element area can be prevented from increasing due to contact regions of the electrodes.

Here, the case where a position where the impurity region 126 and the source electrode 142a are connected to each other and a position where the source electrode 142a and the wiring 154 are connected to each other overlap with each other without using the conductive layer 128b will be described. In this case, an opening (also referred to as a contact in a lower portion) is formed in the insulating layer 136, the insulating layer 138, and the insulating layer 140 that are formed over the impurity region 126, and the source electrode 142a is formed in the contact in the lower portion. After that, an opening (also referred to as a contact in an upper portion) is formed in a region overlapping with the contact in the lower portion in the gate insulating layer 146 and the insulating layer 150, and then the wiring 154 is formed. When the contact in the upper portion is formed so as to overlap with the contact in the lower portion, the source electrode 142a formed in the contact in the lower portion might be disconnected due to etching. In order to avoid the disconnection, the contacts in the lower portion and in the upper portion are formed so as not to overlap with each other, so that a problem of the increase in the element area occurs.

As described in this embodiment, with the use of the conductive layer 128b, the contact in the upper portion can be formed without disconnection of the source electrode 142a. Thus, the contact in the lower portion and the contact in the upper portion can be formed overlapping with each other, so that the element area can be prevented from increasing due to contact regions of the electrodes. In other words, the degree of integration of the semiconductor device can be increased.

Figure 17C:
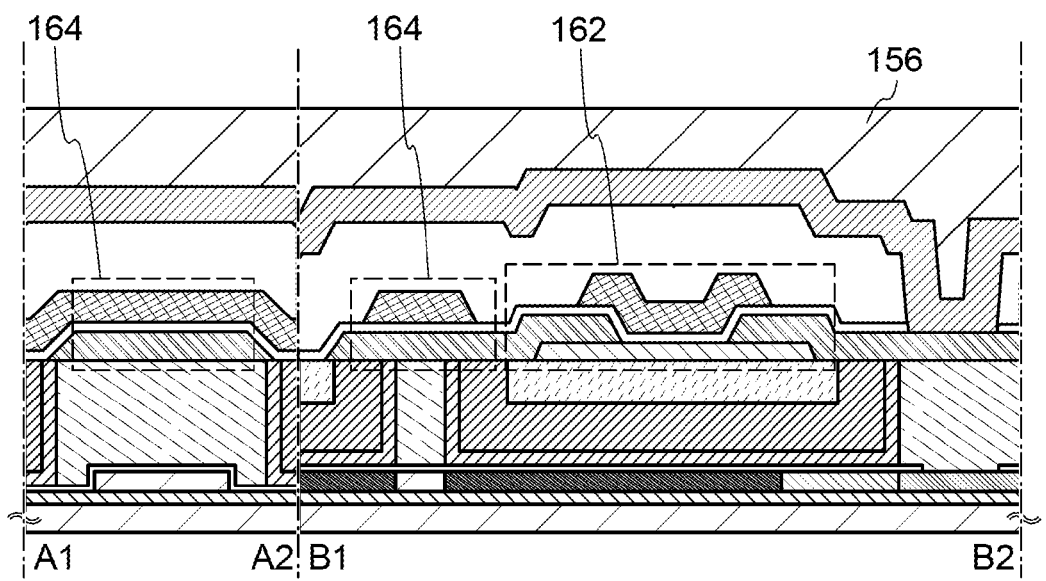

Next, an insulating layer 156 is formed so as to cover the wiring 154 (see FIG. 17C).

Through the above process, the transistor 162 and the capacitor 164 including the oxide semiconductor layer 144 are completed (see FIG. 17C).

By using the oxide semiconductor layer 144, a transistor with sufficiently small off-state current and high reliability can be obtained. Then, by using such a transistor, a semiconductor device in which stored data can be held for an extremely long time can be obtained.

In addition, in the semiconductor device described in this embodiment, a wiring can be shared; thus, a semiconductor device with sufficiently increased degree of integration can be achieved.

Since the above-described oxide semiconductor layer is used, the transistor illustrated in FIGS. 12A and 12B can have high field-effect mobility and high reliability.

Here, the field-effect mobility of a transistor including an oxide semiconductor which is used in an embodiment of the present invention was calculated. The results thereof are described.

The actually measured field-effect mobility of an insulated gate transistor can be lower than its original mobility because of a variety of reasons; this phenomenon occurs not only in the case of using an oxide semiconductor. One of the reasons that reduce the field-effect mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original field-effect mobility and the measured field-effect mobility of a semiconductor are $\mu_0$ and $\mu$, respectively, and a potential barrier (such as a grain boundary) exists in the semiconductor, the measured field-effect mobility can be expressed as the following Formula (2).

$$\mu = \mu_0 \exp\left(-\frac{E}{kT}\right) \quad (2)$$

Here, E represents the height of the potential barrier, k represents the Boltzmann constant, and T represents the absolute temperature. Further, on the assumption that the potential barrier is attributed to a defect, the height of the potential barrier can be expressed as Formula 3 according to the Levinson model.

$$E = \frac{e^2 N^2}{8\varepsilon n} = \frac{e^3 N^2 t}{8\varepsilon C_{ox} V_g} \quad (3)$$

Here, e represents the elementary electric charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region is expressed as the following Formula (4).

$$I_d = \frac{W \mu V_g V_d C_{ox}}{L} \exp\left(-\frac{E}{kT}\right) \quad (4)$$

Here, L represents the channel length and W represents the channel width, and L and W are each 10 μm in this case. In addition, $V_d$ represents the drain voltage. When dividing both sides of the above equation by $V_g$ and then taking logarithms of both sides, the following Formula (5) is obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT \varepsilon C_{ox} V_g} \quad (5)$$

The right side of Formula (5) is a function of $V_g$. From the formula, it is found that the defect density N can be obtained from the slope of a line in a graph which is obtained by plotting actually measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner or the like, $\mu_0$ can be calculated to be 120 cm$^2$/Vs from Formula (4) and Formula (5). The measured field-effect mobility of a transistor that uses an In—Sn—Zn oxide semiconductor film including a defect is approximately 30 cm$^2$/Vs. However, assuming that no defect exists inside the semiconductor and at the interface between the semiconductor and a gate insulating film, the field-effect mobility $\mu_0$ of the transistor that uses the oxide semiconductor film is expected to be 120 cm$^2$/Vs.

Note that even when no defect exists inside a semiconductor, scattering at an interface between the semiconductor and a gate insulating film affects the transport property of the transistor. In other words, the field-effect mobility $\mu_1$ at a position that is distance x away from the interface between the semiconductor and the gate insulating film can be expressed as the following formula (6).

$$\frac{1}{\mu_1} = \frac{1}{\mu_0} + \frac{D}{B}\exp\left(-\frac{x}{l}\right) \quad (6)$$

Here, D represents the electric field in the gate direction, and B and/are constants. B and/can be obtained from actual measurement results; according to the above measurement results, B is $4.75 \times 10^7$ cm/s and/is 10 nm (the depth to which the influence of interface scattering reaches). When D is increased (i.e., when the gate voltage is increased), the second term of Formula (6) is increased and accordingly the field-effect mobility $\mu_1$ is decreased.

Figure 22:
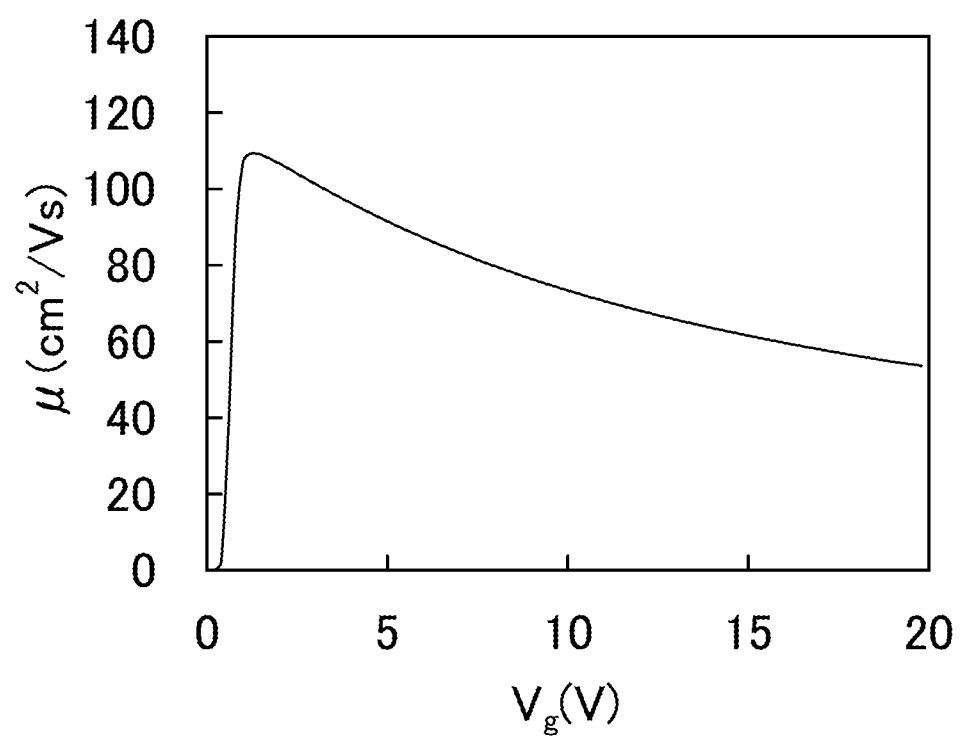
FIG. 22 is a graph showing gate voltage dependence of field-effect mobility obtained by calculation.

Calculation results of the field-effect mobility $\mu_2$ of a transistor whose channel includes an ideal oxide semiconductor film without a defect inside the semiconductor are shown in FIG. 22. For the calculation, device simulation software Sentaurus Device manufactured by Synopsys, Inc. was used, and the band gap, the electron affinity, the relative dielectric constant, and the thickness of the oxide semiconductor were assumed to be 2.8 eV, 4.7 eV, 15, and 15 nm, respectively. Further, the work functions of a gate, a source, and a drain were assumed to be 5.5 eV, 4.6 eV, and 4.6 eV, respectively. The thickness of a gate insulating film was assumed to be 100 nm, and the relative dielectric constant thereof was assumed to be 4.1. The channel length and the channel width were each assumed to be 10 μm, and the drain voltage $V_d$ was assumed to be 0.1 V.

As shown in FIG. 22, the field-effect mobility has a peak of higher than or equal to 100 cm²/Vs at a gate voltage that is a little over 1 V and is decreased as the gate voltage becomes higher because the influence of interface scattering is increased. Note that in order to reduce an influence of interface scattering, it is desirable that a surface of the semiconductor layer be flat at the atomic level (atomic layer flatness).

Calculation results of characteristics of minute transistors which are manufactured and have such a field-effect mobility are shown in FIGS. 23A to 23C, FIGS. 24A to 24C, and FIGS. 25A to 25C. FIGS. 26A and 26B illustrate cross-sectional structures of the transistors used for the calculation. The transistors illustrated in FIGS. 26A and 26B each include a semiconductor region 2103a and a semiconductor region 2103c which have n⁺-type conductivity in an oxide semiconductor layer. The resistivities of the semiconductor region 2103a and the semiconductor region 2103c are $2 \times 10^{-3}$ Ωcm.

The transistor illustrated in FIG. 26A is formed over a base insulating film 2101 and an embedded insulating film 2102 which is embedded in the base insulating film 2101 and formed of aluminum oxide. The transistor includes the semiconductor region 2103a, the semiconductor region 2103c, an intrinsic semiconductor region 2103b serving as a channel formation region interposed therebetween and a gate 2105. The width of the gate 2105 is 33 nm.

A gate insulating film 2104 is formed between the gate 2105 and the semiconductor region 2103b. In addition, a sidewall insulating film 2106a and a sidewall insulating film 2106b are formed on both side surfaces of the gate 2105, and an insulating film 2107 is formed over the gate 2105 so as to prevent a short circuit between the gate 2105 and another wiring. The sidewall insulating film has a width of 5 nm. A source 2108a and a drain 2108b are provided in contact with the semiconductor region 2103a and the semiconductor region 2103c, respectively. Note that the channel width of this transistor is 40 nm.

The transistor in FIG. 26B is the same as the transistor in FIG. 26A in that it is formed over the base insulating film 2101 and the embedded insulating film 2102 formed of aluminum oxide and that it includes the semiconductor region 2103a, the semiconductor region 2103c, the intrinsic semiconductor region 2103b provided therebetween, the gate 2105 having a width of 33 nm, the gate insulating film 2104, the sidewall insulating film 2106a, the sidewall insulating film 2106b, the insulating film 2107, the source 2108a, and the drain 2108b.

The transistor illustrated in FIG. 26A is different from the transistor illustrated in FIG. 26B in the conductivity type of semiconductor regions under the sidewall insulating film 2106a and the sidewall insulating film 2106b. In the transistor illustrated in FIG. 26A, the semiconductor regions under the sidewall insulating film 2106a and the sidewall insulating film 2106b are part of the semiconductor region 2103a having n⁺-type conductivity and part of the semiconductor region 2103c having n⁺-type conductivity, whereas in the transistor illustrated in FIG. 26B, the semiconductor regions under the sidewall insulating film 2106a and the sidewall insulating film 2106b are part of the intrinsic semiconductor region 2103b. In other words, a region having a width of $L_{off}$ which overlaps with neither the semiconductor region 2103b nor the gate 2105 is provided. This region is called an offset region, and the width $L_{off}$ is called an offset length. As is seen from the drawing, the offset length is equal to the width of the sidewall insulating film 2106a (the sidewall insulating film 2106b).

Figure 23A:
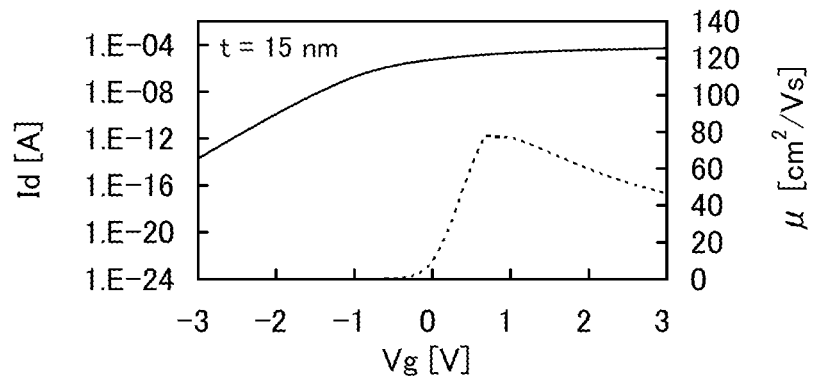
FIGS. 23A to 23C are graphs each showing gate voltage dependence of drain current and field-effect mobility obtained by calculation.
Figure 23B:
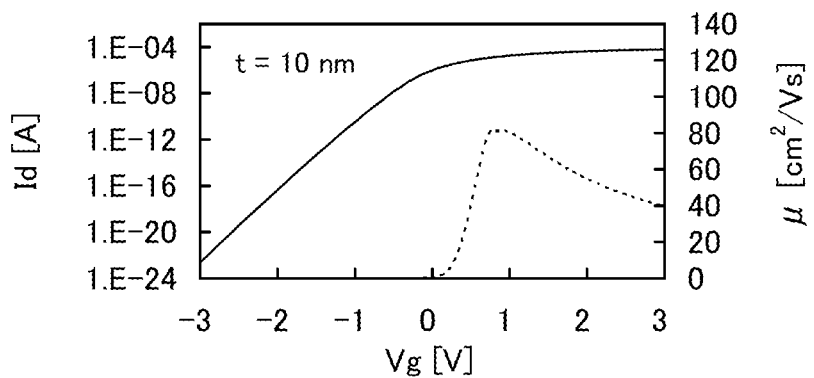
Figure 23C:
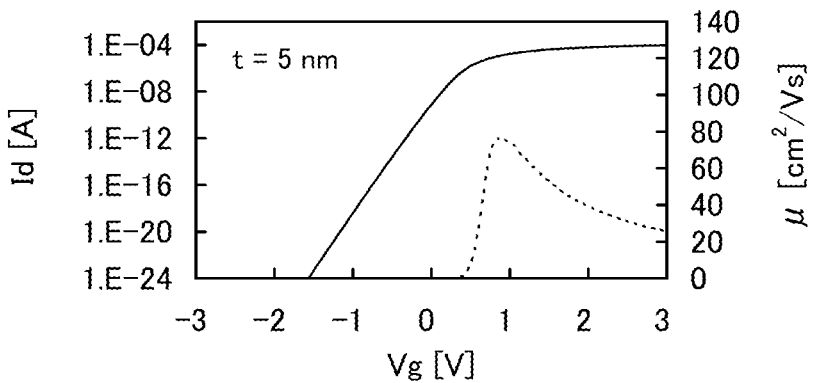

The other parameters used for the calculation are as described above. For the calculation, device simulation software Sentaurus Device manufactured by Synopsys, Inc. was used. FIGS. 23A to 23C show the gate voltage ($V_g$: a potential difference between the gate and the source) dependence of the drain current ($I_d$, a solid line) and the field-effect mobility (μ, a dotted line) of the transistor having the structure illustrated in FIG. 26A. The drain current $I_d$ is obtained by calculation under the assumption that the drain voltage (a potential difference between the drain and the source) is +1 V and the field-effect mobility μ is obtained by calculation under the assumption that the drain voltage is +0.1 V.

FIG. 23A shows the gate voltage dependence of the transistor in the case where the thickness of the gate insulating film is 15 nm, FIG. 23B shows that of the transistor in the case where the thickness of the gate insulating film is 10 nm, and FIG. 23C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the field-effect mobility μ and the drain current $I_d$ in an on state (on-state current). The graphs show that the drain current exceeds 10 μA, which is required in a memory element and the like, at a gate voltage of around 1 V.

Figure 24A:
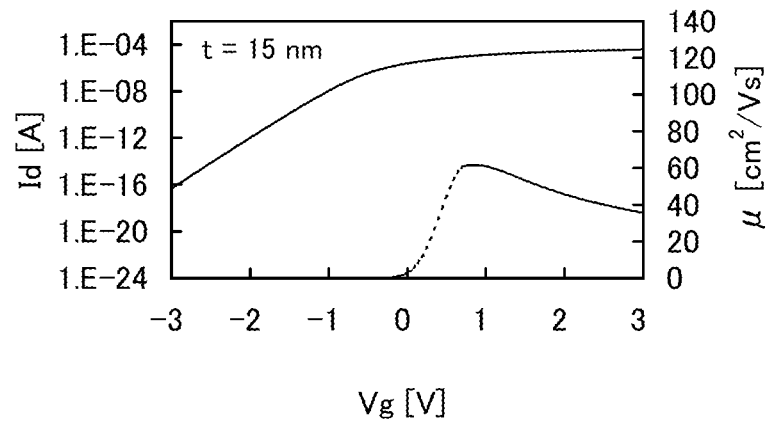
FIGS. 24A to 24C are graphs each showing gate voltage dependence of drain current and field-effect mobility obtained by calculation.
Figure 24B:
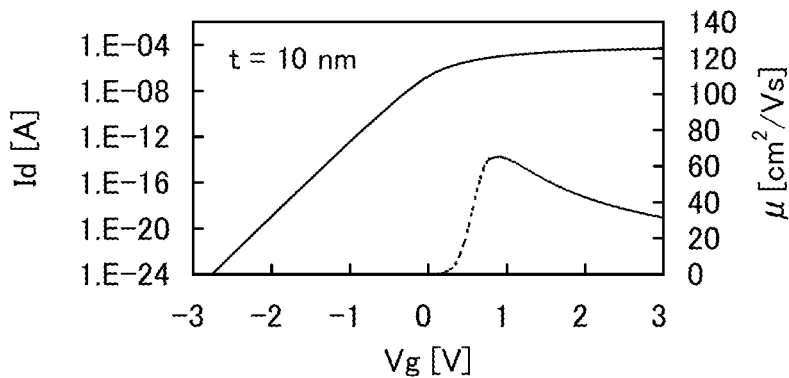
Figure 24C:
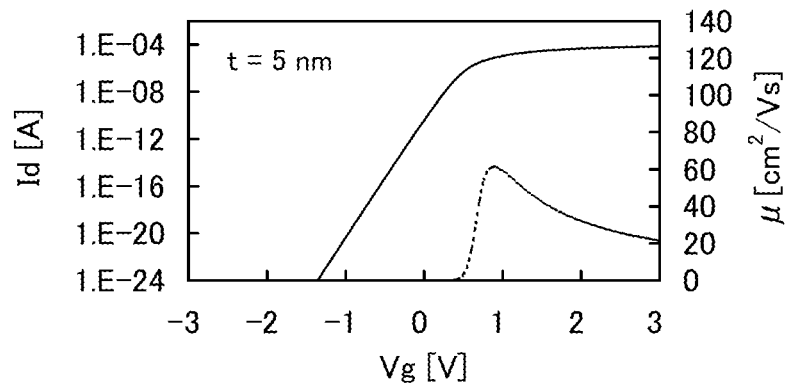

FIGS. 24A to 24C show the gate voltage $V_g$ dependence of the drain current $I_d$ (a solid line) and the field-effect mobility μ (a dotted line) of the transistor having the structure illustrated in FIG. 26B where the offset length $L_{off}$ is 5 nm. The drain current $I_d$ is obtained by calculation under the assumption that the drain voltage is +1 V and the field-effect mobility μ is obtained by calculation under the assumption that the drain voltage is +0.1 V. FIG. 24A shows the gate voltage dependence of the transistor in the case where the thickness of the gate insulating film is 15 nm, FIG. 24B shows that of the transistor in the case where the thickness of the gate insulating film is 10 nm, and FIG. 24C shows that of the transistor in the case where the thickness of the gate insulating film is 5 nm.

Figure 25A:
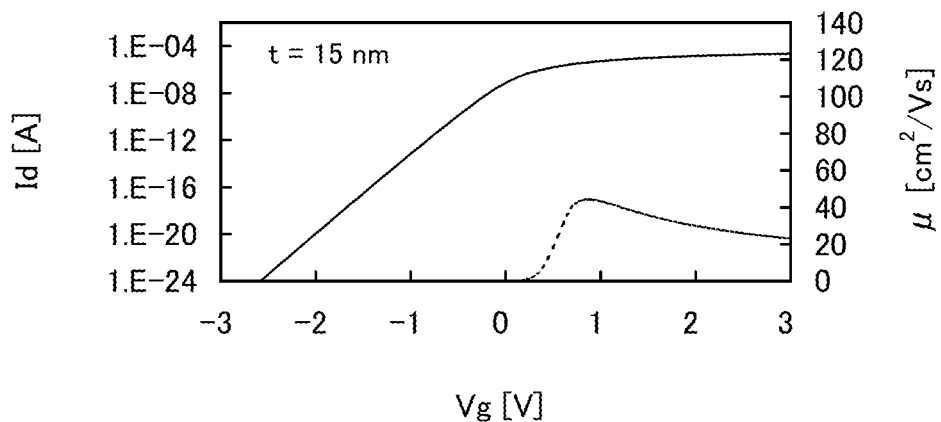
FIGS. 25A to 25C are graphs each showing gate voltage dependence of drain current and field-effect mobility obtained by calculation.
Figure 25B:
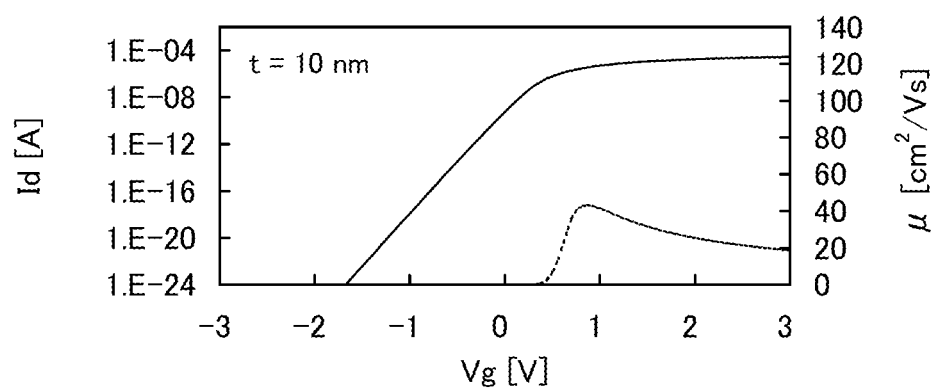
Figure 25C:
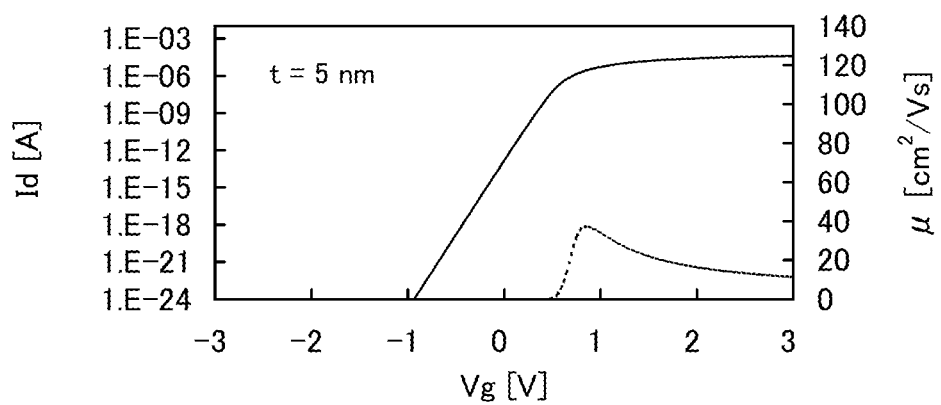
Figure 26A:
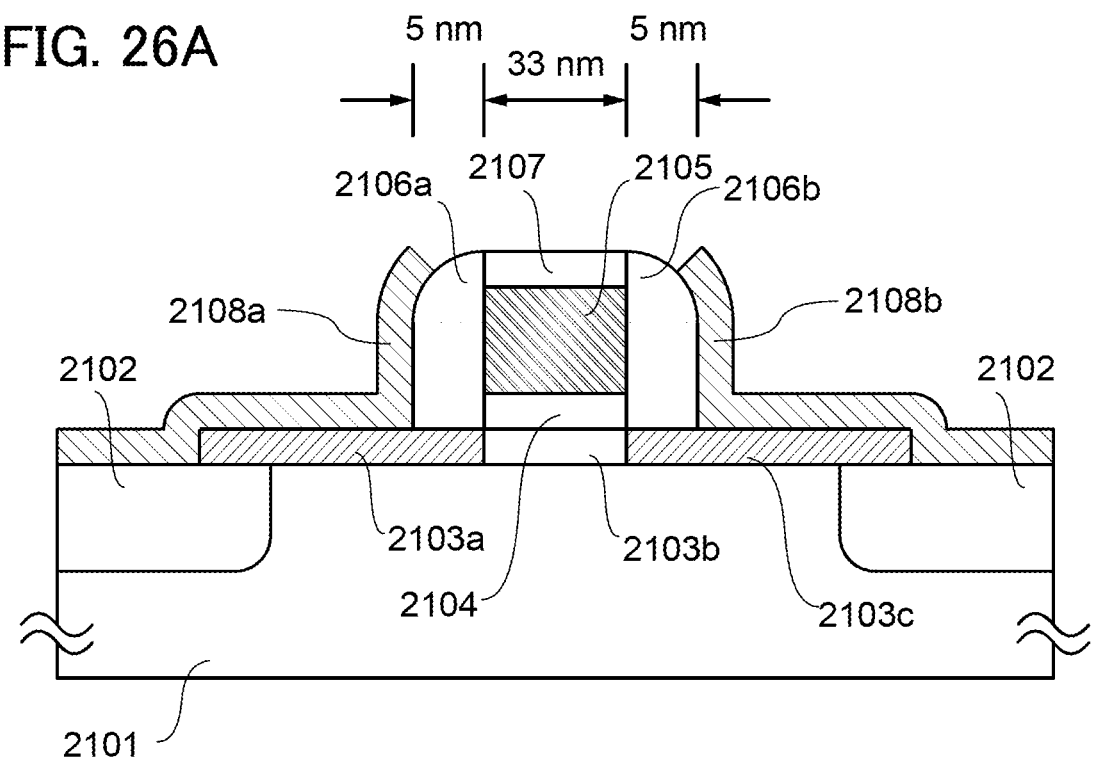
FIGS. 26A and 26B each illustrate a cross-sectional structure of a transistor used for calculation.
Figure 26B:
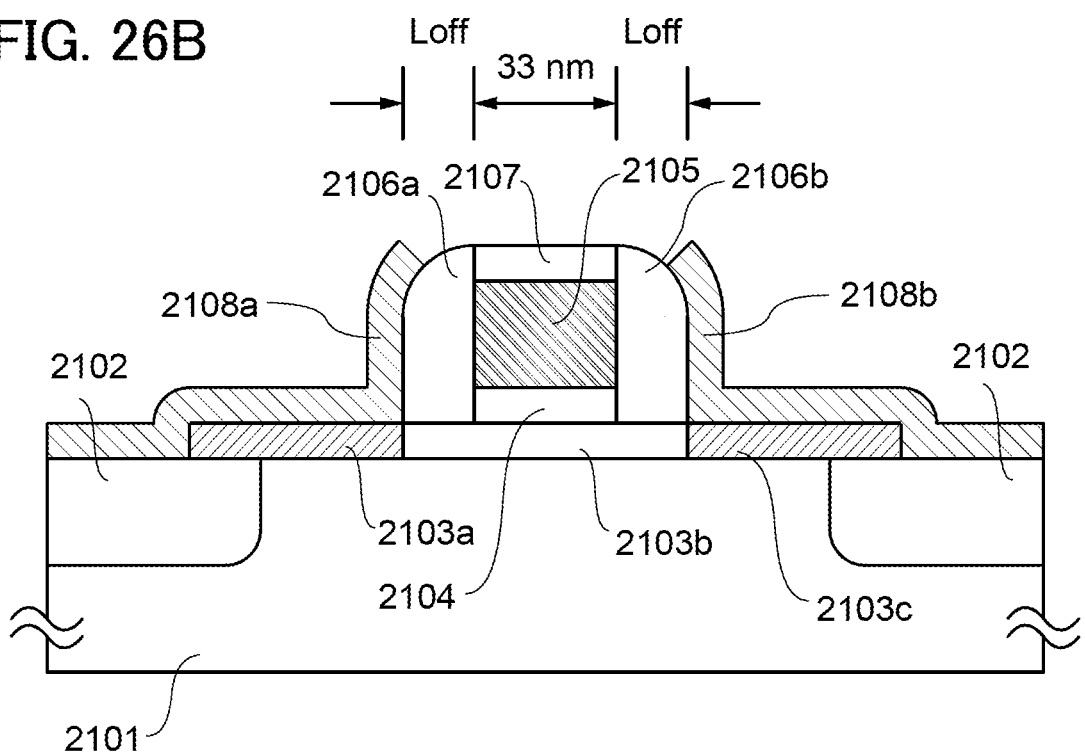

Further, FIGS. 25A to 25C show the gate voltage dependence of the drain current $I_d$ (a solid line) and the field-effect mobility μ (a dotted line) of the transistor having the structure illustrated in FIG. 26B where the offset length $L_{off}$ is 15 nm. The drain current $I_d$ is obtained by calculation under the assumption that the drain voltage is +1 V and the field-effect mobility μ is obtained by calculation under the assumption that the drain voltage is +0.1 V. FIG. 25A shows the gate voltage dependence of the transistor in the case where the thickness of the gate insulating film is 15 nm, FIG. 25B shows that of the transistor in the case where the thickness of the gate insulating film is 10 nm, and FIG. 25C shows that of the transistor in the case where the thickness of the gate insulating film is 5 nm.

In either of the structures, as the gate insulating film is thinner, the off-state current is significantly decreased, whereas no noticeable change arises in the peak value of the field-effect mobility μ and the on-state current.

Note that the peak of the field-effect mobility μ is approximately 80 $cm^2$/Vs in FIGS. 23A to 23C, approximately 60 $cm^2$/Vs in FIGS. 24A to 24C, and approximately 40 $cm^2$/Vs in FIGS. 25A to 25C; thus, the peak of the field-effect mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Measurement results of the field-effect mobility of a transistor including an oxide semiconductor which is used in an embodiment of the present invention are described.

A transistor in which a channel formation region is included in an oxide semiconductor film including In, Sn, and Zn can have favorable characteristics by depositing the oxide semiconductor layer while heating a substrate or by performing heat treatment after the oxide semiconductor layer is formed.

By intentionally heating the substrate after formation of the oxide semiconductor layer including In, Sn, and Zn, the field-effect mobility of the transistor can be improved.

Figure 27A:
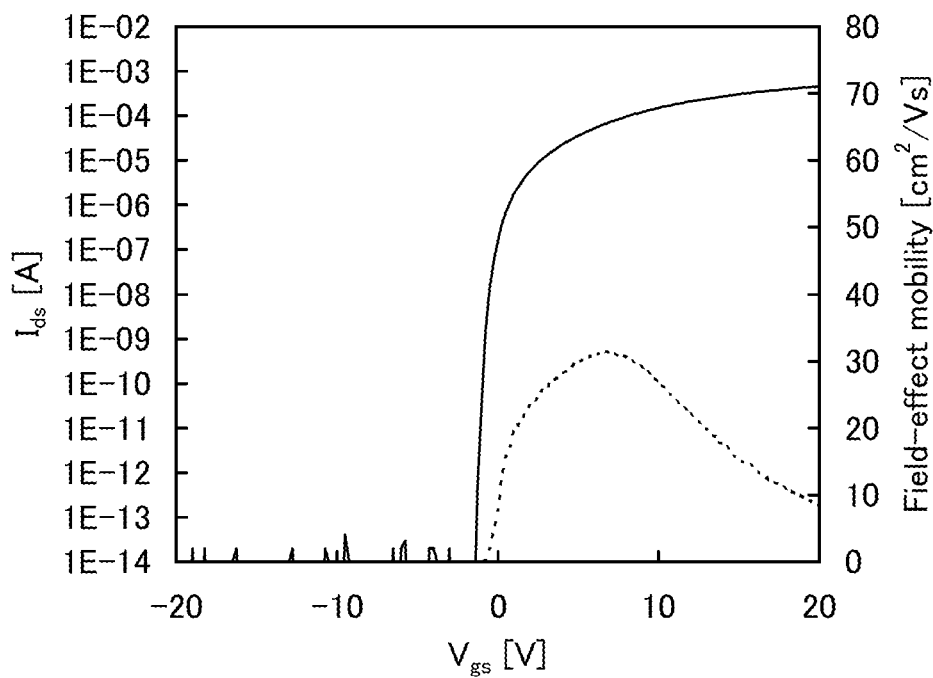
FIGS. 27A and 27B are graphs each showing characteristics of a transistor including an oxide semiconductor layer.
Figure 27B:
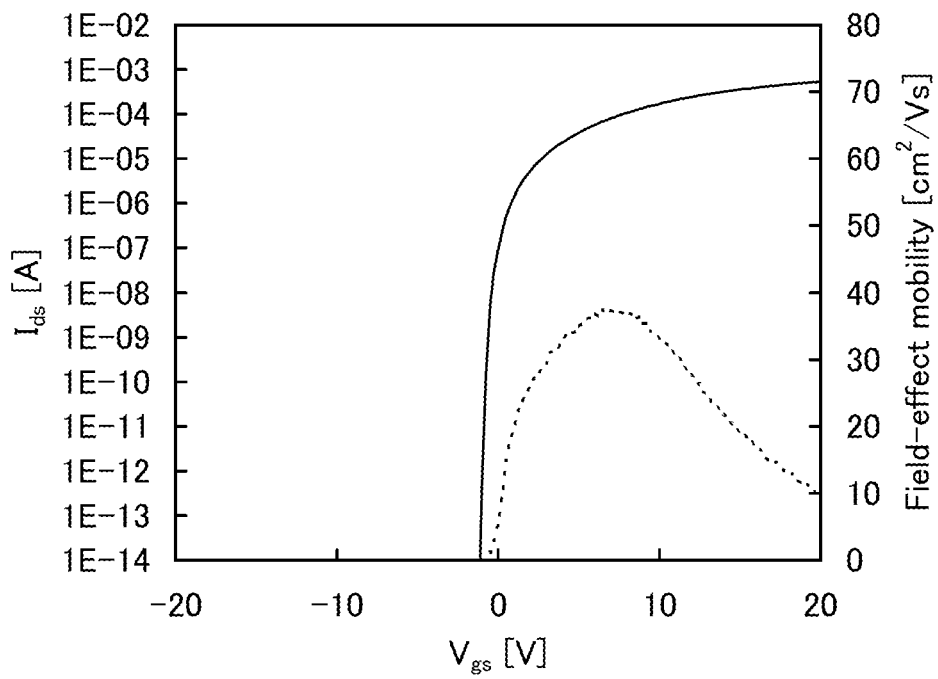

For example, FIGS. 27A and 27B each show characteristics of a transistor that is different from FIGS. 26A and 26B in that an oxide semiconductor film including In, Sn, and Zn is used for an oxide semiconductor layer. As for the measured transistor, the channel length L was 3 μm, the channel width W was 10 μm, and the thickness of a gate insulating film was 100 nm. Note that $V_d$ was set to 10 V.

FIG. 27A shows characteristics of a transistor whose oxide semiconductor layer including In, Sn, and Zn is formed while heating a substrate at 200° C. The field-effect mobility of the transistor is 32.2 $cm^2$/Vsec.

The field-effect mobility can be further improved by performing heat treatment after formation of the oxide semiconductor layer including In, Sn, and Zn. FIG. 27B shows characteristics of a transistor whose oxide semiconductor layer including In, Sn, and Zn was formed by a sputtering method at 200° C. and then subjected to heat treatment at 650° C. The field-effect mobility of the transistor is 34.5 $cm^2$/Vsec.

The intentional heating of the substrate is expected to have an effect of reducing moisture taken into the oxide semiconductor layer during the formation by sputtering. Further, the heat treatment after film formation enables hydrogen, a hydroxyl group, moisture, or the like to be released and removed from the oxide semiconductor layer. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 $cm^2$/Vsec is expected to be realized.

The oxide semiconductor including In, Sn, and Zn may be crystallized in the following manner: oxygen ions are implanted into the oxide semiconductor, hydrogen, a hydroxyl group, moisture, or the like included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor layer after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor layer may be employed.

A defect due to an oxygen vacancy is easily caused in the oxide semiconductor layer or at an interface between the oxide semiconductor layer and a film stacked over the oxide semiconductor layer; however, when excess oxygen is included in the oxide semiconductor layer by the heat treatment, oxygen vacancies caused constantly can be compensated by excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor layer without causing crystal distortion or the like.

When heat treatment is performed so that a crystalline region is included in part of the oxide semiconductor layer, a more stable oxide semiconductor layer can be obtained. For example, when an oxide semiconductor layer which is formed by sputtering using a target having an atomic ratio of In:Sn:Zn=1:1:1 [atomic ratio] without heating a substrate intentionally is analyzed by X-ray diffraction (XRD), a halo pattern is observed. The formed oxide semiconductor layer can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target with a composition of In:Sn:Zn=1:1:1 [atomic ratio] was used as a target. Note that the substrate heating temperature in film formation was set to 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 28:
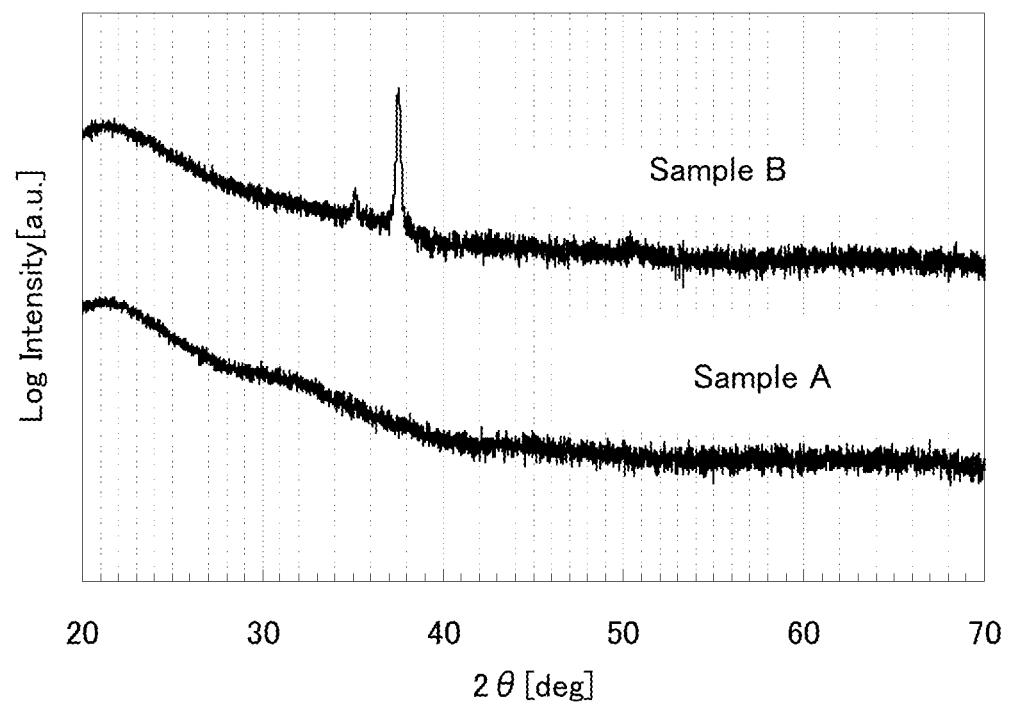
FIG. 28 is a graph showing XRD spectra of Sample A and Sample B.

FIG. 28 shows XRD spectra of Sample A and Sample B. No peak derived from crystal was observed in Sample A, whereas peaks derived from crystal were observed when 2θ was around 35 deg and 37 deg to 38 deg in Sample B.

As described above, by intentionally heating a substrate during deposition of an oxide semiconductor including In, Sn, and Zn and/or by performing heat treatment after the deposition, characteristics of a transistor can be improved.

These substrate heating and heat treatment have an effect of preventing hydrogen and a hydroxyl group, which are unfavorable impurities for an oxide semiconductor layer, from being included in the oxide semiconductor layer or an effect of removing hydrogen and a hydroxyl group from the oxide semiconductor layer. That is, an oxide semiconductor layer can be highly purified by removing hydrogen, a hydroxyl group, moisture, and the like serving as a donor impurity from the oxide semiconductor layer. The high purification of an oxide semiconductor layer enables the off-state current of the transistor to be less than or equal to 1 aA/μm. Here, the unit of the off-state current represents current per micrometer of a channel width.

Figure 29:
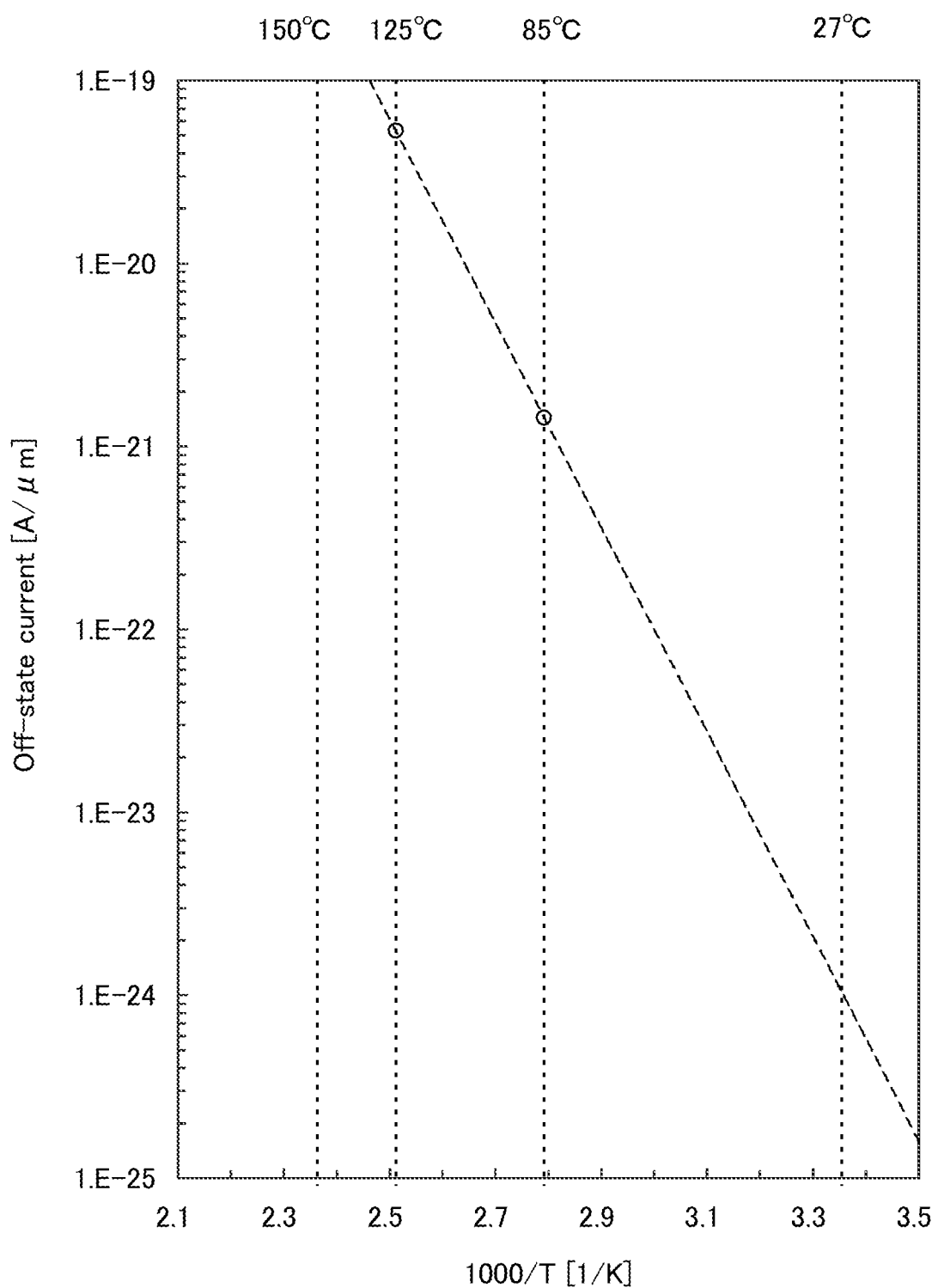
FIG. 29 is a graph showing a relation between the off-state current of a transistor and the substrate temperature in measurement.

Specifically, as shown in FIG. 29, the off-state current can be lower than or equal to 1 aA/μm ($1\times10^{-18}$ A/μm), lower than or equal to 100 zA/μm ($1\times10^{-19}$ A/μm), and lower than or equal to 1 zA/μm ($1\times10^{-21}$ A/μm) when the substrate temperature is 125° C., 85° C., and room temperature (27° C.), respectively. Preferably, the off-state current can be lower than or equal to 0.1 aA/μm ($1\times10^{-19}$ A/μm), lower than or equal to 10 zA/μm ($1\times10^{-20}$ A/μm), and lower than or equal to 0.1 zA/μm ($1\times10^{-22}$ A/μm) at 125° C., 85° C., and room temperature, respectively. The above values of off-state currents are clearly much lower than that of the transistor using silicon as a semiconductor film.

Note that in order to prevent hydrogen, a hydroxyl group, moisture, or the like from being included in the oxide semiconductor layer during formation thereof, it is preferable to increase the purity of a sputtering gas by sufficiently suppressing leakage from the outside of a deposition chamber and degasification through an inner wall of the deposition chamber. For example, a gas with a dew point of lower than or equal to −70° C. is preferably used as the sputtering gas in order to prevent moisture from being included in the film. In addition, it is preferable to use a target which is highly purified so as not to include impurities such as hydrogen, a hydroxyl group, moisture, and the like. Although it is possible to remove moisture from an oxide semiconductor film including In, Sn, and Zn by heat treatment, a film which does not include moisture originally is preferably formed because moisture is released from the oxide semiconductor film including In, Sn, and Zn at a higher temperature than from an oxide semiconductor film including In, Ga, and Zn.

Figure 30A:
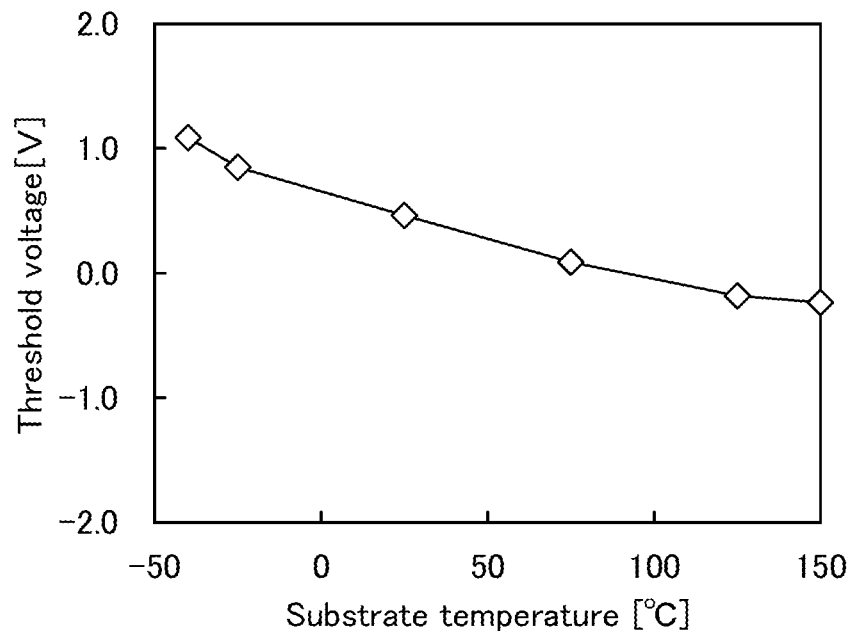
FIG. 30A is a graph showing a relation between substrate temperature and threshold voltage.
Figure 30B:
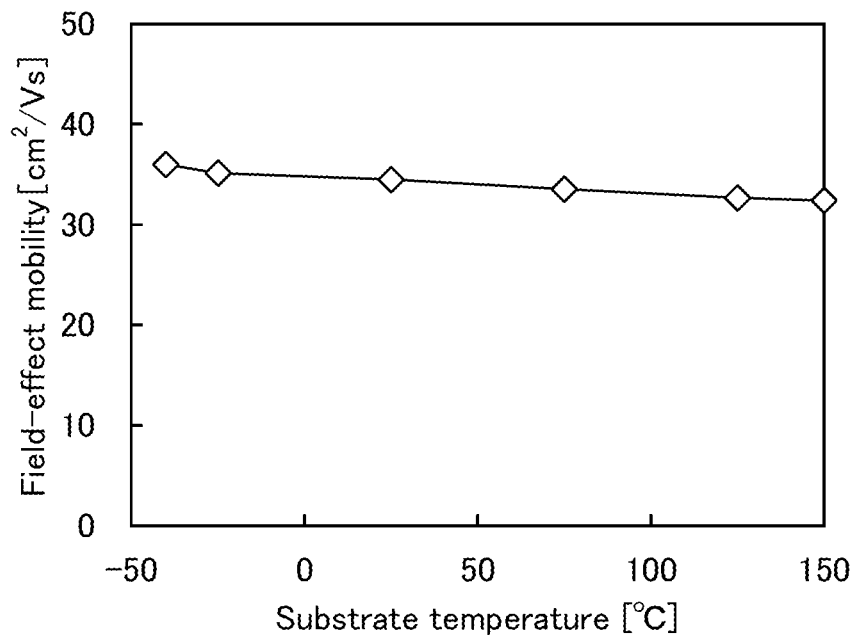
FIG. 30B is a graph showing a relation between substrate temperature and field-effect mobility.

FIG. 30A shows a relation between the substrate temperature and the threshold voltage, and FIG. 30B shows a relation between the substrate temperature and the field-effect mobility.

From FIG. 30A, it is found that the threshold voltage gets lower as the substrate temperature increases. Note that the threshold voltage is decreased from 1.09 V to −0.23 V in the range from −40° C. to 150° C.

From FIG. 30B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which a channel formation region is included in such an oxide semiconductor film including In, Sn, and Zn, a field-effect mobility of higher than or equal to 30 cm$^2$/Vsec, preferably higher than or equal to 40 cm$^2$/Vsec, more preferably higher than or equal to 60 cm$^2$/Vsec can be obtained with the off-state current maintained at lower than or equal to 1 aA/μm, which can achieve on-state current needed for an LSI. For example, in an FET where L/W is 33 nm/40 nm, an on-state current of higher than or equal to 12 μA can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor that uses an oxide semiconductor film is also provided in an integrated circuit formed using silicon.

This embodiment can be implemented in appropriate combination with the other embodiments.

The structures, methods, and the like described in this embodiment can be combined as appropriate with any of the methods, structures, and the like described in the other embodiments.

(Embodiment 3)

In this embodiment, applications of the semiconductor device in the above embodiments to electronic devices will be described with reference to FIGS. 31A to 31F. In this embodiment, applications of the semiconductor device to electronic devices such as a computer, a mobile phone set (also referred to as a mobile phone or a mobile phone device), a personal digital assistant (including a portable game machine, an audio reproducing device, and the like), a camera such as a digital camera or a digital video camera, electronic paper, and a television set (also referred to as a television or a television receiver) are described.

Figure 31A:
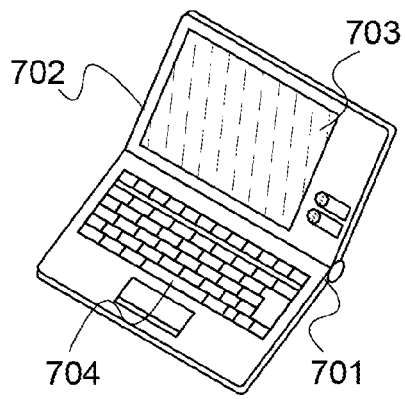
FIGS. 31A to 31F illustrate semiconductor devices.

FIG. 31A illustrates a laptop personal computer, which includes a housing 701, a housing 702, a display portion 703, a keyboard 704, and the like. The semiconductor device described in any of the above embodiments is provided in at least one of the housing 701 and the housing 702. Thus, a laptop personal computer in which data is written and read at high speed, data is held for a long time, and power consumption is sufficiently reduced can be realized.

Figure 31D:
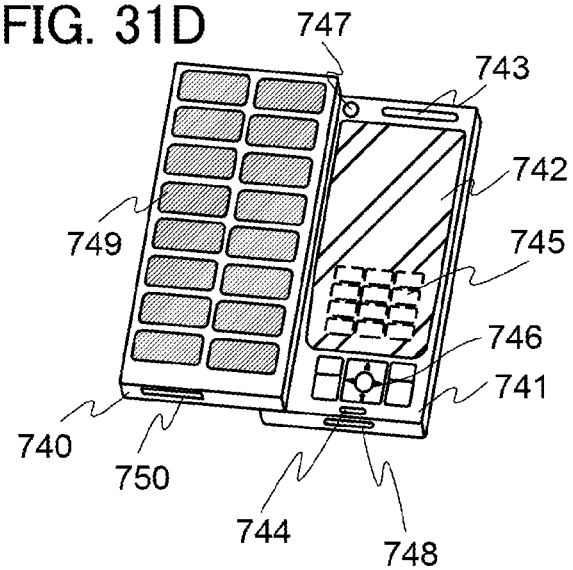
Figure 31B:
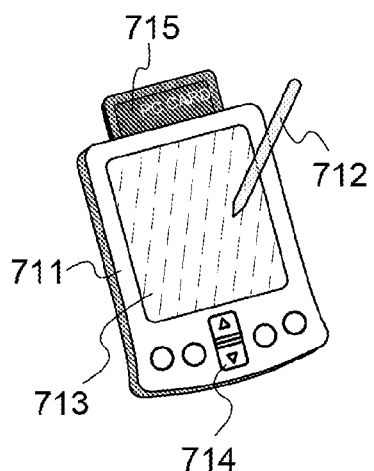

FIG. 31B is a personal digital assistant (PDA). A main body 711 is provided with a display portion 713, an external interface 715, operation buttons 714, and the like. Further, a stylus 712 and the like for operation of the personal digital assistant are provided. In the main body 711, the semiconductor device described in any of the above embodiments is provided. Therefore, a personal digital assistant in which data is written and read at high speed, data is held for a long time, and power consumption is sufficiently reduced can be realized.

Figure 31E:
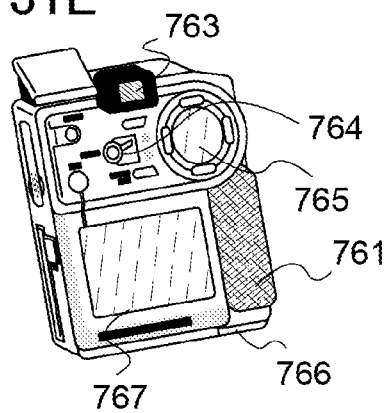
Figure 31C:
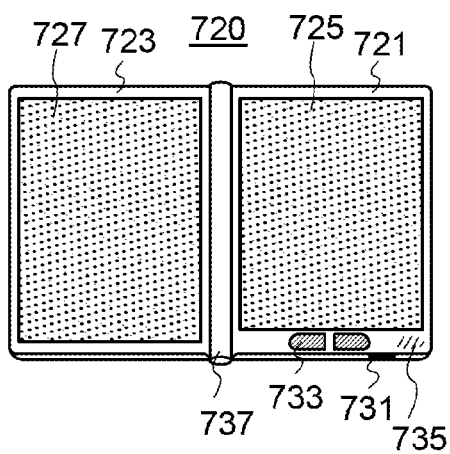

FIG. 31C is an e-book reader 720 mounted with electronic paper, which includes two housings: a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. Thus, an e-book reader in which data is written and read at high speed, data is held for a long time, and power consumption is sufficiently reduced can be realized.

FIG. 31D illustrates a mobile phone set including two housings of a housing 740 and a housing 741. Further, the housing 740 and the housing 741 in a state where they are developed as illustrated in FIG. 31D can shift by sliding so that one is lapped over the other; therefore, the size of the mobile phone set can be reduced, which makes the mobile phone set suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone set, an external memory slot 750, and the like. In addition, an antenna is incorporated in the housing 741. At least one of the housings 740 and 741 is provided with the semiconductor device described in any of the above embodiments. Thus, a mobile phone set in which data is written and read at high speed, data is held for a long time, and power consumption is sufficiently reduced can be realized.

FIG. 31E illustrates a digital camera including a main body 761, a display portion 767, an eyepiece 763, an operation switch 764, a display portion 765, a battery 766, and the like. In the main body 761, the semiconductor device described in any of the above embodiments is provided. Thus, a digital camera in which data is written and read at high speed, data is held for a long time, and power consumption is sufficiently reduced can be realized.

Figure 31F:
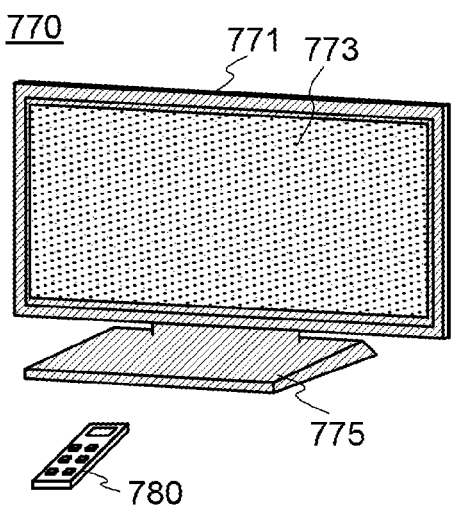

FIG. 31F is a television set 770 including a housing 771, a display portion 773, a stand 775, and the like. The television set 770 can be operated with a switch of the housing 771 or a remote controller 780. The semiconductor device described in any of the above embodiments is mounted on the housing 771 and the remote controller 780. Thus, a television set in which data is written and read at high speed, data is held for a long time, and power consumption is sufficiently reduced can be realized.

As described above, the electronic devices described in this embodiment each include the semiconductor device described in any of the above embodiments; thus, electronic devices with low power consumption can be realized.

This application is based on Japanese Patent Application serial no. 2011-114182 filed with Japan Patent Office on May 20, 2011, the entire contents of which are hereby incorporated by reference.

What is claimed is:

1. A method for driving a semiconductor device, the semiconductor device comprising a memory cell: wherein in the memory cell, a source electrode of a first transistor is electrically connected to a bit line, a drain electrode of the first transistor is electrically connected to a source line, and a gate electrode of the first transistor, a drain electrode of a second transistor, and one electrode of a capacitor are electrically connected to each other to form a node where a potential is held, the method comprising the steps of, in a data reading period:
supplying a ground potential to the source line;
connecting the bit line to a precharge potential supplying line so that the bit line is set to a precharge potential;
disconnecting the bit line from the precharge potential supplying line so that a potential of the bit line changes depending on a potential held in the node; and
reading a change in potential of the bit line to read the potential held in the node.

2. The method for driving a semiconductor device, according to claim 1, wherein the first transistor is a p-channel transistor.

3. The method for driving a semiconductor device, according to claim 1, wherein the first transistor is an n-channel transistor.

4. The method for driving a semiconductor device, according to claim 1, wherein a channel formation region of the second transistor includes an oxide semiconductor.

5. A method for driving a semiconductor device, the semiconductor device comprising a memory cell array comprising a plurality of signal lines, a plurality of bit lines, a plurality of source lines, a plurality of capacitor lines, and a plurality of memory cells, wherein in one of the plurality of memory cells, a source electrode of a first transistor is electrically connected to one of the plurality of bit lines, a drain electrode of the first transistor is electrically connected to one of the plurality of source lines, a gate electrode of the first transistor, a drain electrode of a second transistor, and one electrode of a capacitor are electrically connected to each other, the other electrode of the capacitor is electrically connected to one of the plurality of capacitor lines, a source electrode of the second transistor is electrically connected to one of the plurality of signal lines, and a node where a potential supplied from the one of the plurality of signal lines is held is formed between the gate electrode of the first transistor, the drain electrode of the second transistor, and the one electrode of the capacitor, the method comprising the steps of, in a data reading period:
supplying a ground potential to one of the plurality of capacitor lines which is electrically connected to one of the plurality of memory cells, so that the one of the plurality of memory cells is to be selected;
supplying a ground potential to one of the plurality of source lines which is electrically connected to the selected memory cell;
electrically connecting one of the plurality of bit lines to a precharge potential supplying line so that the one of the plurality of bit lines is set to a precharge potential;
disconnecting the one of the plurality of bit lines of the selected memory cell from the precharge potential supplying line so that a potential of the one of plurality of bit lines changes depending on a potential held in the node; and
reading a change in potential of the one of the plurality of bit lines to read the potential held in the node of the selected memory cell.

6. The method for driving a semiconductor device, according to claim 5, wherein in the data reading period, other one of the plurality of source lines connected to a non-selected memory cell is connected to the precharge potential supplying line.

7. The method for driving a semiconductor device, according to claim 5, wherein the first transistor is a p-channel transistor.

8. The method for driving a semiconductor device, according to claim 5, wherein the first transistor is an n-channel transistor.

9. The method for driving a semiconductor device, according to claim 5, wherein a channel formation region of the second transistor includes an oxide semiconductor.

10. A method for driving a semiconductor device,
the semiconductor device comprising a memory cell array comprising a plurality of bit lines, at least one source line, a plurality of capacitor lines, and a plurality of memory cells,
wherein in one of the plurality of memory cells, a source electrode of a first transistor is electrically connected to one of the plurality of bit lines, a drain electrode of the first transistor is electrically connected to the source line, a gate electrode of the first transistor, a drain electrode of a second transistor, and one electrode of a capacitor are electrically connected to each other, the other electrode of the capacitor is electrically connected to one of the plurality of capacitor lines, and a node where a potential supplied from the one of the plurality of bit lines is held is formed between the gate electrode of the first transistor, the drain electrode of the second transistor, and the one electrode of the capacitor,
the method comprising the steps of, in a data reading period:
supplying a ground potential to one of the plurality of capacitor lines which is electrically connected to one of the plurality of memory cells, so that the one of the plurality of memory cells is to be selected;
supplying a ground potential to the source line;
electrically connecting one of the plurality of bit lines to a precharge potential supplying line so that the one of the plurality of bit lines is set to a precharge potential;
disconnecting the one of the plurality of bit lines of the selected memory cell from the precharge potential supplying line so that a potential of the one of plurality of bit lines changes depending on a potential held in the node; and
reading a change in potential of the one of the plurality of bit lines to read the potential held in the node of the selected memory cell.

11. The method for driving a semiconductor device, according to claim 10, wherein in the data reading period, a source line connected to a non-selected memory cell is connected to the precharge potential supplying line.

12. The method for driving a semiconductor device, according to claim 10, wherein the first transistor is a p-channel transistor.

13. The method for driving a semiconductor device, according to claim 10, wherein the first transistor is an n-channel transistor.

14. The method for driving a semiconductor device, according to claim 10, wherein a channel formation region of the second transistor includes an oxide semiconductor.

* * * * *